United States Patent
Vorbach

(10) Patent No.: US 9,037,807 B2
(45) Date of Patent: May 19, 2015

(54) PROCESSOR ARRANGEMENT ON A CHIP INCLUDING DATA PROCESSING, MEMORY, AND INTERFACE ELEMENTS

(75) Inventor: Martin Vorbach, Munich (DE)

(73) Assignee: PACT XPP TECHNOLOGIES AG, Munich (DE)

( * ) Notice: Subject to any disclaimer, the term of this patent is extended or adjusted under 35 U.S.C. 154(b) by 0 days.

(21) Appl. No.: 12/944,068

(22) Filed: Nov. 11, 2010

(65) Prior Publication Data

US 2011/0060942 A1    Mar. 10, 2011

Related U.S. Application Data

(60) Division of application No. 12/496,012, filed on Jul. 1, 2009, now abandoned, which is a continuation of application No. 10/471,061, filed as application No. PCT/EP02/02398 on Mar. 5, 2002, now Pat. No. 7,581,076.

(30) Foreign Application Priority Data

| Mar. 5, 2001 | (DE) | 101 10 530 |
| Mar. 7, 2001 | (DE) | 101 11 014 |
| Jun. 13, 2001 | (WO) | PCT/EP01/06703 |
| Jun. 20, 2001 | (DE) | 101 29 237 |
| Jun. 20, 2001 | (EP) | 01115021 |
| Jul. 24, 2001 | (DE) | 101 35 210 |
| Jul. 24, 2001 | (DE) | 101 35 211 |
| Jul. 24, 2001 | (WO) | PCT/EP01/08534 |
| Aug. 16, 2001 | (DE) | 101 39 170 |
| Aug. 29, 2001 | (DE) | 101 42 231 |
| Sep. 3, 2001 | (DE) | 101 42 894 |
| Sep. 3, 2001 | (DE) | 101 42 903 |
| Sep. 3, 2001 | (DE) | 101 42 904 |
| Sep. 11, 2001 | (DE) | 101 44 732 |
| Sep. 11, 2001 | (DE) | 101 44 733 |
| Sep. 17, 2001 | (DE) | 101 45 792 |
| Sep. 17, 2001 | (DE) | 101 45 795 |
| Sep. 19, 2001 | (DE) | 101 46 132 |
| Sep. 30, 2001 | (WO) | PCT/EP01/11299 |
| Oct. 8, 2001 | (WO) | PCT/EP01/11593 |
| Nov. 5, 2001 | (DE) | 101 54 259 |
| Nov. 5, 2001 | (DE) | 101 54 260 |
| Dec. 14, 2001 | (EP) | 01129923 |
| Jan. 18, 2002 | (EP) | 02001331 |
| Jan. 19, 2002 | (DE) | 102 02 044 |
| Jan. 20, 2002 | (DE) | 102 02 175 |
| Feb. 15, 2002 | (DE) | 102 02 653 |
| Feb. 18, 2002 | (DE) | 102 06 856 |
| Feb. 18, 2002 | (DE) | 102 06 857 |
| Feb. 21, 2002 | (DE) | 102 07 224 |
| Feb. 21, 2002 | (DE) | 102 07 225 |
| Feb. 21, 2002 | (DE) | 102 07 226 |

(51) Int. Cl.
| G06F 13/14 | (2006.01) |
| G06F 11/20 | (2006.01) |
| G06F 13/16 | (2006.01) |
| G06F 12/00 | (2006.01) |
| G06F 13/40 | (2006.01) |
| G06F 3/06 | (2006.01) |
| G06F 11/14 | (2006.01) |

(52) U.S. Cl.
CPC ............ *G06F 11/20* (2013.01); *G06F 13/1663* (2013.01); *G06F 12/00* (2013.01); *G06F 13/40* (2013.01); *G06F 3/067* (2013.01); *G06F 11/1405* (2013.01)

(58) Field of Classification Search
CPC .............................. G06F 13/1663; G06F 3/067
USPC ................................................. 711/147, 148
See application file for complete search history.

(56) References Cited

U.S. PATENT DOCUMENTS

| 347,316 A | 10/1969 | Wahlstrom et al. |
| 353,166 A | 9/1970 | Spandorfer et al. |
| 3,564,506 A | 2/1971 | Bee et al. |
| 3,681,578 A | 8/1972 | Stevens |
| 3,753,008 A | 8/1973 | Guarnaschelli |

(56) References Cited

U.S. PATENT DOCUMENTS

| | | |
|---|---|---|
| 3,855,577 A | 12/1974 | Vandierendonck |
| 4,020,469 A | 4/1977 | Manning |
| 4,151,611 A | 4/1979 | Sugawara et al. |
| 4,233,667 A | 11/1980 | Devine et al. |
| 4,414,547 A | 11/1983 | Knapp et al. |
| 4,498,134 A | 2/1985 | Hansen et al. |
| 4,498,172 A | 2/1985 | Bhavsar |
| 4,566,102 A | 1/1986 | Hefner |
| 4,571,736 A | 2/1986 | Agrawal et al. |
| 4,590,583 A | 5/1986 | Miller |
| 4,591,979 A | 5/1986 | Iwashita |
| 4,594,682 A | 6/1986 | Drimak |
| 4,623,997 A | 11/1986 | Tulpule |
| 4,642,487 A | 2/1987 | Carter |
| 4,663,706 A | 5/1987 | Allen et al. |
| 4,667,190 A | 5/1987 | Fant et al. |
| 4,682,284 A | 7/1987 | Schrofer |
| 4,686,386 A | 8/1987 | Tadao |
| 4,700,187 A | 10/1987 | Furtek |
| 4,706,216 A | 11/1987 | Carter |
| 4,720,778 A | 1/1988 | Hall et al. |
| 4,720,780 A | 1/1988 | Dolecek |
| 4,722,084 A | 1/1988 | Morton |
| 4,724,307 A | 2/1988 | Dutton et al. |
| 4,739,474 A | 4/1988 | Holsztynski |
| 4,758,985 A | 7/1988 | Carter |
| 4,761,755 A | 8/1988 | Ardini et al. |
| 4,768,196 A | 8/1988 | Jou et al. |
| 4,786,904 A | 11/1988 | Graham, III et al. |
| 4,791,603 A | 12/1988 | Henry |
| 4,811,214 A | 3/1989 | Nosenchuck et al. |
| 4,852,043 A | 7/1989 | Guest |
| 4,852,048 A | 7/1989 | Morton |
| 4,860,201 A | 8/1989 | Stolfo et al. |
| 4,870,302 A | 9/1989 | Freeman |
| 4,873,666 A | 10/1989 | Lefebvre et al. |
| 4,882,687 A | 11/1989 | Gordon |
| 4,884,231 A | 11/1989 | Mor et al. |
| 4,891,810 A | 1/1990 | de Corlieu et al. |
| 4,901,268 A | 2/1990 | Judd |
| 4,910,665 A | 3/1990 | Mattheyses et al. |
| 4,918,440 A | 4/1990 | Furtek |
| 4,939,641 A | 7/1990 | Schwartz et al. |
| 4,959,781 A | 9/1990 | Rubinstein et al. |
| 4,967,340 A | 10/1990 | Dawes |
| 4,972,314 A | 11/1990 | Getzinger et al. |
| 4,992,933 A | 2/1991 | Taylor |
| 5,010,401 A | 4/1991 | Murakami et al. |
| 5,014,193 A | 5/1991 | Garner et al. |
| 5,015,884 A | 5/1991 | Agrawal et al. |
| 5,021,947 A | 6/1991 | Campbell et al. |
| 5,023,775 A | 6/1991 | Poret |
| 5,034,914 A | 7/1991 | Osterlund |
| 5,036,473 A | 7/1991 | Butts et al. |
| 5,036,493 A | 7/1991 | Nielsen |
| 5,041,924 A | 8/1991 | Blackborow et al. |
| 5,043,978 A | 8/1991 | Nagler et al. |
| 5,047,924 A | 9/1991 | Fujioka et al. |
| 5,055,997 A | 10/1991 | Sluijter et al. |
| 5,065,308 A | 11/1991 | Evans |
| 5,072,178 A | 12/1991 | Matsumoto |
| 5,076,482 A | 12/1991 | Kozyrski et al. |
| 5,081,375 A | 1/1992 | Pickett et al. |
| 5,099,447 A | 3/1992 | Myszewski |
| 5,103,311 A | 4/1992 | Sluijter et al. |
| 5,109,503 A | 4/1992 | Cruickshank et al. |
| 5,113,498 A | 5/1992 | Evan et al. |
| 5,115,510 A | 5/1992 | Okamoto et al. |
| 5,119,290 A | 6/1992 | Loo et al. |
| 5,123,109 A | 6/1992 | Hillis |
| 5,128,559 A | 7/1992 | Steele |
| 5,142,469 A | 8/1992 | Weisenborn |
| 5,144,166 A | 9/1992 | Camarota et al. |
| 5,193,202 A | 3/1993 | Jackson et al. |
| 5,203,005 A | 4/1993 | Horst |
| 5,204,935 A | 4/1993 | Mihara et al. |
| 5,208,491 A | 5/1993 | Ebeling et al. |
| 5,212,716 A | 5/1993 | Ferraiolo et al. |
| 5,212,777 A | 5/1993 | Gove et al. |
| 5,218,302 A | 6/1993 | Loewe et al. |
| 5,226,122 A | 7/1993 | Thayer et al. |
| RE34,363 E | 8/1993 | Freeman |
| 5,233,539 A | 8/1993 | Agrawal et al. |
| 5,237,686 A | 8/1993 | Asano et al. |
| 5,243,238 A | 9/1993 | Kean |
| 5,245,227 A | 9/1993 | Furtek et al. |
| 5,247,689 A | 9/1993 | Ewert |
| RE34,444 E | 11/1993 | Kaplinsky |
| 5,274,593 A | 12/1993 | Proebsting |
| 5,276,836 A | 1/1994 | Fukumaru et al. |
| 5,287,472 A | 2/1994 | Horst |
| 5,287,511 A | 2/1994 | Robinson et al. |
| 5,287,532 A | 2/1994 | Hunt |
| 5,296,759 A | 3/1994 | Sutherland et al. |
| 5,298,805 A | 3/1994 | Garverick et al. |
| 5,301,284 A | 4/1994 | Estes et al. |
| 5,301,344 A | 4/1994 | Kolchinsky |
| 5,303,172 A | 4/1994 | Magar et al. |
| 5,311,079 A | 5/1994 | Ditlow et al. |
| 5,327,125 A | 7/1994 | Iwase et al. |
| 5,336,950 A | 8/1994 | Popli et al. |
| 5,343,406 A | 8/1994 | Freeman et al. |
| 5,347,639 A | 9/1994 | Rechtschaffen et al. |
| 5,349,193 A | 9/1994 | Mott et al. |
| 5,353,432 A | 10/1994 | Richek et al. |
| 5,355,508 A | 10/1994 | Kan |
| 5,357,152 A | 10/1994 | Jennings, III et al. |
| 5,361,373 A | 11/1994 | Gilson |
| 5,365,125 A | 11/1994 | Goetting et al. |
| 5,379,444 A | 1/1995 | Mumme |
| 5,386,154 A | 1/1995 | Goetting et al. |
| 5,386,518 A | 1/1995 | Reagle et al. |
| 5,392,437 A | 2/1995 | Matter et al. |
| 5,394,030 A | 2/1995 | Jennings, III et al. |
| 5,408,129 A | 4/1995 | Farmwald et al. |
| 5,408,643 A | 4/1995 | Katayose |
| 5,410,723 A | 4/1995 | Schmidt et al. |
| 5,412,795 A | 5/1995 | Larson |
| 5,418,952 A | 5/1995 | Morley et al. |
| 5,418,953 A | 5/1995 | Hunt et al. |
| 5,421,019 A | 5/1995 | Holsztynski et al. |
| 5,422,823 A | 6/1995 | Agrawal et al. |
| 5,425,036 A | 6/1995 | Liu et al. |
| 5,426,378 A | 6/1995 | Ong |
| 5,428,526 A | 6/1995 | Flood et al. |
| 5,430,687 A | 7/1995 | Hung et al. |
| 5,435,000 A | 7/1995 | Boothroyd et al. |
| 5,440,245 A | 8/1995 | Galbraith et al. |
| 5,440,538 A | 8/1995 | Olsen et al. |
| 5,440,711 A | 8/1995 | Sugimoto |
| 5,442,790 A | 8/1995 | Nosenchuck |
| 5,444,394 A | 8/1995 | Watson et al. |
| 5,448,186 A | 9/1995 | Kawata |
| 5,448,496 A | 9/1995 | Butts et al. |
| 5,450,022 A | 9/1995 | New |
| 5,455,525 A | 10/1995 | Ho et al. |
| 5,457,644 A | 10/1995 | McCollum |
| 5,465,375 A | 11/1995 | Thepaut et al. |
| 5,469,003 A | 11/1995 | Kean |
| 5,473,266 A | 12/1995 | Ahanin et al. |
| 5,473,267 A | 12/1995 | Stansfield |
| 5,475,583 A | 12/1995 | Bock et al. |
| 5,475,803 A | 12/1995 | Stearns et al. |
| 5,475,856 A | 12/1995 | Kogge |
| 5,477,525 A | 12/1995 | Okabe |
| 5,483,620 A | 1/1996 | Pechanek et al. |
| 5,485,103 A | 1/1996 | Pedersen et al. |
| 5,485,104 A | 1/1996 | Agrawal et al. |
| 5,488,582 A | 1/1996 | Camarota |
| 5,489,857 A | 2/1996 | Agrawal et al. |
| 5,491,353 A | 2/1996 | Kean |
| 5,493,239 A | 2/1996 | Zlotnick |
| 5,493,663 A | 2/1996 | Parikh |
| 5,497,498 A | 3/1996 | Taylor |

(56) References Cited

U.S. PATENT DOCUMENTS

| | | |
|---|---|---|
| 5,500,609 A | 3/1996 | Kean |
| 5,502,838 A | 3/1996 | Kikinis |
| 5,504,439 A | 4/1996 | Tavana |
| 5,506,998 A | 4/1996 | Kato et al. |
| 5,510,730 A | 4/1996 | El Gamal et al. |
| 5,511,173 A | 4/1996 | Yamaura et al. |
| 5,513,366 A | 4/1996 | Agarwal et al. |
| 5,515,107 A | 5/1996 | Chiang et al. |
| 5,521,837 A | 5/1996 | Frankle et al. |
| 5,522,083 A | 5/1996 | Gove et al. |
| 5,525,971 A | 6/1996 | Flynn |
| 5,530,873 A | 6/1996 | Takano |
| 5,530,946 A | 6/1996 | Bouvier et al. |
| 5,532,693 A | 7/1996 | Winters et al. |
| 5,532,957 A | 7/1996 | Malhi |
| 5,535,406 A | 7/1996 | Kolchinsky |
| 5,537,057 A | 7/1996 | Leong et al. |
| 5,537,580 A | 7/1996 | Giomi et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemeny et al. |
| 5,550,782 A | 8/1996 | Cliff et al. |
| 5,555,434 A | 9/1996 | Carlstedt |
| 5,559,450 A | 9/1996 | Ngai et al. |
| 5,561,738 A | 10/1996 | Kinerk et al. |
| 5,568,624 A | 10/1996 | Sites et al. |
| 5,570,040 A | 10/1996 | Lytle et al. |
| 5,572,710 A | 11/1996 | Asano et al. |
| 5,574,927 A | 11/1996 | Scantlin |
| 5,574,930 A | 11/1996 | Halverson, Jr. et al. |
| 5,581,731 A | 12/1996 | King et al. |
| 5,581,734 A | 12/1996 | DiBrino et al. |
| 5,583,450 A | 12/1996 | Trimberger et al. |
| 5,584,013 A | 12/1996 | Cheong et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |
| 5,590,348 A | 12/1996 | Phillips et al. |
| 5,596,742 A | 1/1997 | Agarwal et al. |
| 5,596,743 A | 1/1997 | Bhat et al. |
| 5,600,265 A | 2/1997 | El Gamal et al. |
| 5,600,597 A | 2/1997 | Kean et al. |
| 5,600,845 A | 2/1997 | Gilson |
| 5,602,999 A | 2/1997 | Hyatt |
| 5,606,698 A | 2/1997 | Powell |
| 5,608,342 A | 3/1997 | Trimberger |
| 5,611,049 A | 3/1997 | Pitts |
| 5,617,547 A | 4/1997 | Feeney et al. |
| 5,617,577 A | 4/1997 | Barker et al. |
| 5,619,720 A | 4/1997 | Garde et al. |
| 5,625,806 A | 4/1997 | Kromer |
| 5,625,836 A | 4/1997 | Barker et al. |
| 5,627,992 A | 5/1997 | Baror |
| 5,631,578 A | 5/1997 | Clinton et al. |
| 5,632,029 A | 5/1997 | Bruce et al. |
| 5,634,131 A | 5/1997 | Matter et al. |
| 5,635,851 A | 6/1997 | Tavana |
| 5,642,058 A | 6/1997 | Trimberger et al. |
| 5,646,544 A | 7/1997 | Iadanza |
| 5,646,545 A | 7/1997 | Trimberger et al. |
| 5,646,546 A | 7/1997 | Bertolet et al. |
| 5,649,176 A | 7/1997 | Selvidge et al. |
| 5,649,179 A | 7/1997 | Steenstra et al. |
| 5,652,529 A | 7/1997 | Gould et al. |
| 5,652,894 A | 7/1997 | Hu et al. |
| 5,655,069 A | 8/1997 | Ogawara et al. |
| 5,655,124 A | 8/1997 | Lin |
| 5,656,950 A | 8/1997 | Duong et al. |
| 5,657,330 A | 8/1997 | Matsumoto |
| 5,659,785 A | 8/1997 | Pechanek et al. |
| 5,659,797 A | 8/1997 | Zandveld et al. |
| 5,671,432 A | 9/1997 | Bertolet et al. |
| 5,675,262 A | 10/1997 | Duong et al. |
| 5,675,743 A | 10/1997 | Mavity |
| 5,675,757 A | 10/1997 | Davidson et al. |
| 5,675,777 A | 10/1997 | Glickman |
| 5,680,583 A | 10/1997 | Kuijsten |
| 5,682,491 A | 10/1997 | Pechanek et al. |
| 5,682,544 A | 10/1997 | Pechanek et al. |
| 5,687,325 A | 11/1997 | Chang |
| 5,694,602 A | 12/1997 | Smith |
| 5,696,791 A | 12/1997 | Yeung |
| 5,696,976 A | 12/1997 | Nizar et al. |
| 5,701,091 A | 12/1997 | Kean |
| 5,705,938 A | 1/1998 | Kean |
| 5,706,482 A | 1/1998 | Matsushima et al. |
| 5,713,037 A | 1/1998 | Wilkinson et al. |
| 5,715,476 A | 2/1998 | Kundu et al. |
| 5,717,890 A | 2/1998 | Ichida et al. |
| 5,717,943 A | 2/1998 | Barker et al. |
| 5,727,229 A | 3/1998 | Kan et al. |
| 5,732,209 A | 3/1998 | Vigil et al. |
| 5,734,869 A | 3/1998 | Chen |
| 5,734,921 A | 3/1998 | Dapp et al. |
| 5,737,516 A | 4/1998 | Circello et al. |
| 5,737,565 A | 4/1998 | Mayfield |
| 5,742,180 A | 4/1998 | DeHon et al. |
| 5,745,734 A | 4/1998 | Craft et al. |
| 5,748,872 A | 5/1998 | Norman |
| 5,748,979 A | 5/1998 | Trimberger |
| 5,752,035 A | 5/1998 | Trimberger |
| 5,754,459 A | 5/1998 | Telikepalli |
| 5,754,820 A | 5/1998 | Yamagami |
| 5,754,827 A | 5/1998 | Barbier et al. |
| 5,754,871 A | 5/1998 | Wilkinson et al. |
| 5,754,876 A | 5/1998 | Tamaki et al. |
| 5,760,602 A | 6/1998 | Tan |
| 5,761,484 A | 6/1998 | Agarwal et al. |
| 5,768,629 A | 6/1998 | Wise et al. |
| 5,773,994 A | 6/1998 | Jones |
| 5,778,439 A | 7/1998 | Trimberger et al. |
| 5,781,756 A | 7/1998 | Hung |
| 5,784,313 A | 7/1998 | Trimberger et al. |
| 5,784,630 A | 7/1998 | Saito et al. |
| 5,784,636 A | 7/1998 | Rupp |
| 5,794,059 A | 8/1998 | Barker et al. |
| 5,794,062 A | 8/1998 | Baxter |
| 5,801,547 A | 9/1998 | Kean |
| 5,801,715 A | 9/1998 | Norman |
| 5,801,958 A | 9/1998 | Dangelo et al. |
| 5,802,290 A | 9/1998 | Casselman |
| 5,804,986 A | 9/1998 | Jones |
| 5,805,477 A | 9/1998 | Perner |
| 5,815,004 A | 9/1998 | Trimberger et al. |
| 5,815,715 A | 9/1998 | Kucukcakar |
| 5,815,726 A | 9/1998 | Cliff |
| 5,821,774 A | 10/1998 | Veytsman et al. |
| 5,828,229 A | 10/1998 | Cliff et al. |
| 5,828,858 A | 10/1998 | Athanas et al. |
| 5,831,448 A | 11/1998 | Kean |
| 5,832,288 A | 11/1998 | Wong |
| 5,838,165 A | 11/1998 | Chatter |
| 5,838,988 A | 11/1998 | Panwar et al. |
| 5,841,973 A | 11/1998 | Kessler et al. |
| 5,844,422 A | 12/1998 | Trimberger et al. |
| 5,844,888 A | 12/1998 | Markkula, Jr. et al. |
| 5,848,238 A | 12/1998 | Shimomura et al. |
| 5,854,918 A | 12/1998 | Baxter |
| 5,857,097 A | 1/1999 | Henzinger et al. |
| 5,857,109 A | 1/1999 | Taylor |
| 5,859,544 A | 1/1999 | Norman |
| 5,860,119 A | 1/1999 | Dockser |
| 5,862,403 A | 1/1999 | Kanai et al. |
| 5,867,691 A | 2/1999 | Shiraishi |
| 5,867,723 A | 2/1999 | Chin et al. |
| 5,870,620 A | 2/1999 | Kadosumi et al. |
| 5,884,075 A | 3/1999 | Hester et al. |
| 5,887,162 A | 3/1999 | Williams et al. |
| 5,887,165 A | 3/1999 | Martel et al. |
| 5,889,533 A | 3/1999 | Lee |
| 5,889,982 A | 3/1999 | Rodgers et al. |
| 5,892,370 A | 4/1999 | Eaton et al. |

(56) References Cited

U.S. PATENT DOCUMENTS

| | | |
|---|---|---|
| 5,892,961 A | 4/1999 | Trimberger |
| 5,892,962 A | 4/1999 | Cloutier |
| 5,894,565 A | 4/1999 | Furtek et al. |
| 5,895,487 A | 4/1999 | Boyd et al. |
| 5,898,602 A | 4/1999 | Rothman et al. |
| 5,901,279 A | 5/1999 | Davis, III |
| 5,915,099 A | 6/1999 | Takata et al. |
| 5,915,123 A | 6/1999 | Mirsky et al. |
| 5,924,119 A | 7/1999 | Sindhu et al. |
| 5,926,638 A | 7/1999 | Inoue |
| 5,933,023 A | 8/1999 | Young |
| 5,933,642 A | 8/1999 | Greenbaum et al. |
| 5,936,424 A | 8/1999 | Young et al. |
| 5,943,242 A | 8/1999 | Vorbach et al. |
| 5,956,518 A | 9/1999 | DeHon et al. |
| 5,960,193 A | 9/1999 | Guttag et al. |
| 5,960,200 A | 9/1999 | Eager et al. |
| 5,966,143 A | 10/1999 | Breternitz, Jr. |
| 5,966,534 A | 10/1999 | Cooke et al. |
| 5,970,254 A | 10/1999 | Cooke et al. |
| 5,978,260 A | 11/1999 | Trimberger et al. |
| 5,978,583 A | 11/1999 | Ekanadham et al. |
| 5,996,048 A | 11/1999 | Cherabuddi et al. |
| 5,996,083 A | 11/1999 | Gupta et al. |
| 5,999,990 A | 12/1999 | Sharrit et al. |
| 6,003,143 A | 12/1999 | Kim et al. |
| 6,011,407 A | 1/2000 | New |
| 6,014,509 A | 1/2000 | Furtek et al. |
| 6,020,758 A | 2/2000 | Patel et al. |
| 6,020,760 A | 2/2000 | Sample et al. |
| 6,021,490 A | 2/2000 | Vorbach et al. |
| 6,023,564 A | 2/2000 | Trimberger |
| 6,023,742 A * | 2/2000 | Ebeling et al. ............... 710/107 |
| 6,026,478 A | 2/2000 | Dowling |
| 6,026,481 A | 2/2000 | New et al. |
| 6,034,538 A | 3/2000 | Abramovici |
| 6,035,371 A | 3/2000 | Magloire |
| 6,038,650 A | 3/2000 | Vorbach et al. |
| 6,038,656 A | 3/2000 | Martin et al. |
| 6,044,030 A | 3/2000 | Zheng et al. |
| 6,047,115 A | 4/2000 | Mohan et al. |
| 6,049,222 A | 4/2000 | Lawman |
| 6,049,866 A | 4/2000 | Earl |
| 6,052,773 A * | 4/2000 | DeHon et al. ............... 712/43 |
| 6,054,873 A | 4/2000 | Laramie |
| 6,055,619 A | 4/2000 | North et al. |
| 6,058,469 A | 5/2000 | Baxter |
| 6,076,157 A | 6/2000 | Borkenhagen et al. |
| 6,077,315 A | 6/2000 | Greenbaum et al. |
| 6,078,736 A | 6/2000 | Guccione |
| 6,081,903 A | 6/2000 | Vorbach et al. |
| 6,084,429 A | 7/2000 | Trimberger |
| 6,085,317 A | 7/2000 | Smith |
| 6,086,628 A | 7/2000 | Dave et al. |
| 6,088,795 A | 7/2000 | Vorbach et al. |
| 6,092,174 A | 7/2000 | Roussakov |
| 6,096,091 A | 8/2000 | Hartmann |
| 6,105,105 A | 8/2000 | Trimberger et al. |
| 6,105,106 A | 8/2000 | Manning |
| 6,108,760 A | 8/2000 | Mirsky et al. |
| 6,118,724 A | 9/2000 | Higginbottom |
| 6,119,181 A | 9/2000 | Vorbach et al. |
| 6,122,719 A | 9/2000 | Mirsky et al. |
| 6,125,072 A | 9/2000 | Wu |
| 6,125,408 A | 9/2000 | McGee et al. |
| 6,127,908 A | 10/2000 | Bozler et al. |
| 6,128,720 A | 10/2000 | Pechanek et al. |
| 6,134,166 A | 10/2000 | Lytle et al. |
| 6,137,307 A | 10/2000 | Iwanczuk et al. |
| 6,145,072 A | 11/2000 | Shams et al. |
| 6,150,837 A | 11/2000 | Beal et al. |
| 6,150,839 A | 11/2000 | New et al. |
| 6,154,048 A | 11/2000 | Iwanczuk et al. |
| 6,154,049 A | 11/2000 | New |
| 6,154,826 A | 11/2000 | Wulf et al. |
| 6,157,214 A | 12/2000 | Marshall |
| 6,170,051 B1 | 1/2001 | Dowling |
| 6,172,520 B1 | 1/2001 | Lawman et al. |
| 6,173,419 B1 | 1/2001 | Barnett |
| 6,173,434 B1 | 1/2001 | Wirthlin et al. |
| 6,178,494 B1 | 1/2001 | Casselman |
| 6,185,256 B1 | 2/2001 | Saito et al. |
| 6,185,731 B1 | 2/2001 | Maeda et al. |
| 6,188,240 B1 | 2/2001 | Nakaya |
| 6,188,650 B1 | 2/2001 | Hamada et al. |
| 6,198,304 B1 | 3/2001 | Sasaki |
| 6,201,406 B1 | 3/2001 | Iwanczuk et al. |
| 6,202,182 B1 | 3/2001 | Abramovici et al. |
| 6,204,687 B1 | 3/2001 | Schultz et al. |
| 6,211,697 B1 | 4/2001 | Lien et al. |
| 6,212,544 B1 | 4/2001 | Borkenhagen et al. |
| 6,212,650 B1 | 4/2001 | Guccione |
| 6,215,326 B1 | 4/2001 | Jefferson et al. |
| 6,216,223 B1 | 4/2001 | Revilla et al. |
| 6,219,833 B1 | 4/2001 | Solomon et al. |
| RE37,195 E | 5/2001 | Kean |
| 6,230,307 B1 | 5/2001 | Davis et al. |
| 6,240,502 B1 | 5/2001 | Panwar et al. |
| 6,243,808 B1 | 6/2001 | Wang |
| 6,247,036 B1 | 6/2001 | Landers et al. |
| 6,247,147 B1 | 6/2001 | Beenstra et al. |
| 6,252,792 B1 | 6/2001 | Marshall et al. |
| 6,256,724 B1 | 7/2001 | Hocevar et al. |
| 6,260,114 B1 | 7/2001 | Schug |
| 6,260,179 B1 | 7/2001 | Ohsawa et al. |
| 6,262,908 B1 | 7/2001 | Marshall et al. |
| 6,263,430 B1 | 7/2001 | Trimberger et al. |
| 6,266,760 B1 | 7/2001 | DeHon et al. |
| 6,279,077 B1 | 8/2001 | Nasserbakht et al. |
| 6,282,627 B1 | 8/2001 | Wong et al. |
| 6,282,701 B1 | 8/2001 | Wygodny et al. |
| 6,285,624 B1 | 9/2001 | Chen |
| 6,286,134 B1 | 9/2001 | Click, Jr. et al. |
| 6,288,566 B1 | 9/2001 | Hanrahan et al. |
| 6,289,440 B1 | 9/2001 | Casselman |
| 6,298,043 B1 | 10/2001 | Mauger et al. |
| 6,298,396 B1 | 10/2001 | Loyer et al. |
| 6,298,472 B1 | 10/2001 | Phillips et al. |
| 6,301,706 B1 | 10/2001 | Maslennikov et al. |
| 6,311,200 B1 | 10/2001 | Hanrahan et al. |
| 6,311,265 B1 | 10/2001 | Beckerle et al. |
| 6,321,298 B1 * | 11/2001 | Hubis ............... 711/124 |
| 6,321,366 B1 | 11/2001 | Tseng et al. |
| 6,321,373 B1 | 11/2001 | Ekanadham et al. |
| 6,338,106 B1 | 1/2002 | Vorbach et al. |
| 6,339,840 B1 | 1/2002 | Kothari et al. |
| 6,341,318 B1 | 1/2002 | Dakhil |
| 6,341,347 B1 | 1/2002 | Joy et al. |
| 6,347,346 B1 | 2/2002 | Taylor |
| 6,349,346 B1 | 2/2002 | Hanrahan et al. |
| 6,353,841 B1 | 3/2002 | Marshall et al. |
| 6,362,650 B1 | 3/2002 | New et al. |
| 6,370,596 B1 | 4/2002 | Dakhil |
| 6,373,779 B1 | 4/2002 | Pang et al. |
| 6,374,286 B1 | 4/2002 | Gee |
| 6,378,068 B1 | 4/2002 | Foster et al. |
| 6,381,624 B1 | 4/2002 | Colon-Bonet et al. |
| 6,389,379 B1 | 5/2002 | Lin et al. |
| 6,389,579 B1 | 5/2002 | Phillips et al. |
| 6,392,912 B1 | 5/2002 | Hanrahan et al. |
| 6,400,601 B1 | 6/2002 | Sudo et al. |
| 6,404,224 B1 | 6/2002 | Azegami et al. |
| 6,405,185 B1 | 6/2002 | Pechanek et al. |
| 6,405,299 B1 | 6/2002 | Vorbach et al. |
| 6,421,808 B1 | 7/2002 | McGeer |
| 6,421,809 B1 | 7/2002 | Wuytack et al. |
| 6,421,817 B1 | 7/2002 | Mohan et al. |
| 6,425,054 B1 | 7/2002 | Nguyen |
| 6,425,068 B1 | 7/2002 | Vorbach |
| 6,426,649 B1 | 7/2002 | Fu et al. |
| 6,427,156 B1 | 7/2002 | Chapman et al. |
| 6,430,309 B1 | 8/2002 | Pressman et al. |
| 6,434,642 B1 | 8/2002 | Camilleri et al. |
| 6,434,672 B1 | 8/2002 | Gaither |

(56) References Cited

U.S. PATENT DOCUMENTS

| | | |
|---|---|---|
| 6,434,695 B1 | 8/2002 | Esfahani et al. |
| 6,434,699 B1 | 8/2002 | Jones et al. |
| 6,437,441 B1 | 8/2002 | Yamamoto |
| 6,438,747 B1 | 8/2002 | Schreiber et al. |
| 6,449,283 B1 | 9/2002 | Chao et al. |
| 6,456,628 B1 | 9/2002 | Greim et al. |
| 6,457,116 B1 | 9/2002 | Mirsky et al. |
| 6,476,634 B1 | 11/2002 | Bilski |
| 6,477,643 B1 | 11/2002 | Vorbach et al. |
| 6,480,937 B1 | 11/2002 | Vorbach et al. |
| 6,480,954 B2 | 11/2002 | Trimberger et al. |
| 6,483,343 B1 | 11/2002 | Faith et al. |
| 6,487,709 B1 | 11/2002 | Keller et al. |
| 6,490,695 B1 | 12/2002 | Zagorski et al. |
| 6,496,740 B1 | 12/2002 | Robertson et al. |
| 6,496,902 B1 | 12/2002 | Faanes et al. |
| 6,496,971 B1 | 12/2002 | Lesea et al. |
| 6,504,398 B1 | 1/2003 | Lien et al. |
| 6,507,898 B1 | 1/2003 | Gibson et al. |
| 6,507,947 B1 | 1/2003 | Schreiber et al. |
| 6,512,804 B1 | 1/2003 | Johnson et al. |
| 6,513,077 B2 | 1/2003 | Vorbach et al. |
| 6,516,382 B2 | 2/2003 | Manning |
| 6,518,787 B1 | 2/2003 | Allegrucci et al. |
| 6,519,674 B1 | 2/2003 | Lam et al. |
| 6,523,107 B1 | 2/2003 | Stansfield et al. |
| 6,525,678 B1 | 2/2003 | Veenstra et al. |
| 6,526,461 B1 | 2/2003 | Cliff |
| 6,526,520 B1 | 2/2003 | Vorbach et al. |
| 6,538,468 B1 | 3/2003 | Moore |
| 6,538,470 B1 | 3/2003 | Langhammer et al. |
| 6,539,415 B1 | 3/2003 | Mercs |
| 6,539,438 B1 | 3/2003 | Ledzius et al. |
| 6,539,477 B1 | 3/2003 | Seawright |
| 6,542,394 B2 | 4/2003 | Marshall et al. |
| 6,542,844 B1 | 4/2003 | Hanna |
| 6,542,998 B1 | 4/2003 | Vorbach |
| 6,553,395 B2 | 4/2003 | Marshall et al. |
| 6,553,479 B2 | 4/2003 | Mirsky et al. |
| 6,567,834 B1 | 5/2003 | Marshall et al. |
| 6,571,381 B1 | 5/2003 | Vorbach et al. |
| 6,587,939 B1 | 7/2003 | Takano |
| 6,598,128 B1 | 7/2003 | Yoshioka et al. |
| 6,606,704 B1 | 8/2003 | Adiletta et al. |
| 6,624,819 B1 | 9/2003 | Lewis |
| 6,625,631 B2 | 9/2003 | Ruehle |
| 6,631,487 B1 | 10/2003 | Abramovici et al. |
| 6,633,181 B1 | 10/2003 | Rupp |
| 6,657,457 B1 | 12/2003 | Hanrahan et al. |
| 6,658,564 B1 | 12/2003 | Smith et al. |
| 6,665,758 B1 | 12/2003 | Frazier et al. |
| 6,668,237 B1 | 12/2003 | Guccione et al. |
| 6,681,388 B1 | 1/2004 | Sato et al. |
| 6,687,788 B2 | 2/2004 | Vorbach et al. |
| 6,697,979 B1 | 2/2004 | Vorbach et al. |
| 6,704,816 B1 | 3/2004 | Burke |
| 6,708,325 B2 | 3/2004 | Cooke et al. |
| 6,717,436 B2 | 4/2004 | Kress et al. |
| 6,721,830 B2 | 4/2004 | Vorbach et al. |
| 6,725,334 B2 | 4/2004 | Barroso et al. |
| 6,728,871 B1 | 4/2004 | Vorbach et al. |
| 6,745,317 B1 | 6/2004 | Mirsky et al. |
| 6,748,440 B1 | 6/2004 | Lisitsa et al. |
| 6,751,722 B2 | 6/2004 | Mirsky et al. |
| 6,754,805 B1 | 6/2004 | Juan |
| 6,757,847 B1 | 6/2004 | Farkash et al. |
| 6,757,892 B1 | 6/2004 | Gokhale et al. |
| 6,782,445 B1 | 8/2004 | Olgiati et al. |
| 6,785,826 B1 | 8/2004 | Durham et al. |
| 6,802,026 B1 | 10/2004 | Patterson et al. |
| 6,803,787 B1 | 10/2004 | Wicker, Jr. |
| 6,820,188 B2 | 11/2004 | Stansfield et al. |
| 6,829,697 B1 | 12/2004 | Davis et al. |
| 6,836,842 B1 | 12/2004 | Guccione et al. |
| 6,847,370 B2 | 1/2005 | Baldwin et al. |
| 6,859,869 B1 | 2/2005 | Vorbach |
| 6,868,476 B2 | 3/2005 | Rosenbluth |
| 6,871,341 B1 | 3/2005 | Shyr |
| 6,874,108 B1 | 3/2005 | Abramovici et al. |
| 6,886,092 B1 | 4/2005 | Douglass et al. |
| 6,901,502 B2 | 5/2005 | Yano et al. |
| 6,928,523 B2 | 8/2005 | Yamada |
| 6,957,306 B2 | 10/2005 | So et al. |
| 6,961,924 B2 | 11/2005 | Bates et al. |
| 6,975,138 B2 | 12/2005 | Pani et al. |
| 6,977,649 B1 | 12/2005 | Baldwin et al. |
| 7,000,161 B1 | 2/2006 | Allen et al. |
| 7,007,096 B1 | 2/2006 | Lisitsa et al. |
| 7,010,667 B2 | 3/2006 | Vorbach |
| 7,010,687 B2 | 3/2006 | Ichimura |
| 7,028,107 B2 | 4/2006 | Vorbach et al. |
| 7,036,114 B2 | 4/2006 | McWilliams et al. |
| 7,038,952 B1 | 5/2006 | Zack et al. |
| 7,043,416 B1 | 5/2006 | Lin |
| 7,144,152 B2 | 12/2006 | Rusu et al. |
| 7,210,129 B2 | 4/2007 | May et al. |
| 7,216,204 B2 | 5/2007 | Rosenbluth |
| 7,237,087 B2 | 6/2007 | Vorbach et al. |
| 7,249,351 B1 | 7/2007 | Songer et al. |
| 7,254,649 B2 | 8/2007 | Subramanian et al. |
| 7,340,596 B1 | 3/2008 | Crosland et al. |
| 7,346,644 B1 | 3/2008 | Langhammer et al. |
| 7,350,178 B1 | 3/2008 | Crosland et al. |
| 7,382,156 B2 | 6/2008 | Pani et al. |
| 7,455,450 B2 | 11/2008 | Liu et al. |
| 7,595,659 B2 | 9/2009 | Vorbach et al. |
| 7,650,448 B2 | 1/2010 | Vorbach et al. |
| 7,657,877 B2 | 2/2010 | Vorbach et al. |
| 7,759,968 B1 | 7/2010 | Hussein et al. |
| 7,873,811 B1 | 1/2011 | Wolinski et al. |
| 7,928,763 B2 * | 4/2011 | Vorbach ..................... 326/38 |
| 2001/0001860 A1 | 5/2001 | Beiu |
| 2001/0003834 A1 | 6/2001 | Shimonishi |
| 2001/0010074 A1 | 7/2001 | Nishihara et al. |
| 2001/0018733 A1 | 8/2001 | Fujii et al. |
| 2001/0032305 A1 | 10/2001 | Barry |
| 2002/0010853 A1 | 1/2002 | Trimberger et al. |
| 2002/0013861 A1 | 1/2002 | Adiletta et al. |
| 2002/0038414 A1 | 3/2002 | Taylor |
| 2002/0045952 A1 | 4/2002 | Blemel |
| 2002/0051482 A1 | 5/2002 | Lomp |
| 2002/0073282 A1 | 6/2002 | Chauvel et al. |
| 2002/0083308 A1 | 6/2002 | Pereira et al. |
| 2002/0087828 A1 | 7/2002 | Armilli et al. |
| 2002/0099759 A1 | 7/2002 | Gootherts |
| 2002/0103839 A1 | 8/2002 | Ozawa |
| 2002/0124238 A1 | 9/2002 | Metzgen |
| 2002/0138716 A1 | 9/2002 | Master et al. |
| 2002/0143505 A1 | 10/2002 | Drusinsky |
| 2002/0144229 A1 | 10/2002 | Hanrahan |
| 2002/0147932 A1 | 10/2002 | Brock et al. |
| 2002/0152060 A1 | 10/2002 | Tseng |
| 2002/0156962 A1 | 10/2002 | Chopra et al. |
| 2002/0165886 A1 | 11/2002 | Lam |
| 2003/0001615 A1 | 1/2003 | Sueyoshi et al. |
| 2003/0014743 A1 | 1/2003 | Cooke et al. |
| 2003/0046607 A1 | 3/2003 | May et al. |
| 2003/0052711 A1 | 3/2003 | Taylor |
| 2003/0055861 A1 | 3/2003 | Lai et al. |
| 2003/0056062 A1 | 3/2003 | Prabhu |
| 2003/0056085 A1 | 3/2003 | Vorbach |
| 2003/0056091 A1 | 3/2003 | Greenberg |
| 2003/0056202 A1 | 3/2003 | May et al. |
| 2003/0061542 A1 | 3/2003 | Bates et al. |
| 2003/0062922 A1 | 4/2003 | Douglass et al. |
| 2003/0070059 A1 | 4/2003 | Dally et al. |
| 2003/0086300 A1 | 5/2003 | Noyes et al. |
| 2003/0093662 A1 | 5/2003 | Vorbach et al. |
| 2003/0097513 A1 | 5/2003 | Vorbach et al. |
| 2003/0108046 A1 | 6/2003 | Simeone |
| 2003/0123579 A1 | 7/2003 | Safavi et al. |
| 2003/0135686 A1 | 7/2003 | Vorbach et al. |
| 2003/0154349 A1 | 8/2003 | Berg et al. |
| 2003/0192032 A1 | 10/2003 | Andrade et al. |

(56) References Cited

U.S. PATENT DOCUMENTS

| | | | |
|---|---|---|---|
| 2004/0015899 A1 | 1/2004 | May et al. |
| 2004/0025005 A1 | 2/2004 | Vorbach et al. |
| 2004/0039880 A1 | 2/2004 | Pentkovski et al. |
| 2004/0078548 A1 | 4/2004 | Claydon et al. |
| 2004/0168099 A1 | 8/2004 | Vorbach et al. |
| 2004/0199688 A1 | 10/2004 | Vorbach et al. |
| 2005/0066213 A1 | 3/2005 | Vorbach et al. |
| 2005/0091468 A1 | 4/2005 | Morita et al. |
| 2005/0144210 A1 | 6/2005 | Simkins et al. |
| 2005/0144212 A1 | 6/2005 | Simkins et al. |
| 2005/0144215 A1 | 6/2005 | Simkins et al. |
| 2006/0036988 A1 | 2/2006 | Allen et al. |
| 2006/0112227 A1 | 5/2006 | Hady et al. |
| 2006/0230094 A1 | 10/2006 | Simkins et al. |
| 2006/0230096 A1 | 10/2006 | Thendean et al. |
| 2007/0050603 A1 | 3/2007 | Vorbach et al. |
| 2007/0083730 A1 | 4/2007 | Vorbach et al. |
| 2008/0313383 A1 | 12/2008 | Morita et al. |
| 2009/0085603 A1 | 4/2009 | Paul et al. |
| 2009/0193384 A1 | 7/2009 | Sima et al. |
| 2010/0306602 A1 | 12/2010 | Kamiya et al. |

FOREIGN PATENT DOCUMENTS

| | | |
|---|---|---|
| DE | 42 21 278 | 1/1994 |
| DE | 44 16 881 | 11/1994 |
| DE | 4416881 A1 | 11/1994 |
| DE | 38 55 673 | 11/1996 |
| DE | 196 51 075 | 6/1998 |
| DE | 196 54 593 | 7/1998 |
| DE | 196 54 595 | 7/1998 |
| DE | 196 54 846 | 7/1998 |
| DE | 197 04 044 | 8/1998 |
| DE | 197 04 728 | 8/1998 |
| DE | 197 04 742 | 9/1998 |
| DE | 198 22 776 | 3/1999 |
| DE | 198 07 872 | 8/1999 |
| DE | 198 61 088 | 2/2000 |
| DE | 199 26 538 | 12/2000 |
| DE | 100 28 397 | 12/2001 |
| DE | 100 36 627 | 2/2002 |
| DE | 101 29 237 | 4/2002 |
| DE | 102 04 044 | 8/2003 |
| EP | 0 208 457 | 1/1987 |
| EP | 0 221 360 | 5/1987 |
| EP | 0 398 552 | 11/1990 |
| EP | 0 428 327 | 5/1991 |
| EP | 0 463 721 | 1/1992 |
| EP | 0 477 809 | 4/1992 |
| EP | 0 485 690 | 5/1992 |
| EP | 0 497 029 | 8/1992 |
| EP | 0 539 595 | 5/1993 |
| EP | 0 638 867 A2 | 8/1994 |
| EP | 0 628 917 | 12/1994 |
| EP | 0 678 985 | 10/1995 |
| EP | 0 686 915 | 12/1995 |
| EP | 0 696 001 | 2/1996 |
| EP | 0 707 269 | 4/1996 |
| EP | 0 726 532 | 8/1996 |
| EP | 0 735 685 | 10/1996 |
| EP | 0 746 106 | 12/1996 |
| EP | 0 748 051 | 12/1996 |
| EP | 0 926 594 | 6/1999 |
| EP | 1 061 439 | 12/2000 |
| EP | 1 115 204 | 7/2001 |
| EP | 1 146 432 | 10/2001 |
| EP | 1 669 885 | 6/2006 |
| FR | 2 752 466 | 2/1998 |
| GB | 2 304 438 | 3/1997 |
| JP | 58-058672 | 4/1983 |
| JP | 1044571 | 2/1989 |
| JP | 1-229378 | 9/1989 |
| JP | 2-130023 | 5/1990 |
| JP | 2-226423 | 9/1990 |
| JP | 5-265705 | 10/1993 |
| JP | 5-276007 | 10/1993 |
| JP | 5-509184 | 12/1993 |
| JP | 6-266605 | 9/1994 |
| JP | 7-086921 | 3/1995 |
| JP | 7-154242 | 6/1995 |
| JP | 8-148989 | 6/1995 |
| JP | 7-182160 | 7/1995 |
| JP | 7-182167 | 7/1995 |
| JP | 8-044581 | 2/1996 |
| JP | 8-069447 | 3/1996 |
| JP | 8-101761 | 4/1996 |
| JP | 8-102492 | 4/1996 |
| JP | 8-106443 | 4/1996 |
| JP | 8-221164 | 8/1996 |
| JP | 8-250685 | 9/1996 |
| JP | 9-027745 | 1/1997 |
| JP | 9-237284 | 9/1997 |
| JP | 9-294069 | 11/1997 |
| JP | 11-046187 | 2/1999 |
| JP | 11-184718 | 7/1999 |
| JP | 11-307725 | 11/1999 |
| JP | 2000-076066 | 3/2000 |
| JP | 2000-181566 | 6/2000 |
| JP | 2000-201066 | 7/2000 |
| JP | 2000-311156 | 11/2000 |
| JP | 2001-500682 | 1/2001 |
| JP | 2001-167066 | 6/2001 |
| JP | 2001-510650 | 7/2001 |
| JP | 2001-236221 | 8/2001 |
| JP | 2002-0033457 | 1/2002 |
| JP | 3-961028 | 8/2007 |
| WO | WO90/04835 | 5/1990 |
| WO | WO90/11648 | 10/1990 |
| WO | WO92/01987 | 2/1992 |
| WO | WO93/11503 | 6/1993 |
| WO | WO94/06077 | 3/1994 |
| WO | WO94/08399 | 4/1994 |
| WO | WO95/26001 | 9/1995 |
| WO | WO9525306 A2 * | 9/1995 | ............... G06F 12/08 |
| WO | WO 9525306 A2 | 9/1995 |
| WO | WO9528671 | 10/1995 |
| WO | WO98/10517 | 3/1998 |
| WO | WO98/26356 | 6/1998 |
| WO | WO98/28697 | 7/1998 |
| WO | WO98/29952 | 7/1998 |
| WO | WO98/31102 | 7/1998 |
| WO | WO98/35294 | 8/1998 |
| WO | WO98/35299 | 8/1998 |
| WO | WO99/00731 | 1/1999 |
| WO | WO99/00739 | 1/1999 |
| WO | WO99/12111 | 3/1999 |
| WO | WO99/32975 | 7/1999 |
| WO | WO99/40522 | 8/1999 |
| WO | WO99/44120 | 9/1999 |
| WO | WO99/44147 | 9/1999 |
| WO | WO00/17771 | 3/2000 |
| WO | WO00/38087 | 6/2000 |
| WO | WO00/45282 | 8/2000 |
| WO | WO00/49496 | 8/2000 |
| WO | WO00/77652 | 12/2000 |
| WO | WO01/55917 | 8/2001 |
| WO | WO02/13000 | 2/2002 |
| WO | WO02/29600 | 4/2002 |
| WO | WO02/50665 | 6/2002 |
| WO | WO02/071196 | 9/2002 |
| WO | WO02/071248 | 9/2002 |
| WO | WO02/071249 | 9/2002 |
| WO | WO02/103532 | 12/2002 |
| WO | WO03/017095 | 2/2003 |
| WO | WO03/023616 | 3/2003 |
| WO | WO03/025781 | 3/2003 |
| WO | WO03/036507 | 5/2003 |
| WO | WO 03/091875 | 11/2003 |
| WO | WO2004/053718 | 6/2004 |
| WO | WO2004/114128 | 12/2004 |

(56) References Cited

FOREIGN PATENT DOCUMENTS

| WO | WO2005/045692 | 5/2005 |
|----|---------------|--------|
| WO | WO 2007/030395 | 3/2007 |

OTHER PUBLICATIONS

Li, Zhiyuan, et al., "Configuration prefetching techniques for partial reconfigurable coprocessor with relocation and defragmentation," International Symposium on Field Programmable Gate Arrays, Feb. 1, 2002, pp. 187-195.

ARM Limited, "ARM Architecture Reference Manual," Dec. 6, 2000, pp. A10-6-A10-7.

U.S. Reexamination Application Control No. 90/010,979, Vorbach et al., filed May 4, 2010.

U.S. Reexamination Application Control No. 90/011,087, Vorbach et al., filed Jul. 8, 2010.

U.S. Reexamination Application Control No. 90/010,450, Vorbach et al. filed Mar. 27, 2009.

U.S. Appl. No. 60/109,417, Jefferson et al., filed Nov. 18, 1998.

Abnous et al., "Ultra-Low-Power Domain-Specific Multimedia Processors," U.C. Berkeley, 1996 IEEE, pp. 461-470.

Abnous, A., et al., "The Pleiades Architecture," Chapter I of *The Application of Programmable DSPs in Mobile Communications*, A. Gatherer and A. Auslander, Ed., Wiley, 2002, pp. 1-33.

Ade, et al., "Minimum Memory Buffers in DSP Applications," Electronics Letters, vol. 30, No. 6, Mar. 17, 1994, pp. 469-471.

Advanced RISC Machines, "Introduction to AMBA," Oct. 1996, Section 1, pp. 1-7.

ARM, "The Architecture for the Digital World," http://www.arm.com/products/ Mar. 18, 2009, 3 pages.

ARM, "The Architecture for the Digital World; Milestones," http://www.arm.com/aboutarm/milestones.html Mar. 18, 2009, 5 pages.

Albaharna, O.T. et al., "On the Viability of FPGA-Based Integrated Coprocessors," Dept. of Electrical and Electronic Engineering, Imperial College of Science, London, 1999 IEEE, pp. 206-215.

Alippi, et al., "Determining the Optimum Extended Instruction Set Architecture for Application Specific Reconfigurable VLIW CPUs," IEEE, 2001, pp. 50-56.

Altera, "Flex 8000 Programmable Logic Device Family," Altera Corporation Data Sheet, Jan. 2003, pp. 1-62.

Altera, "Flex 10K Embedded Programmable Logic Device Family," Altera Corporation Data Sheet, Jan. 2003, pp. 1-128.

Altera, "APEX 20K Programmable Logic Device Family," Altera Corporation Data Sheet, Mar. 2004, ver. 5.1, pp. 1-117.

Altera, "2. TriMatrix Embedded Memory Blocks in Stratix & Stratix GX Devices," Altera Corporation, Jul. 2005, 28 pages.

Altera, "APEX II Programmable Logic Device Family," Altera Corporation Data Sheet, Aug. 2002, Ver. 3.0, 99 pages.

Arabi, et al., "PLD Integrates Dedicated High-speed Data Buffering, Complex State machine, and Fast Decode Array," conference record on WESCON '93, Sep. 28, 1993, pp. 432-436.

Asari, K. et al., "FeRAM circuit technology for system on a chip," *Proceedings First NASA/DoD Workshop on Evolvable Hardware* (1999), pp. 193-197.

Athanas, "A Functional Reconfigurable Architecture and Compiler for Adoptive Computing," IEEE 1993, pp. 49-55.

Athanas, et al., "An Adaptive Hardware Machine Architecture and Compiler for Dynamic Processor Reconfigutation," IEEE, Laboratory for Engineering man/Machine Systems Division of Engineering, Box D, Brown University, Providence, Rhode Island, 1991, pp. 397-400.

Athanas et al., "Processor Reconfiguration Through Instruction-Set Metamorphosis," 1993, IEEE Computers, pp. 11-18.

Atmel, 5-K-50K Gates Coprocessor FPGA with Free Ram, Data Sheet, Jul. 2006, 55 pages.

Atmel, FPGA-based FIR Filter Application Note, Sep. 1999, 10 pages.

Atmel, "An Introduction to DSP Applications using the AT40K FPGA," FPGA Application Engineering, San Jose, CA, Apr. 2004, 15 pages.

Atmel, Configurable Logic Design & Application Book, Atmel Corporation, 1995, pp. 2-19 through 2-25.

Atmel, Field Programmable Gate Array Configuration Guide, AT6000 Series Configuration Data Sheet, Sep. 1999, pp. 1-20.

Bacon, D. et al., "Compiler Transformations for High-Performance Computing," ACM Computing Surveys, 26(4):325-420 (1994).

Bakkes, P.J., et al., "Mixing Fixed and Reconfigurable Logic for Array Processing," Dept. of Electrical and Electronic Engineering, University of Stellenbosch, South Africa, 1996 IEEE, pp. 118-125.

Ballagh et al., "Java Debug Hardware Models Using JBits," 8$^{th}$ Reconfigurable Architectures Workshop, 2001, 8 pages.

Baumgarte, V. et al., "PACT XPP—A Self-reconfigurable Data Processing Architecture," PACT Info. GMBH, Munchen Germany, 2001, 7 pages.

Beck et al., "From control flow to data flow," TR 89/1050, Oct. 1989, Dept. of Computer Science, Cornell University, Ithaca, NY, pp. 1-25.

Becker, J., "A Partitioning Compiler for Computers with Xputer-based Accelerators," 1997, Kaiserslautern University, 326 pp.

Becker, J. et al., "Architecture, Memory and Interface Technology Integration of an Industrial/Academic Configurable System-on-Chip (CSoC)," IEEE Computer Society Annual Workshop on VLSI (WVLSI 2003), (Feb. 2003), 6 pages.

Becker, J., "Configurable Systems-on-Chip (CSoC)," (Invited Tutorial), Proc. of 9th Proc. of XV Brazilian Symposium on Integrated Circuit, Design (SBCCI 2002), (Sep. 2002), 6 pages.

Becker et al., "Automatic Parallelism Exploitation for FPL-Based Accelerators," 1998, Proc. 31$^{st}$ Annual Hawaii International Conference on System Sciences, pp. 169-178.

Becker, J. et al., "Parallelization in Co-compilation for Configurable Accelerators—a Host/accelerator Partitioning Compilation Method," Proceedings of Asia and South Pacific Design Automation Conference, Yokohama, Japan, Feb. 10-13, 1998, 11 pages.

Bellows et al., "Designing Run-Time Reconfigurable Systems with JHDL," Journal of VLSI Signal Processing 28, Kluwer Academic Publishers, The Netherlands, 2001, pp. 29-45.

Bittner, "Wormhole Run-time Reconfiguration: Conceptualization and VLSI Design of a High Performance Computing System," *Dissertation*, Jan. 23, 1997, pp. 1-XX, 1-415.

"BlueGene/L—Hardware Architecture Overview," BlueGene/L design team, IBM Research, Oct. 17, 2003 slide presentation, pp. 1-23.

"BlueGene/L: the next generation of scalable supercomputer," Kissel et al., Lawrence Livermore National Laboratory, Livermore, California, Nov. 18, 2002, 29 pages.

BlueGene Project Update, Jan. 2002, IBM slide presentation, 20 pages.

BlueGene/L, "An Overview of the BlueGene/L Supercomputer," The BlueGene/L Team, IBM and Lawrence Livermore National Laboratory, 2002 IEEE. pp. 1-22.

Bratt, A, "Motorola field programmable analogue arrays, present hardware and future trends," Motorola Programmable Technology Centre, Gadbrook Business Centre, Northwich, Cheshire, 1998, The Institute of Electrical Engineers, IEE. Savoy Place, London, pp. 1-5.

Cadambi, et al., "Managing Pipeline-reconfigurable FPGAs," ACM, 1998, pp. 55-64.

Callahan, et al., "The Garp Architecture and C Compiler," Computer, Apr. 2000, pp. 62-69.

Cardoso, J.M.P., et al., "A novel algorithm combining temporal partitioning and sharing of functional units," University of Algarve, Faro, Portugal, 2001 IEEE, pp. 1-10.

Cardoso, Joao M.P., and Markus Weinhardt, "XPP-VC: A C Compiler with Temporal Partitioning for the PACT-XPP Architecture," Field-Programmable Logic and Applications. Reconfigurable Computing is Going Mainstream, 12$^{th}$ International Conference FPL 2002, Proceedings (Lecture Notes in Computer Science, vol. 2438) Springer-Verlag Berlin, Germany, 2002, pp. 864-874.

Cardoso, J.M.P., "Compilation of Java™ Algorithms onto Reconfigurable Computing Systems with Exploitation of Operation-Level Parallelism," Ph.D. Thesis, Universidade Tecnica de Lisboa (UTL), Lisbon, Portugal Oct. 2000 Table of Contents and English Abstract only).

(56) References Cited

OTHER PUBLICATIONS

Cardoso, J.M.P., et al., "Compilation and Temporal Partitioning for a Coarse-Grain Reconfigurable Architecture," New Algorithms, Architectures and Applications for Reconfigurable Computing, Lysacht, P. & Rosentiel, W. eds., (2005) pp. 105-115.

Cardoso, J.M.P., et al., "Macro-Based Hardware Compilation of Java™ Bytecodes into a Dynamic Reconfigurable Computing System," IEEE, Apr. 21, 1999, pp. 2-11.

Chaudhry, G.M. et al., "Separated caches and buses for multiprocessor system," Circuits and Systems, 1993; Proceedings of the 36th Midwest Symposium on Detroit, MI, USA, Aug. 16-18, 1993, New York, NY IEEE, Aug. 16, 1993, pp. 1113-1116, XP010119918 ISBN: 0-7803-1760-2.

Chen et al., "A reconfigurable multiprocessor IC for rapid prototyping of algorithmic-specific high-speed DSP data paths," IEEE Journal of Solid-State Circuits, vol. 27, No. 12, Dec. 1992, pp. 1895-1904.

Clearspeed, CSX Processor Architecture, Whitepaper, PN-1110-0702, 2007, pp. 1-15, www.clearspeed.com.

Clearspeed, CSX Processor Architecture, Whitepaper, PN-1110-0306, 2006, pp. 1-14, www.clearspeed.com.

Compton, K., et al., "Configurable Computing: A Survey of Systems and Software," Northwestern University, Dept. of ECE, Technical Report, 1999, (XP-002315148), 39 pages.

Cook, Jeffrey J., "The Amalgam Compiler Infrastructure," Thesis at the University of Illinois at Urbana-Champaign (2004) Chapter 7 & Appendix G.

Cronquist, D., et al., "Architecture Design of Reconfigurable Pipelined Datapaths," Department of Computer Science and Engineering, University of Washington, Seattle, WA, Proceedings of the 20th Anniversary Conference on Advanced Research in VSLI, 1999, pp. 1-15.

Culler, D.E; Singh, J.P., "Parallel Computer Architecture," pp. 434-437, 1999, Morgan Kaufmann, San Francisco, CA USA, XP002477559.

Culler, D.E; Singh, J.P., "Parallel Computer Architecture," p. 17, 1999, Morgan Kaufmann, San Francisco, CA USA, XP002477559.

DeHon, A., "DPGA Utilization and Application," MIT Artificial Intelligence Laboratory, Proceedings of the Fourth International ACM Symposium on Field-Programmable Gate Arrays (FPGA 1996), IEEE Computer Society, pp. 1-7.

DeHon, Andre, "Reconfigurable Architectures for General-Purpose Computing," Massachusetts Institute of Technology, Technical Report AITR-1586, Oct. 1996, XP002445054, Cambridge, MA, pp. 1-353.

Del Corso et al., "Microcomputer Buses and Links," Academic Press Inc. Ltd., 1986, pp. 138-143, 277-285.

Diniz, P., et al., "Automatic Synthesis of Data Storage and Control Structures for FPGA-based Computing Engines," 2000, IEEE, pp. 91-100.

Diniz, P., et al., "A behavioral synthesis estimation interface for configurable computing," University of Southern California, Marina Del Rey, CA, 2001 IEEE, pp. 1-2.

Donandt, "Improving Response Time of Programmable Logic Controllers by use of a Boolean Coprocessor," AEG Research Institute Berlin, IEEE, 1989, pp. 4-167-4-169.

Dutt, et al., "If Software is King for Systems-in-Silicon, What's New in Compilers?" IEEE, 1997, pp. 322-325.

Ebeling, C., et al., "Mapping Applications to the RaPiD Configurable Architecture," Department of Computer Science and Engineering, University of Washington, Seattle, WA, *FPGAs for Custom Computing Machines*, 1997. *Proceedings., The 5th Annual IEEE Symposium*, Publication Date: Apr. 16-18, 1997, 10 pages.

Equator, Pixels to Packets, Enabling Multi-Format High Definition Video, Equator Technologies BSP-15 Product Brief, www.equator.com, 2001 4 pages.

Fawcett, B.K., "Map, Place and Route: The Key to High-Density PLD Implementation," Wescon Conference, IEEE Center (Nov. 7, 1995) pp. 292-297.

Ferrante, J., et al., "The Program Dependence Graph and its Use in Optimization ACM Transactions on Programming Languages and Systems," Jul. 1987, USA, [online] Bd. 9, Nr., 3, pp. 319-349, XP002156651 ISSN: 0164-0935 ACM Digital Library.

Fineberg, S, et al., "Experimental Analysis of a Mixed-Mode Parallel Architecture Using Bitonic Sequence Sorting," Journal of Parallel and Distributed Computing, vol. 11, No. 3, Mar. 1991, pp. 239-251.

Fornaciari, et al., System-level power evaluation metrics, 1997 Proceedings of the 2nd Annual IEEE International Conference on Innovative Systems in Silicon, New York, NY, Oct. 1997, pp. 323-330.

Forstner, "Wer Zuerst Kommt, Mahlt Zuerst!: Teil 3: Einsatzgebiete und Anwendungbeispiele von FIFO-Speichern," Elektronik, Aug. 2000, pp. 104-109.

Franklin, Manoj, et al., "A Fill-Unit Approach to Multiple Instruction Issue," Proceedings of the Annual International Symposium on Microarchitecture, Nov. 1994, pp. 162-171.

Freescale Slide Presentation, An Introduction to Motorola's RCF (Reconfigurable Compute Fabric) Technology, Presented by Frank David, Launched by Freescale Semiconductor, Inc., 2004, 39 pages.

Galanis, M.D. et al., "Accelerating Applications by Mapping Critical Kernels on Coarse-Grain Reconfigurable Hardware in Hybrid Systems," Proceedings of the 13th Annual IEEE Symposium on Field-Programmable Custom Computing Machines, 2005, 2 pages.

Genius, D., et al., "A Case for Array Merging in Memory Hierarchies," Proceedings of the 9th International Workshop on Compilers for Parallel Computers, CPC'01 (Jun. 2001), 10 pages.

Gokhale, M.B., et al., "Automatic Allocation of Arrays to Memories in FPGA processors with Multiple Memory Banks," Field-Programmable Custom Computing Machines, 1999, IEEE, pp. 63-69.

Guccione et al., "JBits: Java based interface for reconfigurable computing," Xilinx, Inc., San Jose, CA, 1999, 9 pages.

Guo, Z. et al., "A Compiler Intermediate Representation for Reconfigurable Fabrics," University of California, Riverside, Dept. of Electrical Engineering, IEEE 2006, 4 pages.

Gwennap, Linley, "P6 Underscores Intel's Lead," Microprocessor Report, vol. 9., No. 2, Feb. 16, 1995 (MicroDesign Resources), p. 1 and pp. 6-15.

Gwennap, Linley, "Intel's P6 Bus Designed for Multiprocessing," Microprocessor Report, vol. 9, No. 7 (MicroDesign Resources), May 30, 1995, p. 1 and pp. 6-10.

Hammes, Jeff, et al., "Cameron: High Level Language Compilation for Reconfigurable Systems," Department of Computer Science, Colorado State University, Conference on Parallel Architectures and Compilation Techniques, Oct. 12-16, 1999, 9 pages.

Hartenstein, R. et al., "A new FPGA architecture for word-oriented datapaths," Proc. FPL'94, Springer LNCS, Sep. 1994, pp. 144-155.

Hartenstein, R., "Coarse grain reconfigurable architectures," Design Automation Conference, 2001, Proceedings of the ASP-DAC 2001 Asia and South Pacific, Jan. 30-Feb. 2, 2001, IEEE Jan. 30, 2001, pp. 564-569.

Hartenstein et al., "Parallelizing Compilation for a Novel Data-Parallel Architecture," 1995, PCAT-94, Parallel Computing: Technology and Practice, 13 pp.

Hartenstein et al., "A Two-Level Co-Design Framework for Xputer-based Data-driven Reconfigurable Accelerators," 1997, Proceedings of the Thirtieth Annual Hawaii International Conference on System Sciences, 10 pp.

Hastie et al., "The implementation of hardware subroutines on field programmable gate arrays," Custom Integrated Circuits Conference, 1990, Proceedings of the IEEE 1990, May 16, 1990, pp. 31.3.1-31.4.3 (3 pages).

Hauck, "The Roles of FPGAs in Reprogrammable Systems," IEEE, Apr. 1998, pp. 615-638.

Hauser, J.R., et al., "Garp: A MIPS Processor with a Reconfigurable Coprocessor," University of California, Berkeley, IEEE, Apr. 1997, pp. 12-23.

Hauser, John Reid, (Dissertation) "Augmenting a Microprocessor with Reconfigurable Hardware," University of California, Berkeley, Fall 2000, 255 pages. (submitted in 3 PDFs, Parts 1-3).

Hauser, John R., "The Garp Architecture," University of California at Berkeley, Computer Science Division, Oct. 1997, pp. 1-55.

Hedge, S.J., "3D WASP Devices for On-line Signal and Data Processing," 1994, International Conference on Wafer Scale Integration, pp. 11-21.

(56) References Cited

OTHER PUBLICATIONS

Hendrich, N., et al., "Silicon Compilation and Rapid Prototyping of Microprogrammed VLSI-Circuits with MIMOLA and SOLO 1400," Microprocessing & Microprogramming (Sep. 1992) vol. 35(1-5), pp. 287-294.

Huang, Libo et al., "A New Architecture for Multiple-Precision Floating-Point Multiply-Add Fused Unit Design," School of Computer National University of Defense Technology, China, IEEE 2007, 8 pages.

Hwang, K., "Advanced Computer Architecture—Parallelism, Scalability, Programmability," 1993, McGraw-Hill, Inc., pp. 348-355.

Hwang, K., "Computer Architecture and Parallel Processing," Data Flow Computers and VLSI Computations, XP-002418655, 1985 McGraw-Hill, Chapter 10, pp. 732-807.

Hwang, L., et al., "Min-cut Replication in Partitioned Networks," IEEE Transactions on Computer-Aided Design of Integrated Circuits and Systems, [online] Bd. 14, Nr. 1, Jan. 1995, pp. 96-106, XP00053228 USA ISSN: 0278-0070 IEEE Xplore.

IBM Technical Disclosure Bulletin, IBM Corp., New York, XP000424878, Bd. 36, Nr. II, Nov. 1, 1993, pp. 335-336.

"IEEE Standard Test Access Port and Boundary-Scan Architecture," IEEE Std. 1149.1-1990, 1993, pp. 1-127.

IMEC, "ADRES multimedia processor & 3MF multimedia platform," Transferable IP, IMEC Technology Description, (Applicants believe the date to be Oct. 2005), 3 pages.

Intel, "Pentium Pro Family Developer's Manual, vol. 3: Operating System Writer's Guide," Intel Corporation, Dec. 1995, [submitted in 4 PDF files: Part I, Part II, Part III and Part IV], 458 pages.

Intel, Intel MXP5800/MXP5400 Digital Media Processors, Architecture Overview, Jun. 2004, Revision 2.4, pp. 1-24.

Inside DSP, "Ambric Discloses Massively Parallel Architecture," Aug. 23, 2006, http://www.insidedsp.com/Articles/tabid/64/articleType/ArticleView/articleId/155/Default.aspx, 2 pages.

Iseli, C., et al. "A C++ Compiler for FPGA Custom Execution Units Synthesis," IEEE, 1995, pp. 173-179.

Isshiki, Tsuyoshi, et al., "Bit-Serial Pipeline Synthesis for Multi-FPGA Systems with C++ Design Capture," 1996 IEEE, pp. 38-47.

Jacob, J., et al., "Memory Interfacing and Instruction Specification for Reconfigurable Processors," ACM Feb. 1999, pp. 145-154.

Jantsch, Axel et al., "A Case Study on Hardware/Software Partitioning," Royal Institute of Technology, Kista, Sweden, Apr. 10, 1994, IEEE, pp. 111-118.

Jantsch, Axel et al., "Hardware/Software Partitioning and Minimizing Memory Interface Traffic," Electronic System Design Laboratory, Royal Institute of Technology, ESDLab, Electrum 229, S-16440 Kista, Sweden (Apr. 1994), pp. 226-231.

Jo, Manhwee et al., "Implementation of Floating-Point Operations for 3D Graphics on a Coarse-Grained Reconfigurable Architecture," Design Automation Laboratory, School of EE/CS, Seoul National University, Korea, IEEE 2007, pp. 127-130.

John, L., et al., "A Dynamically Reconfigurable Interconnect for Array Processors," vol. 6, No. 1, Mar. 1998, IEEE, pp. 150-157.

Kanter, David, "NVIDIA's GT200: Inside a Parallel Processor," http://www.realworldtech.com/page.cfm?ArticleID-RWT090989195242&p=1, Sep. 8, 2008, 27 pages.

Kastrup, B., "Automatic Hardware Synthesis for a Hybrid Reconfigurable CPU Featuring Philips CPLDs," Proceedings of the PACT Workshop on Reconfigurable Computing, 1998, pp. 5-10.

Kaul, M., et al., "An automated temporal partitioning and loop fission approach of FPGA based reconfigurable synthesis of DSP applications," University of Cincinnati, Cincinnati, OH, ACM 1999, pp. 616-622.

Kean, T.A., "Configurable Logic: A Dynamically Programmable Cellular Architecture and its VLSI Implementation," University of Edinburgh (Dissertation) 1988, pp. 1-286. [in two PDFs, Pt.1 and Pt.2.].

Kean, T., et al., "A Fast Constant Coefficient Multiplier for the XC6200," Xilinx, Inc., Lecture Notes in Computer Science, vol. 1142, Proceedings of the $6^{th}$ International Workshop of Field-Programmable Logic, 1996, 7 pages.

Kim et al., "A Reconfigurable Multifunction Computing Cache Architecture," IEEE Transactions on Very Large Scale Integration (VLSI) Systems vol. 9, Issue 4, Aug. 2001 pp. 509-523.

Knittel, Gunter, "A PCI-compatible FPGA-Coprocessor for 2D/3D Image Processing," University of Turgingen, Germany, 1996 IEEE, pp. 136-145.

Koch, A., et al., "Practical Experiences with the SPARXIL Co-Processor," 1998, IEEE, pp. 394-398.

Koch, Andreas et al., "High-Level-Language Compilation for Reconfigurable Computers," Proceedings of European Workshop on Reconfigurable Communication-Centric SOCS (Jun. 2005) 8 pages.

Koren et al., "A data-driven VLSI array for arbitrary algorithms," IEEE Computer Society, Long Beach, CA vol. 21, No. 10, Oct. 1, 1988, pp. 30-34.

Kung, "Deadlock Avoidance for Systolic Communication," 1988 Conference Proceedings of the $15^{th}$ Annual International Symposium on Computer Architecture, May 30, 1998, pp. 252-260.

Lange, H. et al., "Memory access schemes for configurable processors," Field-Programmable Logic and Applications, International Workshop, FPL, Aug. 27, 2000, pp. 615-625, XP02283963.

Larsen, S., et al., "Increasing and Detecting Memory Address Congruence," Proceedings of the 2002 IEEE International Conference on Parallel Architectures and Compilation Techniques (PACT'02), pp. 1-12 (Sep. 2002).

Lee et al., "A new distribution network based on controlled switching elements and its applications," IEEE/ACT Trans. of Networking, vol. 3, No. 1, pp. 70-81, Feb. 1995.

Lee, Jong-eun, et al., "Reconfigurable ALU Array Architecture with Conditional Execution," International Soc. Design Conference (ISOOC) [online] Oct. 25, 2004, Seoul, Korea, 5 pages.

Lee, R. B., et al., "Multimedia extensions for general-purpose processors," *IEEE Workshop on Signal Processing Systems, SIPS 97—Design and Implementation* (1997), pp. 9-23.

Lee, Ming-Hau et al., "Design and Implementation of the MorphoSys Reconfigurable Computing Processors," The Journal of VLSI Signal Processing, Kluwer Academic Publishers, BO, vol. 24, No. 2-3, Mar. 2, 2000, pp. 1-29.

Ling, X., "WASMII: An MPLD with Data-Driven Control on a Virtual Hardware," Journal of Supercomputing, Kluwer Acdemic Publishers, Dordrecht, Netherlands, 1995, pp. 253-276.

Ling et al., "WASMII: A Multifunction Programmable Logic Device (MPLD) with Data Driven Control," The Transactions of the Institute of Electronics, Information and Communication Engineers, Apr. 25, 1994, vol. J77-D-1, Nr. 4, pp. 309-317.

Mano, M.M., "Digital Design," by Prentice Hall, Inc., Englewood Cliffs, New Jersey 07632, 1984, pp. 119-125, 154-161.

Margolus, N., "An FPGA architecture for DRAM-based systolic computations," Boston University Center for Computational Science and MIT Artificial Intelligence Laboratory, IEEE 1997, pp. 2-11.

Maxfield,C., "Logic that Mutates While-U-Wait," EDN (Bur. Ed) (USA), EDN (European Edition), Nov. 7, 1996, Cahners Publishing, USA, pp. 137-140, 142.

Mei, Bingfeng, "A Coarse-Grained Reconfigurable Architecture Template and Its Compilation Techniques," Katholeike Universiteit Leuven, PhD Thesis, Jan. 2005, IMEC vzw, Universitair Micro-Electronica Centrum, Belgium, pp. 1-195 (and Table of Contents).

Mei, Bingfeng et al., "Design and Optimization of Dynamically Reconfigurable Embedded Systems," IMEC vzw, 2003, Belgium, 7 pages, http://www.imec.be/reconfigurable/pdf/ICERSA_01_design.pdf.

Mei, Bingfeng et al., "Adres: An Architecture with Tightly Coupled VLIW Processor and Coarse-Grained Reconfigurable Matrix," Proc. *Field-Programmable Logic and Applications* (FPL 03), Springer, 2003, pp. 61-70.

Miller, M.J., et al., "High-Speed FIFOs Contend with Widely Differing Data Rates: Dual-port RAM Buffer, and Dual-pointer System Provide Rapid, High-density Data Storage and Reduce Overhead," Computer Design, Sep. 1, 1985, pp. 83-86.

Mirsky, E. DeHon, "MATRIX: A Reconfigurable Computing Architecture with Configurable Instruction Distribution and Deployable Resources," Proceedings of the IEEE Symposium on FPGAs for Custom Computing Machines, 1996, pp. 157-166.

(56) References Cited

OTHER PUBLICATIONS

Miyamori, T., et al., "REMARC: Reconfigurable Multimedia Array Coprocessor," Computer Systems Laboratory, Stanford University, IEICE Transactions on Information and Systems E Series D, 1999; (abstract): Proceedings of the 1998 ACM/SIGDA sixth international symposium on Field programmable gate arrays, p. 261, Feb. 22-25, 1998, Monterey, California, United States, pp. 1-12.
Moraes, F., et al., "A Physical Synthesis Design Flow Based on Virtual Components," XV Conference on Design of Circuits and Integrated Systems (Nov. 2000) 6 pages.
Muchnick, S., "Advanced Compiler Design and Implementation," (Morgan Kaufmann 1997), Table of Contents, 11 pages.
Murphy, C., "Virtual Hardware Using Dynamic Reconfigurable Field Programmable Gate Arrays," Engineering Development Centre, Liverpool John Moores University, UK, GERI Annual Research Symposium 2005, 8 pages.
Myers, G. "Advances in Computer Architecture," Wiley-Interscience Publication, 2nd ed., John Wiley & Sons, Inc., 1978, pp. 463-494.
Nageldinger, U., "Design-Space Exploration for Coarse Grained Reconfigurable Architectures," (Dissertation) Universitaet Kaiserslautern, 2000, Chapter 2, pp. 19-45.
Neumann, T., et al., "A Generic Library for Adaptive Computing Environments," Field Programmable Logic and Applications, $11^{th}$ International Conference, FPL 2001, Proceedings (Lecture Notes in Computer Science, vol. 2147) (2001) pp. 503-512.
Nilsson, et al., "The Scalable Tree Protocol—A Cache Coherence Approaches for Large-Scale Multiprocessors," IEEE, pp. 498-506, Dec. 1992.
Norman, R.S., "Hyperchip Business Summary, The Opportunity," Jan. 31, 2000, pp. 1-3.
Ohmsha, "Information Processing Handbook," edited by the Information Processing Society of Japan, pp. 376, Dec. 21, 1998.
Olukotun, K., "The Case for a Single-Chip Microprocessor," ACM Sigplan Notices, ACM, Association for Computing Machinery, New York, vol. 31, No. 9, Sep. 1996 pp. 2-11.
Ozawa, Motokazu et al., "A Cascade ALU Architecture for Asynchronous Super-Scalar Processors," IEICE Transactions on Electronics, Electronics Society, Tokyo, Japan, vol. E84-C, No. 2, Feb. 2001, pp. 229-237.
PACT Corporation, "The XPP Communication System," Technical Report 15 (2000), pp. 1-16.
Parhami, B., "Parallel Counters for Signed Binary Signals," Signals, Systems and Computers, 1989, Twenty-Third Asilomar Conference, vol. 1, pp. 513-516.
PCI Local Bus Specification, Production Version, Revision 2.1, Portland, OR, Jun. 1, 1995, pp. 1-281.
Piotrowski, A., "IEC-BUS, Die Funktionsweise des IEC-Bus unde seine Anwendung in Geräten und Systemen," 1987, Franzis-Verlag GmbH, München, pp. 20-25. [English Abstract Provided].
Pirsch, P. et al., "VLSI implementations of image and video multimedia processing systems," *IEEE Transactions on Circuits and Systems for Video Technology*, vol. 8, No. 7, Nov. 1998, pp. 878-891.
Price et al., "Debug of Reconfigurable Systems," Xilinx, Inc., San Jose, CA, Proceedings of SPIE, 2000, pp. 181-187.
Quenot, G.M., et al., "A Reconfigurable Compute Engine for Real-Time Vision Automata Prototyping," Laboratoire Systeme de Perception, DGA/Etablissement Technique Central de l'Armement, France, 1994 IEEE, pp. 91-100.
Razdan et al., A High-Performance Microarchitecture with Hardware-Programmable Functional Units, Micro-27, Proceedings of the $27^{th}$ Annual International Symposium on Microarchitecture, IEEE Computer Society and Association for Computing Machinery, Nov. 30-Dec. 2, 1994, pp. 172-180.
Ryo, A., "Auszug aus Handbuch der Informationsverarbeitung," ed. Information Processing Society of Japan, *Information Processing Handbook, New Edition*, Software Information Center, Ohmsha, Dec. 1998, 4 pages. [Translation provided].
Saleeba, Z.M.G., "A Self-Reconfiguring Computer System," Department of Computer Science, Monash University (Dissertation) 1998, pp. 1-306.
Saleeba, M. "A Self-Contained Dynamically Reconfigurable Processor Architecture," Sixteenth Australian Computer Science Conference, ASCS-16, QLD, Australia, Feb. 1993, pp. 59-70.
Salefski, B. et al., "Re-configurable computing in wireless," *Annual ACM IEEE Design Automation Conference: Proceedings of the $38^{th}$ conference on Design automation* (2001) pp. 178-183.
Schmidt, H. et al., "Behavioral synthesis for FGPA-based computing," Carnegie Mellon University, Pittsburgh, PA, 1994 IEEE, pp. 125-132.
Schmidt, U. et al., "Datawave: A Single-Chip Multiprocessor for Video Applications," *IEEE Micro*, vol. 11, No. 3, May/Jun. 1991, pp. 22-25, 88-94.
Schmit, et al., "Hidden Markov Modeling and Fuzzy Controllers in FPGAs, FPGAs for Custom Computing Machines," 1995; Proceedings, IEEE Symposium in Napa Valley, CA, Apr. 1995, pp. 214-221.
Schönfeld, M., et al., "The LISA Design Environment for the Synthesis of Array Processors Including Memories for the Data Transfer and Fault Tolerance by Reconfiguration and Coding Techniques," J. VLSI Signal Processing Systems for Signal, Image, and Video Technology, ( Oct. 1, 1995) vol. 11(1/2), pp. 51-74.
Shin, D., et al., "C-based Interactive RTL Design Methodology," Technical Report CECS-03-42 (Dec. 2003) pp. 1-16.
Shirazi, et al., "Quantitative analysis of floating point arithmetic on FPGA based custom computing machines," IEEE Symposium on FPGAs for Custom Computing Machines, *IEEE Computer Society Press*, Apr. 19-21, 1995, pp. 155-162.
Short, Kenneth L., *Microprocessors and Programmed Logic*, Prentice Hall, Inc., New Jersey 1981, p. 34.
Siemers, C., "Rechenfabrik Ansaetze Fuer Extrem Parallele Prozessoren, " Verlag Heinze Heise GmbH., Hannover, DE No. 15, Jul. 16, 2001, pp. 170-179.
Siemers et al., "The .>S<puter: A Novel Micoarchitecture Model for Execution inside Superscalar and VLIW Processors Using Reconfigurable Hardware," Australian Computer Science Communications, vol. 20, No. 4, Computer Architecture, Proceedings of the $3^{rd}$ Australian Computer Architecture Conference, Perth, John Morris, Ed., Feb. 2-3, 1998, pp. 169-178.
Simunic, et al., Source Code Optimization and Profiling of Energy Consumation in Embedded Systems, Proceedings of the $13^{th}$ International Symposium on System Synthesis, Sep. 2000, pp. 193-198.
Singh, H. et al., "MorphoSys: An Integrated Reconfigurable System for Data-Parallel Computation-Intensive Applications," University of California, Irvine, CA. and Federal University of Rio de Janeiro, Brazil, 2000, IEEE Transactions on Computers, pp. 1-35.
Skokan, Z.E., "Programmable logic machine (A programmable cell array)," IEEE Journal of Solid-State Circuits, vol. 18, Issue 5, Oct. 1983, pp. 572-578.
Sondervan, J., "Retiming and logic synthesis," Electronic Engineering (Jan. 1993) vol. 65(793), pp. 33, 35-36.
Soni, M., "VLSI Implementation of a Wormhole Run-time Reconfigurable Processor," Jun. 2001, (Masters Thesis)Virginia Polytechnic Institute and State University, 88 pages.
Sueyoshi, T, "Present Status and Problems of the Reconfigurable Computing Systems Toward the Computer Evolution," Department of Artificial Intelligence, Kyushi Institute of Technology, Fukuoka, Japan; Institute of Electronics, Information and Communication Engineers, vol. 96, No. 426, IEICE Technical Report (1996), pp. 111-119 [English Abstract Only].
Sundararajan et al., "Testing FPGA Devices Using JBits," Proc. MAPLD 2001, Maryland, USA, Katz (ed.), NASA, CA, 8 pages.
Sutton et al., "A Multiprocessor DSP System Using PADDI-2," U.C. Berkeley, 1998 ACM, pp. 62-65.
Tau, E., et al., "A First Generation DPGA Implementation," *FPD'95*, pp. 138-143.
Tenca, A.F., et al., "A Variable Long-Precision Arithmetic Unit Design for Reconfigurable Coprocessor Architectures," University of California, Los Angeles, 1998, pp. 216-225.
The XPP White Paper, Release 2.1, Pact—A Technical Perspective, Mar. 27, 2002, pp. 1-27.
TMS320C54X DSP: CPU and Peripherals, Texas Instruments, 1996, 25 pages.
TMS320C54x DSP: Mnemonic Instruction Set, Texas Instruments, 1996, 342 pages.

(56) References Cited

OTHER PUBLICATIONS

Tsutsui, A., et al., "Yards: FPGA/MPU Hybrid Architecture for Telecommunication Data Processing," NTT Optical Network Systems Laboratories, Japan, 1997 ACM, pp. 93-99.
Vasell et al., "The Function Processor: A Data-Driven Processor Array for Irregular Computations," Chalmers University of Technology, Sweden, 1992, pp. 1-21.
Venkatachalam et al., "A highly flexible, distributed multiprocessor architecture for network processing," Computer Networks, The International Journal of Computer and Telecommunications Networking, vol. 41, No. 5, Apr. 5, 2003, pp. 563-568.
Villasenor, et al., "Configurable Computing Solutions for Automatic Target Recognition," IEEE, 1996 pp. 70-79.
Villasenor, et al., "Configurable Computing," *Scientific American*, vol. 276, No. 6, Jun. 1997, pp. 66-71.
Villasenor, et al., "Express Letters Video Communications Using Rapidly Reconfigurable Hardware," IEEE Transactions on Circuits and Systems for Video Technology, IEEE, Inc., NY, Dec. 1995, pp. 565-567.
Wada, et al., "A Performance Evaluation of Tree-based Coherent Distributed Shared Memory," Proceedings of the Pacific RIM Conference on Communications, Comput and Signal Processing, Victoria, May 19-21, 1993, pp. 390-393.
Waingold, E., et al., "Baring it all to software: Raw machines," IEEE Computer, Sep. 1997, at 86-93.
Webster's Ninth New Collegiate Dictionary, Merriam-Webster, Inc., 1990, p. 332 (definition of "dedicated").
Weinhardt, M., "Compilation Methods for Structure-programmable Computers," dissertation, ISBN 3-89722-011-3, 1997. [Table of Contents and English Abstract Provided].
Weinhardt, Markus et al., "Pipeline Vectorization for Reconfigurable Systems," 1999, IEEE, pp. 52-62.
Weinhardt, Markus et al., "Pipeline Vectorization," IEEE Transactions on Computer-Aided Design of Integrated Circuits and Systems, vol. 20, No. 2, Feb. 2001, pp. 234-248.
Weinhardt, Markus et al., "Memory Access Optimization for Reconfigurable Systems," IEEE Proceedings Computers and Digital Techniques, 48(3) (May 2001) pp. 1-16.
Wittig, et al., "OneChip: An FPGA Processor with Reconfigurable Logic," IEEE, 1996, pp. 126-135.
Wolfe, M. et al., "High Performance Compilers for Parallel Computing," (Addison-Wesley 1996) Table of Contents, 11 pages.
Wu, et al., "A New Cache Directory Scheme," IEEE, pp. 466-472, Jun. 1996.
Xilinx, "Logic Cell Array Families: XC4000, XC4000A and XC4000H," 1994, product description, pp. 2-7, 2-9, 2-14, 2-15, 8-16, and 9-14.
Xilinx, "The Programmable Logic Data Book," 1994, Section 2, pp. 1-231, Section 8, pp. 1, 23-25, 29, 45-52, 169-172.
Xilinx, "Spartan and SpartanXL Families Field Programmable Gate Arrays," Jan. 1999, Xilinx, pp. 4-3 through 4-70.
Xilinx, "XC6200 Field Programmable Gate Arrays," Apr. 24, 1997, Xilinx product description, pp. 1-73.
Xilinx, "XC3000 Series Field Programmable Gate Arrays," Nov. 6, 1998, Xilinx product description, pp. 1-76.
Xilinx, "XC4000E and XC4000X Series Field Programmable Gate Arrays," May 14, 1999, Xilinx product description, pp. 1-68.
Xilinx, "Virtex-E 1.8 V Extended Memory Field Programmable Gate Arrays," (v1.5) Jul. 17, 2002, Xilinx Production Product Specification, pp. 1-118.
Xilinx, "Virtex-E 1.8 V Extended Memory Field Programmable Gate Arrays," (v2.2) Sep. 10, 2002, Xilinx Production Product Specification, pp. 1-52.
Xilinx, "Virtex-II and Virtex-II Pro X FPGA User Guide," Mar. 28, 2007, Xilinx user guide, pp. 1-559.
Xilinx, "Virtex-II and Virtex-II Pro X FPGA Platform FPGAs: Complete Data Sheet," (v4.6) Mar. 5, 2007, pp. 1-302.
Xilinx, "Virtex-II Platform FPGAs: Complete Data Sheet," (v3.5) Nov. 5, 2007, pp. 1-226.
Xilinx, White Paper 370: (Virtex-6 and Spartan-6 FPGA Families) "Reducing Switching Power with Intelligent Clock Gating," Frederic Rivoallon, May 3, 2010, pp. 1-5.
Xilinx, White Paper 298: (Spartan-6 and Virtex-6 Devices) "Power Consumption at 40 and 50 nm," Matt Klein, Apr. 13, 2009, pp. 1-21.
Xu, H. et al., "Parallel QR Factorization on a Block Data Flow Architecture," Conference Proceeding Article, Mar. 1, 1992, pp. 332-336.
Ye, Z.A. et al., "A C-Compiler for a Processor With a Reconfigurable Functional Unit," FPGA 2000 ACM/SIGNA International Symposium on Field Programmable Gate Arrays, Monterey, CA Feb. 9-11, 2000, pp. 95-100.
Yeung, A. et al., "A data-driven architecture for rapid prototyping of high throughput DSP algorithms," Dept. of Electrical Engineering and Computer Sciences, Univ. of California, Berkeley, USA, *Proceedings VLSI Signal Processing Workshop, IEEE Press*, pp. 225-234, Napa, Oct. 1992.
Yeung, A. et al., "A reconfigurable data-driven multiprocessor architecture for rapid prototyping of high throughput DSP algorithms," Dept. of Electrical Engineering and Computer Sciences, Univ. of California, Berkeley, USA, pp. 169-178, *IEEE* 1993.
Zhang, et al., "Architectural Evaluation of Flexible Digital Signal Processing for Wireless Receivers, Signals, Systems and Computers," 2000; Conference Record of the Thirty-Fourth Asilomar Conference, Bd. 1, Oct. 29, 2000, pp. 78-83.
Zhang, et al., "A 1-V Heterogeneous Reconfigurable DSP IC for Wireless Baseband Digital Signal Processing," IEEE Journal of Solid-State Circuits, vol. 35, No. 11, Nov. 2000, pp. 1697-1704.
Zhang et al., "Abstract Low-Power Heterogeneous Reconfigurable Digital Signal Processors with Energy-Efficient Interconnect Network," U.C. Berkeley (2004), pp. 1-120.
Zima, H. et al., "Supercompilers for parallel and vector computers," (Addison-Wesley 1991) Table of Contents, 5 pages.
Xilinx, Inc.'s and Avnet, Inc.'s Disclosure Pursuant to P.R. 4-2; *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, 4 pages.
Xilinx, Inc.'s and Avnet, Inc.'s Disclosure Pursuant to P.R. 4-1; *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, 9 pages.
Defendant's Claim Construction Chart for P.R. 4-2 Constructions and Extrinsic Evidence for Terms Proposed by Defendants, *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, pp. 1-19.
PACT's P.R. 4-1 List of Claim Terms for Construction, *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, pp. 1-7.
PACT's P.R. 4-2 Preliminary Claim Constructions and Extrinsic Evidence, *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, pp. 1-16, and Exhibits re Extrinsic Evidence Parts in seven (7) separate additional PDF files (Parts 1-7).
Agarwal, A., et al., "APRIL: A Processor Architecture for Multiprocessing," Laboratory for Computer Science, MIT, Cambridge, MA, IEEE 1990, pp. 104-114.
Almasi and Gottlieb, *Highly Parallel Computing*, The Benjamin/Cummings Publishing Company, Inc., Redwood City, CA, 1989, 3 pages (Fig. 4.1).
Advanced RISC Machines Ltd (ARM), "AMBA—Advanced Microcontroller Bus Architecture Specification," (Document No. ARM IHI 0001C), Sep. 1995, 72 pages.
Alfke, Peter; New, Bernie, *Xilinx Application Note*, "Additional XC3000 Data," XAPP 024.000, 1994, pp. 8-11 through 8-20.
Alfke, Peter; New, Bernie, *Xilinx Application Note*, "Adders, Subtracters and Accumulators in XC3000," XAPP 022.000, 1994, pp. 8-98 through 8-104.
Alfke, Peter, *Xilinx Application Note*, "Megabit FIFO in Two Chips: One LCA Device and One DRAM," XAPP 030.000, 1994, pp. 8-148 through 8-150.

(56) References Cited

OTHER PUBLICATIONS

Alfke, Peter, *Xilinx Application Note*, "Dynamic Reconfiguration," XAPP 093, Nov. 10, 1997, pp. 13-45 through 13-46.
Alfke, Peter; New, Bernie, *Xilinx Application Note*, "Implementing State Machines in LCA Devices," XAPP 027.001, 1994, pp. 8-169 through 8-172.
Algotronix, Ltd., CAL64K Preliminary Data Sheet, Apr. 1989, pp. 1-24.
Algotronix, Ltd., CAL4096 Datasheet, 1992, pp. 1-53.
Algotronix, Ltd., CHS2x4 User Manual, "CHA2x4 Custom Computer," 1991, pp. 1-38.
Allaire, Bill; Fischer, Bud, *Xilinx Application Note*, "Block Adaptive Filter," XAPP 055, Aug. 15, 1996 (Version 1.0), pp. 1-10.
Altera Application Note (73), "Implementing FIR Filters in FLEX Devices," Altera Corporation, Feb. 1998, ver. 1.01, pp. 1-23.
Athanas, P. (Thesis), "An adaptive machine architecture and compiler for dynamic processor reconfiguration," Brown University 1992, pp. 1-157.
Berkeley Design Technology, Inc., *Buyer's Guide to DSP Processors*, 1995, Fremont, CA., pp. 673-698.
Bittner, R. et al., "Colt: An Experiment in Wormhole Run-Time Reconfiguration," Bradley Department of Electrical and Computer Engineering, Blacksburg, VA, SPIE—International Society for Optical Engineering, vol. 2914/187, Nov. 1996, Boston, MA, pp. 187-194.
Camilleri, Nick; Lockhard, Chris, *Xilinx Application Note*, "Improving XC4000 Design Performance," XAPP 043.000, 1994, pp. 8-21 through 8-35.
Cartier, Lois, *Xilinx Application Note*, "System Design with New XC4000EX I/O Features," Feb. 21, 1996, pp. 1-8.
Chen, D., (Thesis) "Programmable arithmetic devices for high speed digital signal processing," U. California Berkeley 1992, pp. 1-175.
Churcher, S., et al., "The XC6200 FastMap TM Processor Interface," Xilinx, Inc., Aug. 1995, pp. 1-8.
Cowie, Beth, *Xilinx Application Note*, "High Performance, Low Area, Interpolator Design for the XC6200," XAPP 081, May 7, 1997 (Version 1.0), pp. 1-10.
Duncan, Ann, *Xilinx Application Note*, "A32x16 Reconfigurable Correlator for the XC6200," XAPP 084, Jul. 25, 1997 (Version 1.0), pp. 1-14.
Ebeling, C., et al., "RaPiD—Reconfigurable Pipelined Datapath," Dept. of Computer Science and Engineering, U. Washington, 1996, pp. 126-135.
Epstein, D., "IBM Extends DSP Performance with Mfast—Powerful Chip Uses Mesh Architecture to Accelerate Graphics, Video," 1995 MicroDesign Resources, vol. 9, No. 16, Dec. 4, 1995, pp. 231-236.
Fawcett, B., "New SRAM-Based FPGA Architectures Address New Applications," Xilinx, Inc. San Jose, CA, Nov. 1995, pp. 231-236.
Goslin, G; Newgard, B, *Xilinx Application Note*, "16-Tap, 8-Bit FIR Filter Applications Guide," Nov. 21, 1994, pp. 1-5.
Iwanczuk, Roman, *Xilinx Application Note*, "Using the XC4000 RAM Capability," XAPP 031.000, 1994, pp. 8-127 through 8-138.
Knapp, Steven, "Using Programmable Logic to Accelerate DSP Functions," Xilinx, Inc., 1995, pp. 1-8.
New, Bernie, *Xilinx Application Note*, "Accelerating Loadable Counters in SC4000," XAPP 023.001, 1994, pp. 8-82 through 8-85.
New, Bernie, *Xilinx Application Note*, "Boundary Scan Emulator for XC3000," XAPP 007.001, 1994, pp. 8-53 through 8-59.
New, Bernie, *Xilinx Application Note*, "Ultra-Fast Synchronous Counters," XAPP 014.001, 1994, pp. 8-78 through 8-81.
New, Bernie, *Xilinx Application Note*, "Using the Dedicated Carry Logic in XC4000," XAPP 013.001, 1994, pp. 8-105 through 8-115.
New, Bernie, *Xilinx Application Note*, "Complex Digital Waveform Generator," XAPP 008.002, 1994, pp. 8-163 through 8-164.
New, Bernie, *Xilinx Application Note*, "Bus-Structured Serial Input-Output Device," XAPP 010.001, 1994, pp. 8-181 through 8-182.
Ridgeway, David, *Xilinx Application Note*, "Designing Complex 2-Dimensional Convolution Filters," XAPP 037.000, 1994, pp. 8-175 through 8-177.

Rowson, J., et al., "Second-generation compilers optimize semicustom circuits," Electronic Design, Feb. 19, 1987, pp. 92-96.
Schewel, J., "A Hardware/Software Co-Design System using Configurable Computing Technology," Virtual Computer Corporation, Reseda, CA, IEEE 1998, pp. 620-625.
Segers, Dennis, Xilinx Memorandum, "MIKE—Product Description and MRD," Jun. 8, 1994, pp. I-29.
Texas Instruments, "TMS320C8x System-Level Synopsis," Sep. 1995, 75 pages.
Texas Instruments, "TMS320C80 Digital Signal Processor," Data Sheet, Digital Signal Processing Solutions 1997, 171 pages.
Texas Instruments, "TMS320C80 (MVP) Parallel Processor," User's Guide, Digital Signal Processing Products 1995, 73 pages.
Trainor, D.W., et al., "Implementation of the 2D DCT Using a Xilinx XC6264 FPGA," 1997, IEEE Workshop of Signal Processing Systems SiPS 97, pp. 541-550.
Trimberger, S, (Ed.) et al., "Field-Programmable Gate Array Technology," 1994, Kluwer Academic Press, pp. 1-258 (and the Title Page, Table of Contents, and Preface) [274 pages total].
Trimberger, S., "A Reprogrammable Gate Array and Applications," IEEE 1993, Proceedings of the IEEE, vol. 81, No. 7, Jul. 1993, pp. 1030-1041.
Trimberger, S., et al., "A Time-Multiplexed FPGA," Xilinx, Inc., 1997 IEEE, pp. 22-28.
Ujvari, Dan, *Xilinx Application Note*, "Digital Mixer in an XC7272," XAPP 035.002, 1994, p. 1.
Veendrick, H., et al., "A 1.5 GIPS video signal processor (VSP)," Philips Research Laboratories, The Netherlands, IEEE 1994 Custom Integrated Circuits Conference, pp. 95-98.
Wilkie, Bill, *Xilinx Application Note*, "Interfacing XC6200 to Microprocessors (TMS320C50 Example)," XAPP 064, Oct. 9, 1996 (Version 1.1), pp. 1-9.
Wilkie, Bill, *Xilinx Application Note*, "Interfacing XC6200 to Microprocessors (MC68020 Example)," XAPP 063, Oct. 9, 1996 (Version 1.1), pp. 1-8.
Xcell, Issue 18, Third Quarter 1995, "Introducing three new FPGA Families!"; "Introducing the XC6200 FPGA Architecture: The First FPGA Architecture Optimized for Coprocessing in Embedded System Applications," 40 pages.
*Xilinx Application Note*, Advanced Product Specification, "XC6200 Field Programmable Gate Arrays," Jun. 1, 1996 (Version 1.0), pp. 4-253-4-286.
*Xilinx Application Note*, "A Fast Constant Coefficient Multiplier for the XC6200," XAPP 082, Aug. 24, 1997 (Version 1.0), pp. 1-5.
Xilinx Technical Data, "XC5200 Logic Cell Array Family," Preliminary (v1.0), Apr. 1995, pp. 1-43.
Xilinx Data Book, "The Programmable Logic Data Book," 1996, 909 pages.
Xilinx, Series 6000 User's Guide, Jun. 26, 1997, 223 pages.
Yeung, K., (Thesis) "A Data-Driven Multiprocessor Architecture for High Throughput Digital Signal Processing," Electronics Research Laboratory, U. California Berkeley, Jul. 10, 1995, pp. 1-153.
Yeung, L., et al., "A 2.4GOPS Data-Driven Reconfigurable Multiprocessor IC for DSP," Dept. of EECS, U. California Berkeley, 1995 IEEE International Solid State Circuits Conference, pp. 108-110.
Zilog Preliminary Product Specification, "Z86C95 CMOS Z8 Digital Signal Processor," 1992, pp. 1-82.
Zilog Preliminary Product Specification, "Z89120 Z89920 (ROM-less) 16-Bit Mixed Signal Processor," 1992, pp. 1-82.
Defendants' Invalidity Contentions in *PACT XPP Technologies, AG v. Xilinx, Inc., et al.*, (E.D. Texas Dec. 28, 2007) (No. 2:07cv563)., including Exhibits A through K in separate PDF files.
Bondalapati et al., "Reconfigurable Meshes: Theory and Practice," Dept. of Electrical Engineering-Systems, Univ. of Southern California, Apr. 1997, Reconfigurable Architectures Workshop, International Parallel Processing Symposium, 15 pages.
Cherbaka, Mark F., "Verification and Configuration of a Run-time Reconfigurable Custom Computing Integrated Circuit for DSP Applications," Thesis: Virginia Polytechnic Institute and State University, Jul. 8, 1996, 106 pages.

(56) References Cited

OTHER PUBLICATIONS

Cong et al., "Structural Gate Decomposition for Depth-Optimal Technology Mapping in LUT-Based FPGA Designs," Univ. of California, ACM Transactions on Design Automation of Electronic Systems, vol. 5, No. 2, Apr. 2000, pp. 193-225.
FOLDOC, The Free On-Line Dictionary of Computing, "handshaking," online Jan. 13, 1995, retrieved from Internet Jan. 23, 2011 at http://foldoc.org/handshake.
Li et al., "Hardware-Software Co-Design of Embedded Reconfigurable Architectures," Los Angeles, CA, 2000, ACM, pp. 507-512.
Marshall et al., "A Reconfigurable Arithmetic Array for Multimedia Applications," FPGA '99 Proceedings of the 1999 ACM/SIGDA Seventh International Symposium on Field Programmable Gate Arrays, 10 pages.
Melvin, Stephen et al., "Hardware Support for Large Atomic Units in Dynamically Scheduled Machines," Computer Science Division, University of California, Berkeley, IEEE (1988), pp. 60-63.
Pistorius et al., "Generation of Very Large Circuits to Benchmark the Partitioning of FPGAs," Monterey, CA, 1999, ACM, pp. 67-73.
Roterberg, Eric., et al., "Trace Cache: a Low Latency Approach to High Bandwidth Instruction Fetching," Proceedings of the $29^{th}$ Annual International Symposium on Michoarchitecture, Paris, France, IEEE (1996), 12 pages.
Translation of DE 101 39 170 by examiner using Google Translate, 10 pages.
Altera, "Implementing High-Speed Search Applications with Altera CAM," Jul. 2001, Ver. 2.1, Application Note 119, 50 pages.
Bolsens, Ivo (CTO Xilinx), "FPGA, a history of interconnect," Xilinx slide presentation, posted on the internet Oct. 30, 2008 at http://www.docstoc.com/docs/2198008/FPGA-a-history-of-interconnect, 32 pages.
Microsoft Press Computer Dictionary, Third Edition, Redmond, WA, 1997, 3 pages.
Microsoft Press Computer Dictionary, Second Edition, Redmond, WA, 1994, 3 pages.
A Dictionary of Computing, Fourth Edition, Oxford University Press, 1997, 4 pages.
Communications Standard Dictionary, Third Edition, Martin Weik (Ed.), Chapman & Hall, 1996, 3 pages.
Dictionary of Communications Technology, Terms Definitions and Abbreviations, Second Edition, Gilbert Held (Ed.), John Wiley & Sons, England, 1995, 5 pages.
The Random House College Dictionary, Revised Edition, Random House, Inc., 1984, 14 pages.
The Random House College Dictionary, Revised Edition, Random House, Inc., 1984, 7 pages.
Random House Webster's College Dictionary with CD-ROM, Random House, 2001, 7 pages.
Random House Webster's College Dictionary with CD-ROM, Random House, 2001, 4 pages.
Random House Personal Computer Dictionary, Second Edition, Philip E. Margolis (Ed.), Random House, New York, 1996, 5 pages.
The IEEE Standard Dictionary of Electrical and Electronics Terms, Sixth Edition, 1996, 36 pages.
The IEEE Standard Dictionary of Electrical and Electronics Terms, Sixth Edition, 1996, 8 pages.
McGraw-Hill Electronics Dictionary, Sixth Edition, Neil Sclater et al. (Ed.), McGraw-Hill, 1997, 3 pages.
Modern Dictionary of Electronics, Sixth Edition, Rudolf Graf (Ed.), Newnes (Butterwoth-Heinemann), 1997, 5 pages.
The American Heritage Dictionary, Fourth Edition, Dell (Houghton-Mifflin), 2001, 5 pages.
The American Heritage Dictionary, Second College Edition, Houghton Mifflin, 1982, 23 pages.
The American Heritage Dictionary, Second College Edition, Houghton Mifflin, 1982, 8 pages.
The American Heritage Dictionary, Third Edition, Dell Publishing (Bantam Doubleday Dell Publishing Group, Inc.), 1994, 4 pages.
The American Heritage Dictionary, Fourth Edition, Dell/Houghton Mifflin 2001, 5 pages.
Webster's New Collegiate Dictionary, Merriam Co., 1981, 5 pages.
Webster's New Collegiate Dictionary, Merriam Co., 1981, 4 pages.
The Oxford American Dictionary and Language Guide, Oxford University Press, 1999, 5 pages.
The Oxford Duden German Dictionary, Edited by the Dudenredaktion and the German Section of the Oxford University Press, W. Scholze-Stubenrecht et al. (Eds), Clarendon Press, Oxford, 1990, 7 pages.
Oxford Dictionary of Computing, Oxford University Press, 2008, 4 pages.
Modern Dictionary of Electronics, Sixth Edition Revised and Updated, Rudolf F. Graf (Ed.), Butterworth-Heinemann, 1997, 7 pages.
Modern Dictionary of Electronics, Sixth Edition Revised and Updated, Rudolf F. Graf (Ed.), Butterworth-Heinemann, 1997, 5 pages.
Garner's Modern American Usage, Bryan A. Garner (Ed.), Oxford University Press, 2003, 3 pages.
The New Fowler's Modern English Usage, R.W. Burchfield (Ed.), Oxford University Press, 2000, 3 pages.
Wikipedia, the free encyclopedia, "Granularity", at http://en.wikipedia.org/wiki/Granularity, Jun. 18, 2010, 4 pages.
Wordsmyth, The Premier Educational Dictionary—Thesaurus, at http://www.wordsmyth.net, "communication", Jun. 18, 2010, 1 page.
Yahoo! Education, "affect", at http://education.yahoo.com/reference/dictionary/entry/affect, Jun. 18, 2010, 2 pages.
mPulse Living Language, "high-level", at http://www.macmillandictionary.com/dictionary/american/high-level, Jun. 18, 2010, 1 page.
MSN Encarta, "regroup", at http://encarta.msn.com/encnet/features/dictionary/DictionaryResults.aspx?lextype=3&search=regroup, Jun. 17, 2010, 2 pages.
MSN Encarta, "synchronize", at http://encarta.msn.com/encnet/features/dictionary/DictionaryResults.aspx?lextype=3&search=synchronize, Jun. 17, 2010, 2 pages.
MSN Encarta, "pattern", at http://encarta.msn.com/encnet/features/dictionary/DictionaryResults.aspx?lextype=3&search=pattern, Jun. 17, 2010, 2 pages.
MSN Encarta, "dimension", at http://encarta.msn.com/encnet/features/dictionary/DictionaryResults.aspx?lextype=3&search=dimension, Jun. 17, 2010, 2 pages.
MSN Encarta, "communication", at http://encarta.msn.com/encnet/features/dictionary/DictionaryResults.aspx?lextype=3&search=communication, Jun. 17, 2010, 2 pages.
MSN Encarta, "arrangement", at http://encarta.msn.com/encnet/features/dictionary/DictionaryResults.aspx?lextype=3&search=arrangement, Jun. 17, 2010, 2 pages.
MSN Encarta, "vector", at http://encarta.msn.com/encnet/features/dictionary/DictionaryResults.aspx?lextype=3&search=vector, Jul. 30, 2010, 2 pages.
Dictionary.com, "address", at http://dictionary.reference.com/browse/address, Jun. 18, 2010, 4 pages.
P.R. 4-3 Joint Claim Constructions Statement, *PACT XPP Technologies, AG v. Xilinx, Inc. and Avnet, Inc et al.,* E.D. Texas, 2:07-cv-00563-CE, Jul. 19, 2010, pp. 1-50.
Order Granting Joint Motion for Leave to File an Amended Joint Claim Construction and Prehearing Statement and Joint Motion to File an Amended Joint Claim Construction and Prehearing Statement Pursuant to Local Patent Rule 4-3, and Exhibit A: P.R. 4-3 Amended Joint Claim Constructions Statement, *PACT XPP Technologies, AG v. Xilinx, Inc. and Avnet, Inc. et al.,* E.D. Texas, 2:07-cv-00563-CE, Aug. 2, 2010, 72 pages.
P.R. 4-3 Amended Joint Claim Constructions Statement, *PACT XPP Technologies, AG v. Xilinx, Inc. and Avnet, Inc. et al.,* E.D. Texas, 2:07-cv-00563-CE, Aug. 3, 2010, pp. 1-65.
Exhibit A—P.R. 4-3 Amended Joint Claim Constructions Statement, *PACT XPP Technologies, AG v. Xilinx, Inc. and Avnet, Inc. et al.,* E.D. Texas, 2:07-cv-00563-CE, Aug. 2, 2010, pp. 1-66.

(56) References Cited

OTHER PUBLICATIONS

PACT's Opening Claim Construction Brief, *PACT XPP Technologies, AG v. Xilinx, Inc. and Avnet, Inc.*, E.D. Texas, 2:07-cv-00563-CE, Nov. 1, 2010, pp. 1-55.
Declaration of Harry L. (Nick) Tredennick in Support of Pact's Claim Constructions, *PACT XPP Technologies, AG v. Xilinx, Inc. and Avnet, Inc. et al.*, E.D. Texas, 2:07-cv-00563-CE, Nov. 1, 2010, pp. 1-87.
Transcript of Harry (Nick) L. Tredennick III, Ph.D., Oct. 11, 2010, vol. 1, Exhibit 16 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-3.
Agreed and Disputed Terms, Exhibit 17 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-16.
Oral Videotaped Deposition—Joseph McAlexander dated Oct. 12, 2010, vol. 1, Exhibit 18 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-17.
Expert Report of Joe McAlexander Re Claim Construction dated Sep. 27, 2010, Exhibit 19 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-112.
Documents from File History of U.S. Appl. No. 09/290,342, filed Apr. 12, 1999, Exhibit 20 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-37.
Amendment from File History of U.S. Appl. No. 10/156,397, filed May 28, 2002, Exhibit 25 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-12.
Documents from File History U.S. Appl. No. 09/329,132, filed Jun. 9, 1999, Exhibit 27 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-36.
Amendment from File History of U.S. Appl. No. 10/791,501 (filed Mar. 1, 2004), Exhibit 39 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-9.
Amendment from File History of U.S. Appl. No. 10/265,846, filed Oct. 7, 2002, Exhibit 40 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-12.
Defendants Xilinx, Inc. and Avnet, Inc.'s Responsive Claim Construction Brief; *PACT XPP Technologies, AG v. Xilinx, Inc. and Avnet, Inc. et al.*, E.D. Texas, 2:07-cv-00563-CE, Dec. 6, 2010, pp. 1-55.
Declaration of Aaron Taggart in Support of Defendants Xilinx, Inc. and Avnet, Inc.'s Responsive Claim Construction Brief, Defendants Xilinx, Inc. and Avnet, Inc.'s Responsive Claim Construction Brief (Exhibit A), *PACT XPP Technologies, AG v. Xilinx, Inc. and Avnet, Inc. et al.*, E.D. Texas, 2:07-cv-00563-CE, Dec. 6, 2010, pp. 1-5.
Oral Videotaped Deposition Joseph McAlexander (Oct. 12, 2010), Exhibit 1 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-9.
Expert Report of Joe McAlexander re Claim Construction, Exhibit 2 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-137.
Various Documents from File History of U.S. Appl. No. 09/290,342, filed Apr. 12, 1999, Exhibit 6 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-181.
Transcript of Harry (Nick) L. Tredennick III, Ph.D., Oct. 11, 2010, vol. 1, Exhibit 7 of Defendants Xilinx, Inc. and Avnet, Inc.'s Responsive Claim Construction Brief; *PACT XPP Technologies, AG v. Xilinx, Inc. and Avnet, Inc. et al.*, E.D. Texas, 2:07-cv-00563-CE, Dec. 6, 2010, pp. 1-28.
Amendment, Response from File History of U.S. Appl. No. 10/156,397, filed May 28, 2002, Exhibit 15 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-137.
Application from File History of U.S. Appl. No. 08/544,435, filed Nov. 17, 1995, Exhibit 20 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-102.
Documents from File History of U.S. Appl. No. 09/329,132, filed Jun. 9, 1999, Exhibit 24 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-13.
Documents from File History of U.S. Appl. No. 10/791,501, filed Mar. 1, 2004, Exhibit 25 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-14.
Amendment from File History of U.S. Appl. No. 11/246,617, filed Oct. 7, 2005, Exhibit 26 of Defendants Xilinx, Inc. and Avnet, Inc.'s Responsive Claim Construction Brief; *PACT XPP Technologies, AG v. Xilinx, Inc. and Avnet, Inc. et al.*, E.D. Texas, 2:07-cv-00563-CE, Dec. 6, 2010, pp. 1-9.
Documents from File History of U.S. Appl. No. 08/947,254, filed Oct. 8, 1997, Exhibit 27 of Defendants Xilinx, Inc. and Avnet, Inc.'s Responsive Claim Construction Brief; *PACT XPP Technologies, AG v. Xilinx, Inc. and Avnet, Inc. et al.*, E.D. Texas, 2:07-cv-00563-CE, Dec. 6, 2010, pp. 1-38.
Documents from File History of U.S. Appl. No. 08/947,254, filed Oct. 8, 1997, specifically, German priority application specification [English translation provided], Exhibit 33 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, 54 pages [including English translation].
Documents from File History of U.S. Appl. No. 09/335,974, filed Jun. 18, 1999, Exhibit 28 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-32.
Documents from File History of U.S. Patent Reexamination Control No. 90/010,450 (filed Mar. 27, 2009), Exhibit 30 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-71.
Documents from File History of U.S. Appl. No. 10/265,846, filed Oct. 7, 2002, Exhibit 32 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-23.
PACT's Claim Construction Reply Brief, *PACT XPP Technologies, AG v. Xilinx, Inc. and Avnet, Inc. et al.*, E.D. Texas, 2:07-cv-00563-CE, Jan. 7, 2011, pp. 1-20.
Defendants Xilinx, Inc. and Avnet, Inc.'s Claim Construction Surreply Brief, *PACT XPP Technologies, AG v. Xilinx, Inc. and Avnet, Inc. et al.*, E.D. Texas, 2:07-cv-00563-CE, Jan. 18, 2011, 142 pages.
Markman Hearing Minutes and Attorney Sign-In Sheet, *PACT XPP Technologies, AG v. Xilinx, Inc. and Avnet, Inc. et al.*, E.D. Texas, 2:07-cv-00563-CE, Feb. 22, 2011, 3 pages; and court transcript, 245 pages.
Memorandum Opinion and Order, *PACT XPP Technologies, AG v. Xilinx, Inc. and Avnet, Inc. et al.*, E.D. Texas, 2:07-cv-00563-CE, Jun. 17, 2011, pp. 1-71.
Atmel Corporation, Atmel 5-K-50K Gates Coprocessor FPGA and FreeRAM, (www.atmel.com), Apr. 2002, pp. 1-68.

(56) References Cited

OTHER PUBLICATIONS

Glaskowsky, Peter N., "PACT Debuts Extreme Processor; Reconfigurable ALU Array Is Very Powerful—and Very Complex" Microprocessor, The Insider's Guide to Microprocessor Hardware, MicroDesign Resources—Microprocessor Report, Oct. 9, 2000 (www.MPRonline.com), 6 pages.

Glaskowsky, Peter N., "Analysis' Choice Nominees Named; Our Picks for 2002's Most Important Products and Technologies" Microprocessor, The Insider's Guide to Microprocessor Hardware, MicroDesign Resources—Microprocessor Report, Dec. 9, 2002 (www.MPRonline.com), 4 pages.

Lattice Semiconductor Corporation, ispLSI 2000E, 2000VE and 2000 VL Family Architectural Description, Oct. 2001, pp. 1-88.

Olukotun, K. et al., "Rationale, Design and Performance of the Hydra Multiprocessor," Computer Systems Laboratory, Stanford University, CA, Nov. 1994, pp. 1-19.

PACT Corporate Backgrounder, PACT company release, Oct. 2008, 4 pages.

Page, Ian., "Reconfigurable processor architectures," Oxford University Computing Laboratory, Oxford UK, Elsevier Science B.V., Microprocessors an Microsystems 20 (1996) pp. 185-196.

Singh, Hartej et al., "Morpho-Sys: A Reconfigurable Architecture for Multimedia Applications," Univ. of California, Irvine, CA and Federal University of Rio de Janeiro, Brazil, at http://www.eng.uci.edu/morphosys/docs/sbcci98.html, 10 pages.

Theodoridis, G. et al., "Chapter 2—A Survey of Coarse-Grain Reconfigurable Architectures and Cad Tools, Basic Definitions, Critical Design Issues and Existing Coarse-grain Reconfigurable Systems," from S. Vassiliadis, and D. Soudris (eds.) *Fine- and Coarse-Grained Reconfigurable Computing*, Springer 2007, pp. 89-149.

Weinhardt, Markus et al., "Using Function Folding to Improve Silicon Efficiency of Reconfigurable Arithmetic Arrays," PACT XPP Technologies AG, Munich, Germany, IEEE 2004, pp. 239-245.

Xilinx, XC6200 Field Programmable Gate Arrays, Advance Product Specification, Jun. 1, 1996 (Version 1.0), pp. 4-255 through 4-286.

Xilinx, Virtex-II Platform FPGA User Guide, UG002 (V2.1) Mar. 28, 2007, pp. 1-502 [Parts 1-3].

Xilinx, XC4000E and SC4000X Serial Field Programmable Gate Arrays, Product Specification (Version 1.6), May 14, 1999, pp. 1-107.

Ramanathan et al., "Reconfigurable Filter Coprocessor Architecture for DSP Applications," Journal of VLSI Signal Processing, 2000, vol. 26, pp. 333-359.

Shanley, Tom, *Pentium Pro and Pentium II System Architecture*, MindShare, Inc., Addition Wesley, 1998, Second Edition, pp. 11-17; Chapter 7; Chapter 10; pp. 209-211, and p. 394.

Shoup, Richard, "Programmable Cellular Logic Arrays," Dissertation, Computer Science Department, Carnegie-Mellon University, Mar. 1970, 193 pages.

Zucker, Daniel F., "A Comparison of Hardware Prefetching Techniques for Multimedia Benchmarks," Technical Report: CSL-TR-95-683, Dec. 1995, 26 pages.

Chan, Pak K., "A Field-Programmable Prototyping Board: XC4000 BORG User's Guide", University of California, Santa Cruz (Apr. 1994).

Knittel, Guntar, "A PCI-Compatible FPGA-Coprocessor for 2D/3D Image Processing", IEEE 1996.

Schue, Rick, "A Simple DRAM Controller for 25/16 MHz i960® CA/CF Microprocessors", Intel Corporation, Application Note AP•704 (Feb. 20, 1995).

Alfke, Peter and New, Bernie, "Additional XC3000 Data", Xilinx, Inc., Xilinx Application Note, XAPP024.000 (1994).

Altera Corporation, "Altera 1996 Data Book", Altera Corporation (Jun. 1996).

Altera Corporation, "Altera Applications Handbook", Altera Corporation (Apr. 1992).

Electronic Engineering, "Altera puts memory into its FLEX PLDs", Electronic Engineering Times, Issue 840, Mar. 20, (1995).

Margolus, Norman, "An FPGA architecture for DRAM-based systolic computations", The 5th Annual IEEE Symposium on Field-Programmable Custom Computing Machines (Apr. 16, 1997).

Krishnamohan, K., "Applying Rambus Technology to Desktop Computer Main Memory Subsystems, Version 1.0", Rambus Inc. (Mar. 1992).

New, Bernie, "Boundary-Scan Emulator for XC3000", Xilinx, Inc., Xilinx Application Note, XAPP007.001 (1994).

New, Bernie, "Bus-Structured Serial Input/Output Device", Xilinx Application Note, XAPP010.001 (1994).

Algotronix, Ltd., "CHS2x4 User Manual", Algotronix, Ltd. (1991).

Altera Corporation, "ClockLock & ClockBoost Circuitry for High-Density PLDS", The Altera Advantage News & Views, Newsletter for Altera Customers, Third Quarter, Aug. 1996.

Altera Corporation, "Configuring FLEX 10K Devices", Altera Corporation, Dec. 1995, ver. 1, Application Note 59.

Schmidt, Ulrich, and Knut, Cesar, "Datawave: A Single-Chip Multiprocessor for Video Applications", IEEE Micro (1991).

Electronic Design, "Embedded Configurable Memory and Logic Boost FPGA Functionality", Electronic Design, vol. 43, No. 14, Jul. 10, 1995.

Xilinix, Inc., "Fully Compliant PCI Interface in an XC3164A-2 FPGA", Xilinix, Inc. Application Note (Jan. 1995).

Epstein, Dave, "IBM Extends DSP Performance with Mfast", Microprocessor Reports, vol. 9, No. 16 (Dec. 4, 1995).

IEEE, "IEEE Standard Test Access Port and Boundary-Scan Architecture", IEEE Std 1149.1 Approved Feb. 15, 1990.

Alfke, Peter and New, Bernie, "Implementing State Machines in LCA Devices", Xilinx, Inc., Xilinx Application Note, XAPP027.001 (1994).

Camilleri, Nick, and Lockhard, Chris, "Improving XC4000 Design Performance", Xilinx Application Note, XAPP043.000 (1994).

Intel Corporation, "Intel 82375EB/82375SB PCI-EISA Bridge (PCEB) Advance Information", Intel Corporation (Mar. 1996).

Wilkie, Bill, "Interfacing XC6200 to Microprocessors (MC68020 Example)", Xilinx Application Note, XAPP 063, v. 1.1 (Oct. 9, 1996).

Wilkie, Bill, "Interfacing XC6200 to Microprocessors (TMS320C50 Example)", Xilinx Application Note, XAPP064 (Oct. 9, 1996).

XCELL, "Introducing the XC6200 FPGA Architecture: The First FPGA Architecture Optimized for Coprocessing in Embedded System Applications", XCELL, Iss. 18, 3d Quarter, 1995.

Altera Corporation, "JTAG Boundary—Scan Testing in Altera Devices", Altera Corporation, Nov. 1995, ver. 3, Application Note 39.

Margolus, Norman, "Large-scale logic-array computation", Boston University Center for Computational Science, SPIE vol. 2914 (May 1996).

Alfke, Peter, "Megabit FIFO in Two Chips: One LCA Device and One DRAM", Xilinx Application Note, XAPP030.000 (1994).

del Corso, D. et al., "Microcomputer Buses and Links", Academic Press (1996).

Bakkes, P.J. and du Plessis, J.J., "Mixed Fixed and Reconfigurable Logic for Array Processing", IEEE (1996).

Altera Corporation, "PCI Bus Applications in Altera Devices", Altera Corporation, Apr. 1995, ver. 1, Application Note 41.

Altera Corporation, "PCI Bus Target Megafunction", Altera Corporation, Solution Brief 6, ver. 1, Nov. 1996.

Altera Corporation, "PCI Compliance of Altera Devices", Altera Corporation, May 1995, ver. 2, Application Brief 140.

SIG, "PCI Local Bus Specification", PCI Special Interest Group, Production Version, Revision 2.1 (Jun. 1, 1995).

Rambus Inc., "Rambus Architectural Overview", Rambus Inc. (1992).

Rambus Inc., "Rambus Product Catalog", Rambus Inc. (1993).

Cartier, Lois, "System Design with New XC4000EX I/O Features", Xilinx Application Note, XAPP056 (Feb. 21, 1996).

Xilinx, Inc., "Technical Data—XC5200 Logic Cell Array Family, Preliminary, v.1.0", Xilinx, Inc., (Apr. 1995).

Xilinx, Inc., "The Programmable Logic Data Book (1993)", Xilinx, Inc. (1993).

Xilinx, Inc., "The Programmable Logic Data Book (1994)", Xilinx, Inc. (1994).

(56) References Cited

OTHER PUBLICATIONS

Xilinx, Inc., "The Programmable Logic Data Book (1996)", Xilinx, Inc. (Jan. 1996).
Churcher, Stephen et al., "The XC6200 FastMap Processor Interface", FPL (Aug. 1995).
Texas Instruments Incorporated, "TMS320C80 (MVP) Parallel Processor User's Guide", Texas Instruments Incorporated (1995).
Texas Instruments Incorporated, "TMS320C8x System-Level Synopsis", Texas Instruments Incorporated (Sep. 1995).
Xilinx, Inc., "XC6200 Field Programmable Gate Arrays, Advance Product Specification, v. 1.0, Jun. 1, 1996", Xilinx, Inc. (Jun. 1, 1996).
Xilinx, Inc., "Xilinx XC6200 Field Programmable Gate Arrays, Product Specification, v.1.10, Apr. 24, 1997", Xilinx, Inc. (Apr. 24, 1997).
Altera Corporation, "Asynchronous Communications Interface Adapter a6850, Sep. 1996, ver. 1", Altera Corporation, Sep. 1996, ver. 1.
Schmit, Herman et al., "Behavioral Synthesis for FPGA-based Computing", IEEE (1994).
Allaire, Bill and Knapp, Steve, "A Plug and Play Interface Using Xilinx FPGAs", Xilinx, Inc. (May 1995).
Goslin, Greg and Newgard, Bruce, "16-Tap, 8-Bit FIR Filter Applications Guide", Xilinx Application Note v. 1.01 (Nov. 21, 1994).
Veendrick, H., "A 1.5 GIPS Video Signal Processor (VSP)", IEEE 1994 Custom Integrated Circuits Conference (1994).
Yeung, Alfred K. And Rabaey, Jan M., "A 2.4GOPS Data-Driven Reconfigurable Multiprocessor IC for DSP", IEEE International Solid-State Circuits Conference (1995).
Duncan, Ann, "A 32x16 Reconfigurable Correlator for the XC6200", Xilinx Application Note, Xapp 084, v. 1.0 (Jul. 25, 1997).
Yeung, Kwok Wah, "A Data-Driven Multiprocessor Architecture for High Throughput Digital Signal Processing", U.C. Berkeley (Jul. 10, 1995).
Koren, Israel et al., "A Data-Driven VLSI Array for Arbitrary Algorithms", IEEE (1988).
Xilinx, Inc., "A Fast Constant Coefficient Multiplier", Xilinx, Inc., Xilinx Application Note, XAPP 082, v. 1.0 (Aug. 24, 1997).
Sutton, Roy A. et al., "A Multiprocessor DSP System Using PADDI-2", U.C. Berkeley (1998).
Chen, Dev C. and Rabaey, Jan M., "A Reconfigurable Multiprocessor IC for Rapid Prototyping of Algorithmic-Specific High-speed DSP Data Paths", IEEE Journal of Solid State Circuits (Dec. 1992).
Minnick, Robert, "A Survey of Microcellular Research", J. of the Association for Computing Machinery, vol. 14, No. 2 (Apr. 1967).
Trimberger, Steve et al., "A Time-Multiplexed FPGA", IEEE (1997).
New, Bernie, "Accelerating Loadable Counters in XC4000", Xilinx Application Note, XAPP 023.001 (1994).
Athanas, Peter, "An Adaptive Machine Architecture and Compiler for Dynamic Processor Reconfiguration", Brown University (May 1992).
Atmel Corporation, "Application Note AT6000 Series Configuration", Published in May 1993.
Agarwal, Anant et al., "APRIL: A Processor Architecture for Multiprocessing", IEEE (1990).
Allaire, Bill and Fischer, Bud, "Block Adaptive Filter", Xilinx Application Note, XAPP 055, v. 1.0 (Aug. 15, 1996).
New, Bernie, "Complex Digital Waveform Generator", Xilinx Application Note, XAPP 008.002 (1994).
Alfke, Peter, "Dynamic Reconfiguration", Xilinx Application Note, XAPP 093, v. 1.1 (Nov. 10, 1997).
Canadian Microelectronics Corp, "Field-Programmable Devices", 1994 Canadian Workshop on Field-Programmable Devices, Jun. 13-16, 1994, Kingston, Ontario.
S. Brown et al., Published by Kluwer Academic Publishers, "Field Programmable Gate Arrays", Atmel Corporation, (1992).
Atmel Corporation, "Field Programmable Gate Arrays, AT6000 Series", Atmel Corporation, 1993.
International Society for Optical Engineering, "Field Programmable Gate Arrays (FPGAs) for Fast Board Development and Reconfigurable Computing", International Society for Optical Engineering, vol. 2607, Oct. 25-26, 1995.
Trimberger, Stephen M., "Field-Programmable Gate Array Technology", Kluwer Academic Publishers (1994).
Hartenstein, Reiner Servit, Michal (Eds.), "Field-Programmable Logic—Architectures, Synthesis and Applications", 4th Intl Workshop on Field-Programmable Logic and Applications, FPL '94, Prague, Czech Republic, Sep. 7-9, 1994.
IEEE Computer Society, "FPGAs for Custom Computing Machines", FCCM '93, IEEE Computer Society, Apr. 5-7, 1993.
Cowie, Beth, "High Performance, Low Area, Interpolator Design for the XC6200", Xilinx Application Note, XAPP 081, v. 1.0 (May 7, 1997).
IEEE Computer Society Technical Committee on Computer Architecture, "IEEE Symposium on FPGAs for Custom Computing Machines", IEEE Computer Society Technical Committee on Computer Architecture, Apr. 19-21, 1995.
B. Schoner, C. Jones and J. Villasenor, "Issues in wireless video coding using run-time-reconfigurable FPGAs", Proceedings of the IEEE Symposium on FPGAs for Custom Computing Machines (Apr. 19, 1995).
Moore, Will and Luk, Wayne, "More FPGAs", Abingdon EE&CS Books (1994).
Fawcett, Bradly K., "New SRAM-Based FPGA Architectures Address New Applications", IEEE (Nov. 1995).
Department of Electrical and Computer Engineering, The University of Toronto, "Proceedings of the 4th Canadian Workshop on Field-Programmable Devices", Proceedings of the 4th Canadian Workshop on Field-Programmable Devices, Department of Electrical and Computer Engineering, The University of Toronto, May 13-14, 1996.
Chen, Devereaux C., "Programmable Arithmetic Devices for High Speed Digital Signal Processing", U.C. Berkeley (1992).
Vasell, Jasper, et al., "The Function Processor: A Data-Driven Processor Array for Irregular Computations", Future Generations Computer Systems, vol. 8, Issue 4 (Sep. 1992).
T. Korpiharju, J. Viitanen, H. Kiminkinen, J. Takala, K. Kaski, "TUTCA configurable logic cell array architecture", IEEE (1991).
New, Bernie, "Ultra-Fast Synchronous Counters", Xilinx Application Note, XAPP 014.001 (1994).
Bolotski, Michael, DeHon, André, and Knight, Thomas, "Unifying FPGAs and SIMD Arrays", 2nd International Workshop on Field-Programmable Gate Arrays, Feb. 13-15, 1994.
Knapp, Steven K., "Using Programmable Logic to Accelerate DSP Functions", Xilinx, Inc. (1995).
New, Bernie, "Using the Dedicated Carry Logic in XC4000", Xilinx Application Note, XAPP 013.001 (1994).
Iwanczuk, Roman, "Using the XC4000 RAM Capability", Xilinx Application Note, XAPP 031.000 (1994).
"IEEE Workshop on FPGAs for Custom Computing Machines", IEEE Computer Society Technical Committee on Computer Architecture, Apr. 10-13, 1994.
Nobuyuki Yamashita, et.al., "A 3.84 GIPS Integrated Memory Array Processor with 64 Processing Elements and a 2-Mb SRAM", IEEE Journal of Solid-State Circuits, vol. 29, Nov. 1994.
Achour, C., "A Multiprocessor Implementation of a Wavelet Transforms", Proceedings on the 4th Canadian Workshop on Field-Programmable Devices, May 13-14, 1996.
Electronic Engineering Times, "Altera ships 100,000-gate EPLD", Electronic Engineering Times, Issue 917, Sept. 2 20, 1996.
Altera Corporation, "FLEX 10K 100, 000-Gate Embedded Array Programmable Logic Family", Altera Advantage News & Views, Newsletter for Altera Customers, Second Quarter, May 1995.
Altera Corporation, "Implementing Multipliers in FLEX 10K Devices", Altera Corporation, Mar. 1996, ver. 1, Application Note 53.
Proceedings of the Parallel Systems Fair, The International Parallel Processing Symposium, IEEE Computer Society Technical Committee for Parallel Processing, Apr. 27, 1994.
Proceedings of the Workshop on Reconfigurable Architectures, 8th International Parallel Processing Symposium, IEEE Computer Society, Apr. 26, 1994.
The Programmable Logic Conference & Exhibit Proceedings, Electronic Engineering Times, Apr. 25-27, 1995.

(56) References Cited

OTHER PUBLICATIONS

Britton, Barry K. et al., "Optimized Reconfigurable Cell Array Architecture for High-Performance Field Programmable Gate Arrays", IEEE Custom Integrated Circuits Conference 1993.

Landers, George, "Special Purpose Processor Speeds up DSP Functions, Reconfigurable Arithmetic Datapath Device", Professional Program Proceedings, Electro Apr. 30-May 2, 1996.

\* cited by examiner

*Primary Examiner* — Than Nguyen

(74) *Attorney, Agent, or Firm* — Edward P. Heller, III

(57) ABSTRACT

At the inputs and/or outputs, memories are assigned to a reconfigurable module to achieve decoupling of internal data processing and in particular decoupling of the reconfiguration cycles from the external data streams (to/from peripherals, memories, etc.).

75 Claims, 16 Drawing Sheets

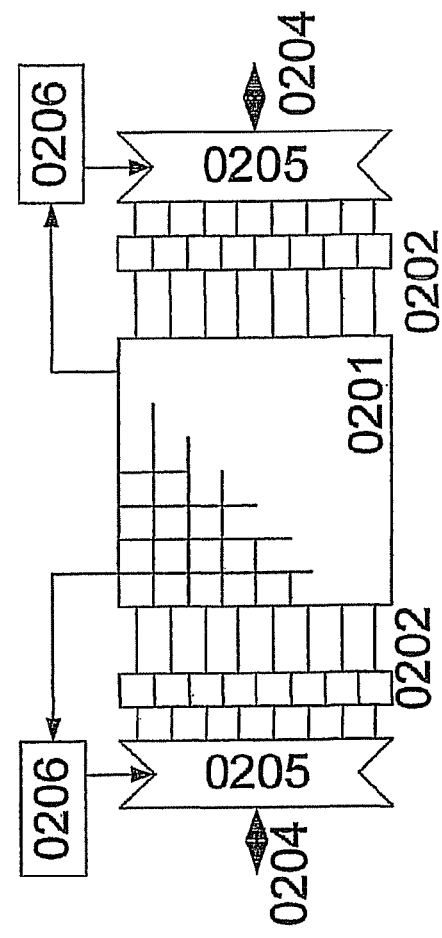
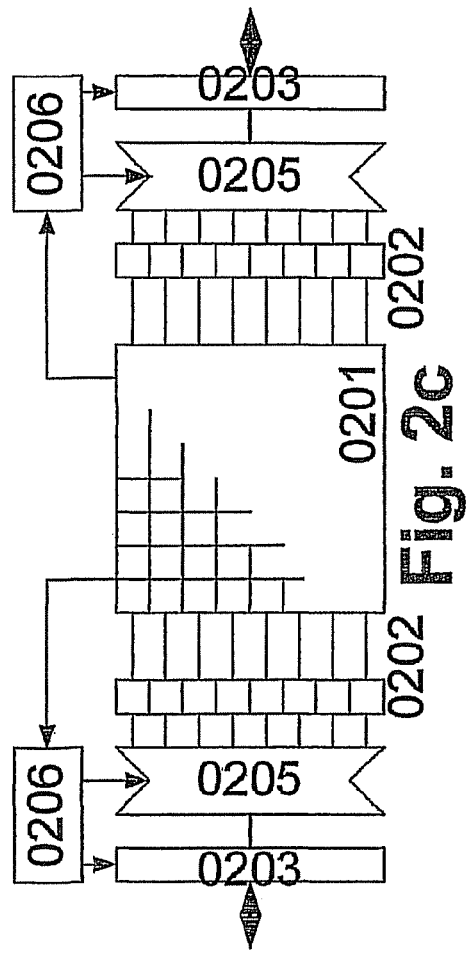
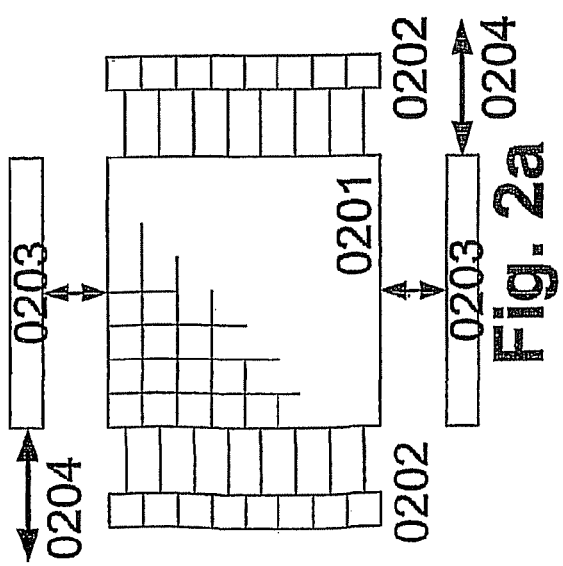

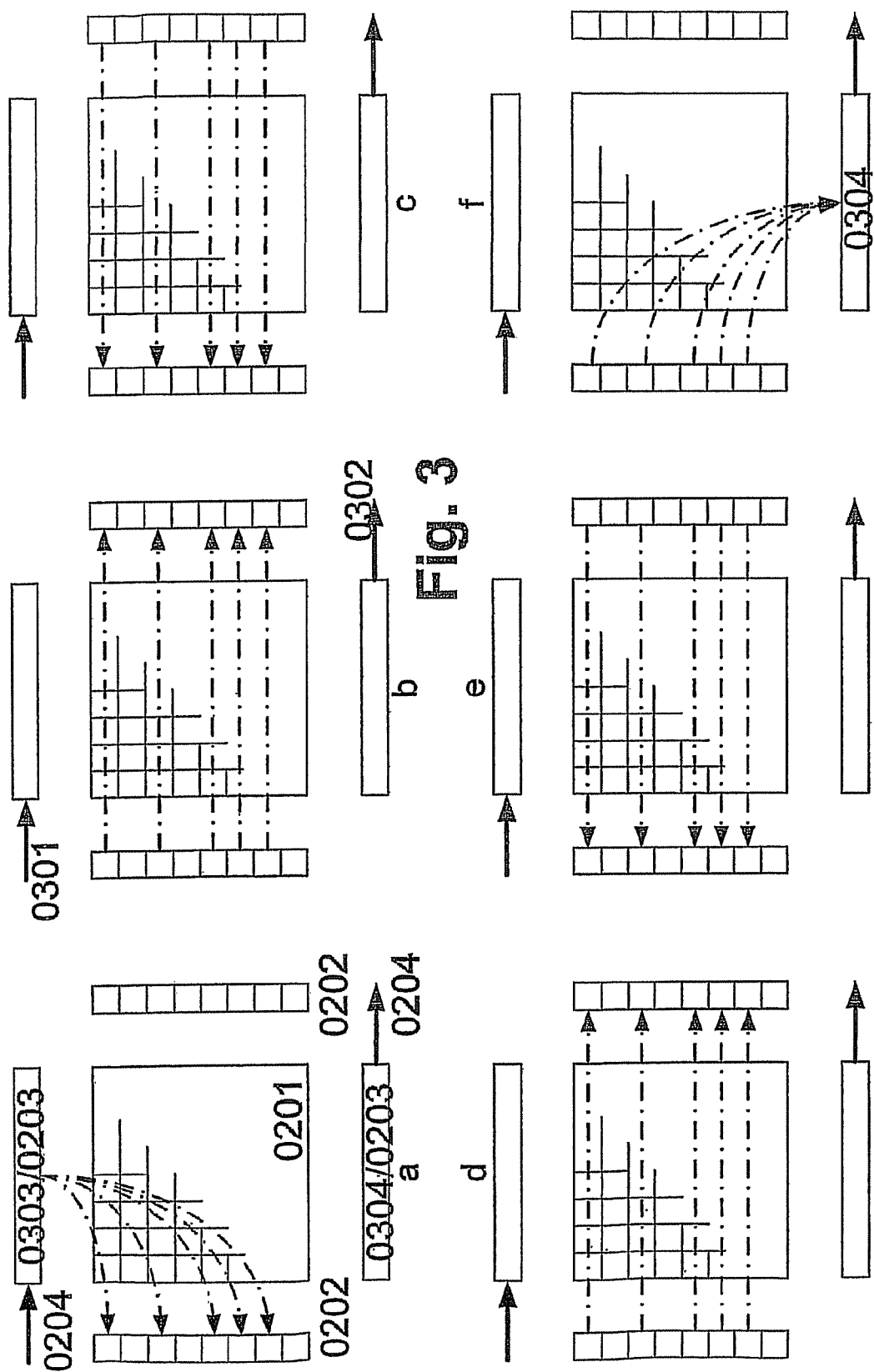

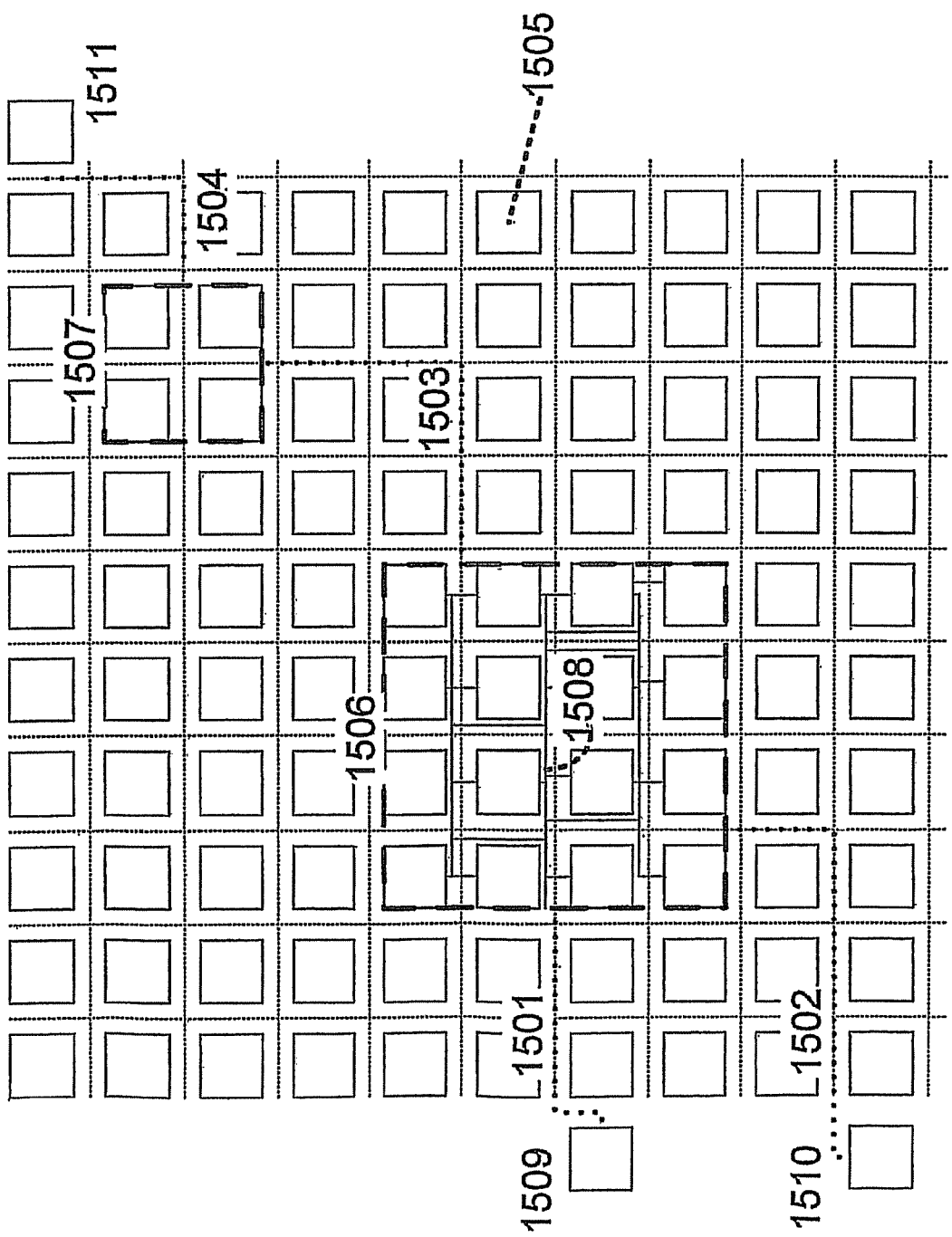

PROCESSOR ARRANGEMENT ON A CHIP INCLUDING DATA PROCESSING, MEMORY, AND INTERFACE ELEMENTS

This application is a divisional of and claims priority to U.S. patent application Ser. No. 12/496,012, filed on Jul. 1, 2009 now abandoned, which is a continuation of and claims priority to U.S. patent application Ser. No. 10/471,061, filed on Oct. 29, 2004 now U.S. Pat. No. 7,581,076; which is a national stage application of International Application Serial No. PCT/EP02/02398, filed on Mar. 5, 2002; which claims priority to German Patent Application No. 101 10530.4, filed on Mar. 5, 2001, the entire contents of each of which are expressly incorporated herein by reference.

BACKGROUND INFORMATION

The present invention relates to reconfigurable components in general, and in particular but not exclusively the decoupling of data processing within the reconfigurable component and/or within parts of the reconfigurable component and data streams, specifically both within the reconfigurable component and also to and from peripherals, mass memories, host processors, and the like (see, e.g., German Patent Application Nos. DE 101 10 530.4 and DE 102 02 044.2).

Memories are assigned to a reconfigurable module (VPU) at the inputs and/or outputs to achieve decoupling of internal data processing, the reconfiguration cycles in particular, from the external data streams (to/from peripherals, memories, etc.).

Reconfigurable architecture includes modules (VPUs) having a configurable function and/or interconnection, in particular integrated modules having a plurality of unidimensionally or multidimensionally positioned arithmetic and/or logic and/or analog and/or storage and/or internally/externally interconnecting modules, which are interconnected directly or via a bus system.

These generic modules include in particular systolic arrays, neural networks, multiprocessor systems, processors having a plurality of arithmetic units and/or logic cells and/or communication/peripheral cells (IO), interconnecting and networking modules such as crossbar switches, as well as conventional modules including FPGA, DPGA, Chameleon, XPUTER, etc. Reference is also made in particular in this context to the following patents and patent applications of the same applicant: P 44 16 881.0-53, DE 197 81 412.3, DE 197 81 483.2, DE 196 54 846.2-53, DE 196 54 593.5-53, DE 197 04 044.6-53, DE 198 80 129.7, DE 198 61 088.2-53, DE 199 80 312.9, PCT/DE00/01869, now U.S. Pat. No. 8,230,411, DE 100 36 627.9-33, DE 100 28 397.7, DE 101 10 530.4, DE 101 11 014.6, PCT/EP00/10516, EP 01 102 674.7, DE 196 51 075.9, DE 196 54 846.2, DE 196 54 593.5, DE 197 04 728.9, DE 198 07 872.2, DE 101 39 170.6, DE 199 26 538.0, DE 101 42 904.5, DE 101 10 530.4, DE 102 02 044.2, DE 102 06 857.7, DE 101 35 210.7, EP 02 001 331.4, EP 01 129 923.7 as well as the particular parallel patent applications thereto. The entire disclosure of these documents are incorporated herein by reference.

The above-mentioned architecture is used as an example to illustrate the present invention and is referred to hereinafter as VPU. The architecture includes an arbitrary number of arithmetic, logic (including memory) and/or memory cells and/or networking cells and/or communication/peripheral (IO) cells (PAEs—Processing Array Elements), which may be positioned to form a unidimensional or multidimensional matrix (PA); the matrix may have different cells of any desired configuration. Bus systems are also understood here as cells. A configuration unit (CT) which affects the interconnection and function of the PA is assigned to the entire matrix or parts thereof.

Memory access methods for reconfigurable modules which operate according to a DMA principle are described in German Patent No. P 44 16 881.0, where one or more DMAs are formed by configuration. In German Patent Application No. 196 54 595.1, DMAs are fixedly implemented in the interface modules and may be triggered by the PA or the CT.

German Patent Application No. DE 196 54 846.2 describes how internal memories are written by external data streams and data is read out of the memory back into external units.

German Patent Application No. DE 199 26 538.0 describes expanded memory concepts according to DE 196 54 846.2 for achieving more efficient and easier-to-program data transmission. U.S. Pat. No. 6,347,346 describes a memory system which corresponds in all essential points to German Patent Application No. DE 196 54 846.2, having an explicit bus (global system port) to a global memory. U.S. Pat. No. 6,341,318 describes a method for decoupling external data streams from internal data processing by using a double-buffer method, in which one buffer records/reads out the external data while another buffer records/reads out the internal data; as soon as the buffers are full/empty, depending on their function, the buffers are switched, i.e., the buffer formerly responsible for the internal data now sends its data to the periphery (or reads new data from the periphery) and the buffer formerly responsible for the external data now sends its data to the PA (reads new data from the PA). These double buffers are used in the application to buffer a cohesive data area.

Such double-buffer configurations have enormous disadvantages in the data-stream area in particular, i.e., in data streaming, in which large volumes of data streaming successively into a processor field or the like must always be processed in the same way.

BRIEF DESCRIPTION OF THE DRAWINGS

FIG. 2A shows a direct FIFO to PA coupling.

FIG. 2B shows 10 connected via RAM-PAEs.

FIG. 2C shows FIFOs connected upstream from the IOs.

FIGS. 3A-3F show an example data processing method in a VPU.

FIG. 15 shows configuration couplings according to an example embodiment of the present invention.

DETAILED DESCRIPTION

Figure 1:
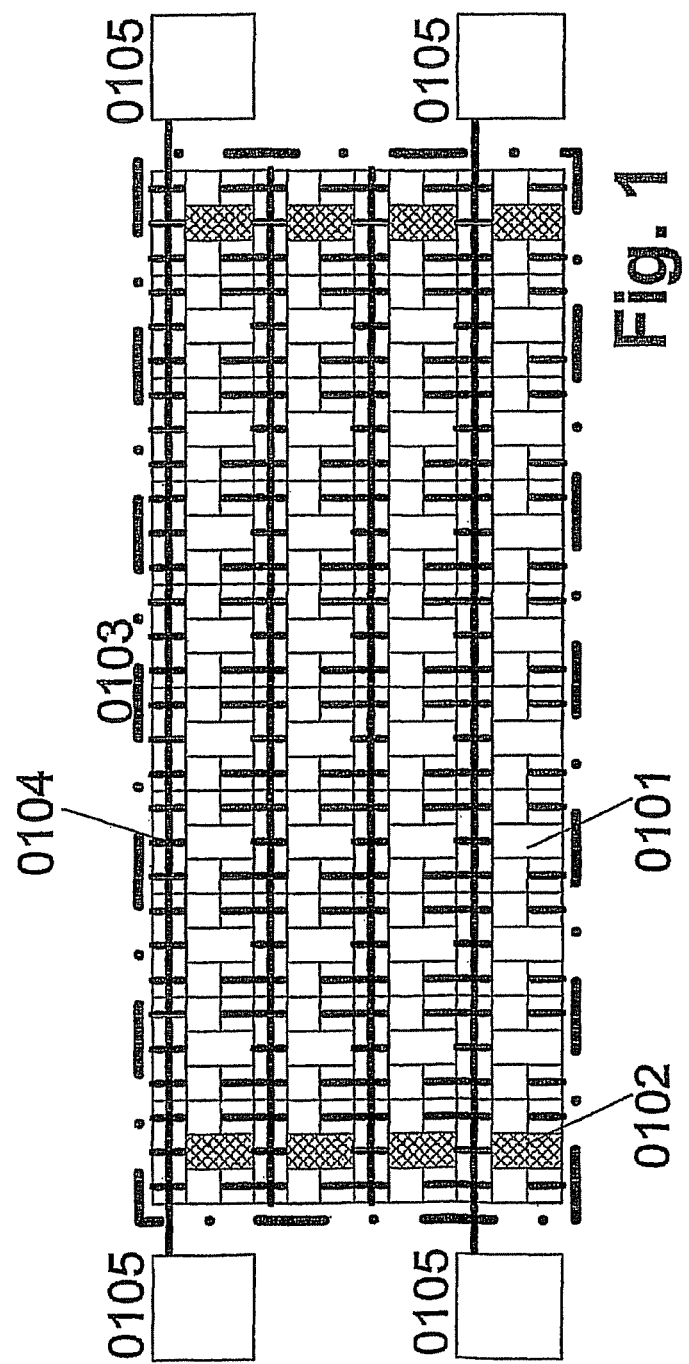
FIG. 1 shows an example reconfigurable processor.

An object of the present invention is to provide a novel approach for commercial use.

A method according to an example embodiment of the present invention, in contrast to the previously known related art, allows a significantly simpler means of controlling the buffers, i.e., memories, connected in between; the related art is disadvantageous in the core area of typical applications of reconfigurable processors in particular. External and internal bus systems may be operated at different transfer rates and/or clock frequencies with no problem due to the memory devices connected in between because data is stored temporarily by the buffers. In comparison with inferior designs from the related art, this method requires fewer memory devices, typically only half as many buffers, i.e., data transfer interface memory devices, thus greatly reducing the hardware costs. The estimated reduction in hardware costs amounts to 25% to 50%. It is also simpler to generate addresses and to program the configuration because the buffers are transparent for the programmer. Hardware is simpler to write and to debug.

A paging method which buffers various data areas in particular for different configurations may be integrated.

It should first be pointed out that various memory systems are known as interfaces to the IO. Reference is made to German Patent No. and German Patent Application Nos. P 44 16 881.0, DE 196 54 595.1, and DE 199 26 538.0. In addition, a method is described in German Patent Application No. DE 196 54 846.2 in which data is first loaded from the IO, (1) data is stored within a VPU after being computed, (2) the array (PA) is reconfigured, (3) data is read out from the internal memory and written back to another internal memory, (4) this is continued until the fully computed result is sent to the IO. Reconfiguration means, for example, that a function executed by a part of the field of reconfigurable units or the entire field and/or the data network and/or data and/or constants which are necessary in data processing is/are determined anew. Depending on the application and/or embodiment, VPUs are reconfigured only completely or also partially, for example. Different reconfiguration methods are implementable, e.g., complete reconfiguration by switching memory areas (see, e.g., German Patent Application Nos. DE 196 51 075.9, DE 196 54 846.2) and/or wave reconfiguration (see, e.g., German Patent Application Nos. DE 198 07 872.2, DE 199 26 538.0, DE 100 28 397.7, DE 102 06 857.7) and/or simple configuring of addressable configuration memories (see, e.g., German Patent Application Nos. DE 196 51 075.9, DE 196 54 846.2, DE 196 54 593.5). The entire disclosure of each of the particular patent specifications is expressly incorporated herewith.

In one example embodiment, a VPU is entirely or partially configurable by wave reconfiguration or by directly setting addressable configuration memories.

Thus, one of the main operating principles of VPU modules is to copy data back and forth between multiple memories, with additional and optionally the same operations (e.g., long FIR filter) and/or other operations (e.g., FFT followed by Viterbi) being performed with the same data during each copying operation. Depending on the particular application, data is read out from one or more memories and written into one or more memories.

For storing data streams and/or states (triggers, see, e.g., German Patent Application Nos. DE 197 04 728.9, DE 199 26 538.0), internal/external memories (e.g., as FIFOs) are used and corresponding address generators are utilized. Any appropriate memory architecture may be fixedly implemented specifically in the algorithm and/or flexibly configured.

For performance reasons, the internal memories of the VPU are preferably used, but basically external memories may also be used.

Assuming this, the following comments shall now be made regarding the basic design:

Interface modules which communicate data between the bus systems of the PA and external units are assigned to an array (PA) (see, e.g., German Patent No. P 44 16 881.0, and German Patent Application No. DE 196 54 595.1). Interface modules connect address buses and data buses in such a way as to form a fixed allocation between addresses and data. Interface modules may preferably generate addresses or parts of addresses independently.

Interface modules are assigned to FIFOs which decouple internal data processing from external data transmission. A FIFO here is a data-streamable buffer, i.e., input/output data memory, which need not be switched for data processing, in particular during execution of one and the same configuration. If other data-streamable buffers are known in addition to FIFO memories, they will subsequently also be covered by the term where applicable. In particular, ring memories having one or more pointers, in particular at least one write memory and one read memory, should also be mentioned. Thus, for example, during multiple reconfiguration cycles for processing an application, the external data stream may be maintained as largely constant, regardless of internal processing cycles. FIFOs are able to store incoming/outgoing data and/or addresses. FIFOs may be integrated into an interface module or assigned to one or more of them. Depending on the design, FIFOs may also be integrated into the interface modules, and at the same time additional FIFOs may be implemented separately. It is also possible to use data-streamable buffers integrated into the module, e.g., by integration of FIFO groups into a chip which forms a reconfigurable processor array.

In one example embodiment, multiplexers for free allocation of interface modules and FIFOs may also be present between the FIFOs (including those that are separate) and the interface modules. In one configuration, the connection of FIFOs to external modules or internal parts of the processor field performed by a multiplexer may be specified based on the processor field, e.g., by the PAE sending and/or receiving data, but it may also be determined, if desired, by a unit at a higher level of the hierarchy, such as a host processor in the case of division of data processing into a highly parallel part of the task and a poorly parallelizable part of the task and/or the multiplexer circuit may be determined by external specifications, which may be appropriate if, for example, it is indicated with the data which type of data is involved and how it is to be processed.

With regard to the external connection, units for protocol conversion between the internal and external bus protocols (e.g., RAMBUS, AMBA, PCI, etc.) are also provided. A plurality of different protocol converters may also be used within one embodiment. The protocol converters may be designed separately or integrated into the FIFOs or interface modules.

In one possible embodiment, multiplexers for free assignment of interface modules/FIFOs and protocol converters may be provided between the (separate) protocol converters and the interface modules/FIFOs. Downstream from the protocol converters there may be another multiplexer stage, so that a plurality of AMBA bus interfaces may be connected to the same AMBA bus, for example. This multiplexer stage may also be formed, for example, by the property of an external bus of being able to address a plurality of units.

In one example embodiment, the circuit operates in master and slave operating modes. In the master mode, addresses and bus accesses are generated by the circuit and/or the assigned PA; in slave mode, external units access the circuit, i.e., the PA.

In other embodiments, additional buffer memories or data collectors may be provided within the circuit, depending on the application, for exchanging data between interface modules. These buffer memories preferably operate in a random access mode and/or an MMU paging mode and/or a stack mode and may have their own address generators. The buffer memories are preferably designed as multi-port memories to permit simultaneous access of a plurality of interface modules. It is possible to access the buffer memories from a higher-level data processing unit, in particular from processors such as DSPs, CPUs, microcontrollers, etc., assigned to the reconfigurable module (VPU).

Now the decoupling of external data streams in particular will be described. According to one aspect of the present invention, the external data streams are decoupled by FIFOs (input/output FIFO, combined as IO-FIFO) which are used between protocol converters and interface modules.

The data processing method functions as follows:

Through one or more input FIFOs, incoming data is decoupled from data processing in the array (PA). Data processing may be performed in the following steps:

1. The input FIFO(s) is (are) read out, processed by the array (PA) and/or written into one or more (other) memories (RAM bank1) assigned locally to the array and/or preferably connected laterally to the array. The lateral connection has the advantage that the chip architecture and/or its design is/are simplified.
2. The array (PA) is reconfigured. The memories (e.g., RAM bank1) are read out, data is processed and written into one or more memories (e.g., RAM bank2 and/or RAM bank1) or, as an alternative, data may already be written to the output FIFOs according to step 4.
3. The array (PA) is reconfigured again and data is again written into a memory.
4. This is continued until the result is sent to one or more output FIFOs for output.
5. Then new data is again read out from the input FIFO(s) and processed accordingly, i.e., data processing is continued in step 1.

With the preferred design of the input/output FIFOs (IO-FIFOs) as multi-ported FIFOs, data processing may be performed by protocol converters simultaneously with writing into and/or reading out from the particular FIFOs. The method described above yields a time decoupling which permits "quasi-steady-state" processing of constant data streams in such a way that there is only a latency but no interruption in the data stream when the first data packets have passed through. In an expanded embodiment, the IO-FIFOs may be designed so that the number of IO-FIFOs and their depth may be selected according to the application. In other words, IO-FIFOs may be distributed or combined (e.g., via a transmission gate, multiplexer/demultiplexer, etc.) so that there are more IO-FIFOs or they are deeper. For example, 8 FIFOs of 1,024 words each may be implemented and configured so that 8 FIFOs of 1,024 words or 2 FIFOs of 4,096 words are configured or, for example, 1 FIFO may be configured with 4,096 words and 4 with 1,024 words. Modifications of the data processing method described here are possible, depending on the design of the system and the requirements of the algorithms.

In an expanded embodiment, the FIFOs function in such a way that in the case of output FIFOs the addresses belonging to the data inputs are also stored in the FIFOs and/or input FIFOs are designed so that there is one FIFO for the reading addresses to be sent out/already sent out and one FIFO for the incoming data words assigned to the addresses.

Below is a discussion of how a FIFO-RAM bank coupling, which is possible according to the present invention, may be implemented in a particularly preferred variant of the present invention.

Depending on the application, it is possible to conduct the data transfer with the IO-FIFOs via one or more additional memory stages (RAM bank) which are assigned locally to the array or are preferably coupled laterally to the array and only then relay data to the data processing PAEs (e.g., ALU-PAEs described in, e.g., German Patent Application No. DE 196 51 075.9).

In a preferred embodiment, RAM-PAEs have a plurality of data interfaces and address interfaces, they are thus designed as multi-port arrays. Designability of a data interface and/or address interface as a global system port should also be mentioned as a possibility.

Additional memory stage(s) (RAM banks) may be implemented, for example, by memory modules corresponding to the RAM-PAEs, as described in, for example, German Patent Application No. DE 196 54 846.2 and/or German Patent Application No. DE 199 26 538.0 and/or International Patent Application No. PCT/EP00/10516.

In other words, a RAM-PAE may constitute a passive memory which is limited (essentially) to the memory function (see, e.g., German Patent Application No. DE 196 54 846.2) or an active memory which automatically generates and controls functions such as address computation and/or bus accesses (see, e.g., German Patent Application No. DE 199 26 538.0). In particular, in one possible embodiment, active address generation functions and/or data transfer functions may also be implemented for a "global system port." Depending on the design, active memories may actively manage one or more data interfaces and address interfaces (active interfaces). Active interfaces may be implemented, for example, by additional modules such as sequencers/state machines and/or ALUs and/or registers, etc., within a RAM-PAE and/or by suitable hardwiring of an active interface to other PAEs whose function and networking are configured in one or more RAM-PAEs in accordance with the functions to be implemented. Different RAM-PAEs may be assigned to different other PAEs.

RAM-PAEs preferably have one or more of the following functions, i.e., modes of operation: random access, FIFO, stack, cache, MMU paging. In a preferred embodiment, RAM-PAEs are connected via a bus to a higher-level configuration unit (CT) and may be configured by it in their function and/or interconnection and/or memory depth and/or mode of operation. In addition, there is preferably also the possibility of preloading and reading out the memory contents by the CT, for example, to set constants and/or lookup tables (cos/sin).

Due to the use of multi-ported memories for the RAM-PAEs, writing and/or reading out of data into/from the IO-FIFOs and data access by the array (PA) may take place simultaneously, so that the RAM-PAEs may in turn again have a buffer property, as described in German Patent Application No. DE 196 54 846.2, for example.

RAM-PAEs may be combined (as discussed in International Patent Application No. PCT/EP 00/10516, for example) in such a way that larger memory blocks are formed and/or the RAM-PAEs operate so that the function of a larger memory is obtained (e.g., one 1,024-word RAM-PAE from two 512-word RAM-PAEs).

In an example embodiment, the units may be combined so that the same address is sent to multiple memories. The address is subdivided so that one portion addresses the entries in the memories and another portion indicates the number of the memory selected (SEL). Each memory has a unique number and may be selected unambiguously by comparing it with SEL. In a preferred embodiment, the number for each memory is configurable.

In another and/or additional example embodiment, an address is relayed from one memory to the next. This address is subdivided so that one portion addresses the entries in the memories and another portion indicates the number (SEL) of the memory selected. This is modified each time data is relayed; for example, a 1 may be subtracted from this each time data is relayed. The memory in which this address part has a certain value (e.g., zero) is activated.

In an example embodiment, the units may be combined so that the same address is sent to a plurality of memories. The address is subdivided so that one part addresses the entries in the memories and another part indicates the number (SEL) of the memory selected. A bus runs between memories, namely from one memory to the next, which has a reference address such that the address has a certain value (e.g., zero) in the first memory and this value is modified each time data is relayed (e.g., incremented by 1). Therefore, each memory has a different unique reference address. The portion of the address having the number of the selected memory is compared with the reference address in each case. If they are identical, the particular memory is selected. Depending on the design, the reference bus may be constructed using the ordinary data bus system or a separated bus.

In an example embodiment, there may be an area check of the address part SEL to rule out faulty addressing.

It should now be pointed out that RAM-PAEs may be used as FIFOs. This may be preferred in particular when a comparatively large memory capacity is provided by RAM-PAEs. Thus, in particular when using multi-ported memories for the RAM-PAEs, this yields the design option of dispensing with explicit IO-FIFOs and/or configuring a corresponding number of RAM-PAEs as FIFOs in addition to the IO-FIFOs and sending data from the 10 to the corresponding memory ports. This embodiment may be regarded as particularly cost efficient because no additional memories need be provided, but instead the memories of the VPU architecture, which are configurable in their function and/or interconnection (see, e.g., German Patent Application No. DE 196 54 846.2, DE 199 26 538.0 and International Patent Application No. PCT/EP 00/10516), are configured corresponding to the character of configurable processors.

It is also possible to provide a multiplexer/demultiplexer upstream and/or downstream from the FIFO. Incoming and/or outgoing data streams may be formed from one or more data records. For example, the following function uses two incoming data streams (a and b) and one outgoing data stream (x):
function example (a, b: integer)->x: integer
for i:=1 to 100
for j:=1 to 100
x[i]:=a[i]*b[j].

This requirement may be met by using two approaches, for example:
a) The number of IO channels implemented is exactly equal to the number of data streams required (see, e.g., German Patent No. P 44 16 881.0; German Patent Application No. DE 196 54 595.1); in the stated function, for example, three I/O channels would thus be necessary; or
b) By using internal memories for decoupling data streams, more or less as a register set (see, e.g., German Patent Application Nos. DE 199 26 538.0, DE 196 54 846.2). The different data streams are exchanged between one or more memories and the IO (e.g., memory, peripheral, etc.) by a time multiplex method, for example. Data may then be exchanged internally in parallel with a plurality of memories, if necessary, if the IO data is sorted (split) accordingly during the transfer between these memories and the IO.

Approach a) is supported according to the present invention by making available a sufficient number of IO channels and IO-FIFOs. However, this simple approach is unsatisfactory because an algorithm-dependent and very expensive number of IO channels, which cannot be determined precisely, must be made available.

Therefore, approach b) or a suitable combination of a) and b) may be preferred, e.g., two IO channels, one input and one output, data streams being multiplexed on each channel if necessary. It should be pointed out that the interfaces should be capable of processing data streams, i.e., a sufficiently high clock frequency and/or sufficiently short latencies should be provided on the internal and/or external buses. This may be the reason why a combination of the two variants may be particularly preferred, because by providing a plurality of parallel IO channels, the required clocking of external and/or internal buses may be reduced accordingly.

For approach b) or approaches based at least partially on approach b), it may be necessary to provide multiplexers and/or demultiplexers and to separate the data streams of one data channel (e.g., a) and b) should be separated from the input channel) or to combine a plurality of result channels on one output channel.

One or more multiplexers/demultiplexers (MuxDemux stage) may be located at different positions, depending on the technical hardware implementation and/or the functions to be executed. For example,
a) a MuxDemux stage may be connected between the input/output interface (e.g., described in German Patent Application No. DE 196 54 595.1) and the FIFO stage (IO-FIFO and/or RAM-PAE as FIFO),
b) a MuxDemux stage may be connected downstream from the FIFO stage (IO-FIFO and/or RAM-PAE as FIFO), i.e., between the FIFO stage and the PA,
c) a MuxDemux stage may be connected between the IO-FIFO and the RAM-PAEs.

The MuxDemux stage may in turn either be fixedly implemented in the hardware and/or formed by a suitable configuration of any PAEs designed accordingly.

The position of the multiplexers/demultiplexers of the MuxDemux stage is determined by the configuration by a CT and/or the array (PA) and/or the IO itself, which may also be dynamically influenced, e.g., on the basis of the degree of filling of the FIFO(s) and/or on the basis of pending data transfers (arbitration).

In an example embodiment, the multiplexer/demultiplexer structure is formed by a configurable bus system (e.g., according to or resembling the bus system between the RAM/ALU/etc.-PAEs), whereby the bus system may in particular also be physically the same which is also used either by resource sharing or by a time multiplex method which may be implemented through a suitable reconfiguration.

It may be particularly preferred if addresses are generated in a particular manner, as is evident from the following discussion. Addresses for internal or external memories may be computed by address generators. For example, groups of PAEs may be configured accordingly and/or explicit address generators, implemented separately and specially, if necessary (e.g., DMAs such as those described in German Patent No. DE 44 16 881) or within interface cells (such as those described in German Patent Application No. DE 196 54 595.1) may be used. In other words, either fixedly implemented address generators, which are integrated into a VPU or are implemented externally, may be used and/or the addresses may be calculated by a configuration of PAEs according to the requirements of an algorithm.

Simple address generators are preferably fixedly implemented in the interface modules and/or active memories (e.g., RAM-PAEs). For generation of complex address sequences (e.g., nonlinear, multidimensional, etc.), PAEs may be configured accordingly and connected to the interface cells. Such methods having the corresponding configurations are described in International Patent Application No. PCT/EP 00/10516.

Configured address generators may belong to another configuration (ConfigID, see, e.g., German Patent Application Nos. DE 198 07 872.2, DE 199 26 538.0 and DE 100 28 397.7) other than data processing. This makes a decoupling of address generation from data processing possible, so that in a preferred method, for example, addresses may already be generated and the corresponding data already loaded before or during the time when the data processing configuration is being configured. It should be pointed out that such data preloading and/or address pregeneration is particularly preferred for increasing processor performance, in particular by reducing latency and/or the wait clock cycle. Accordingly, the result data and its addresses may still be processed during or after removal of the data processing/generating configuration. In particular, it is possible through the use of memories and/or buffers such as the FIFOs described here, for example, to further decouple data processing from memory access and/or IO access.

In a preferred procedure, it may be particularly effective to combine fixedly implemented address generators (HARD-AG) (see, e.g., German Patent Application No. DE 196 54 595.1) and configurable address generators in the PA (SOFT-AG) in such a way that HARD-AGs are used for implementation of simple addressing schemes, while complex addressing sequences are computed by the SOFT-AG and then sent to the HARD-AG. In other words, individual address generators may overload and reset one another.

Interface modules for reconfigurable components are described in German Patent Application No. DE 196 54 595.1. The interface modules disclosed therein and their operation could still be improved further to increase processor efficiency and/or performance. Therefore, within the scope of the present invention, a particular embodiment of interface modules is proposed below such as that disclosed in particular in German Patent Application No. DE 196 54 595.1.

Each interface module may have its own unique identifier (IOID) which is transmitted from/to a protocol converter and is used for assigning data transfers to a certain interface module or for addressing a certain interface module. The IOID is preferably CT-configurable.

For example, the IOID may be used to select a certain interface module for a data transfer in the case of accesses by an external master. In addition, the IOID may be used to assign the correct interface module to incoming read data. To do so, the IOID is, for example, transmitted with the address of a data-read access to the IO-FIFOs and either stored there and/or relayed further to the external bus. IO-FIFOs assign the IOIDs of the addresses sent out to the incoming read data and/or the IOIDs are also transmitted via the external bus and assigned by external devices or memories to the read data sent back.

IOIDs may then address the multiplexers (e.g., upstream from the interface modules) so that they direct the incoming read data to the correct interface module.

Interface modules and/or protocol converters conventionally operate as bus masters. In a special embodiment, it is now proposed that interface modules and/or protocol converters shall function alternatively and/or fixedly and/or temporarily as bus slaves, in particular in a selectable manner, e.g., in response to certain events, states of state machines in PAEs, requirements of a central configuration administration unit (CT), etc. In an additional embodiment, the interface modules are expanded so that generated addresses, in particular addresses generated in SOFT-AGs, are assigned a certain data packet.

A preferred embodiment of an interface module is described below:

A preferred coupling of an interface module is accomplished by connecting any PAEs (RAM, ALU, etc.) and/or the array (PA) via a bus (preferably configurable) to interface modules which are either connected to the protocol converters or have the protocol converters integrated into them.

In a variant embodiment, IO-FIFOs are integrated into the interface modules.

For write access (the VPU sends data to external IOs, e.g., memories/peripherals, etc.) it is advantageous to link the address output to the data output, i.e., a data transfer takes place with the IO precisely when a valid address word and a valid data word are applied at the interface module, the two words may be originating from different sources. Validity may be identified by a handshake protocol (RDY/ACK) according to German Patent Application Nos. DE 196 51 075.9 or DE 101 10 530.4, for example. Through suitable logic gating (e.g., AND) of RDY signals of address word and data word, the presence of two valid words is detectable, and IO access may be executed. On execution of the IO access, the data words and the address words may be acknowledged by generating a corresponding ACK for the two transfers. The IO access including the address and data, as well as the associated status signals, if necessary, may be decoupled in output FIFOs according to the present invention. Bus control signals are preferably generated in the protocol converters.

For read access (the VPU receives data from external IOs, e.g., memories/peripherals, etc.), the addresses for the access are first generated by an address generator (HARD-AG and/or SOFT-AG) and the address transfer is executed. Read data may arrive in the same clock cycle or, at high frequencies, may arrive pipelined one or more clock cycles later. Both addresses and data may be decoupled through IO-FIFOs.

The conventional RDY/ACK protocol may be used for acknowledgment of the data, and it may also be pipelined (see, e.g., German Patent Application Nos. DE 196 54 595.1, DE 197 04 742.4, DE 199 26 538.0, DE 100 28 397.7 and DE 101 10 530.4).

The conventional RDY/ACK protocol may also be used for acknowledgment of the addresses. However, acknowledgment of the addresses by the receiver results in a very long latency, which may have a negative effect on the performance of VPUs. The latency may be bypassed in that the interface module acknowledges receipt of the address and synchronizes the incoming data assigned to the address with the address.

Acknowledgment and synchronization may be performed by any suitable acknowledgment circuit. Two possible embodiments are explained in greater detail below, although in a non-limiting fashion:

a) FIFO

A FIFO stores the outgoing address cycles of the external bus transfers. With each incoming data word as a response to an external bus access, the FIFO is instructed accordingly. Due to the FIFO character, the sequence of outgoing addresses corresponds to the sequence of outgoing data words. The depth of the FIFO (i.e., the number of possible entries) is preferably adapted to the latency of the external system, so that any outgoing address may be acknowledged without latency and optimum data throughput is achieved. Incoming data words are acknowledged according to the FIFO entry of the assigned address. If the FIFO is full, the external system is no longer able to accept any additional addresses and the current outgoing address is not acknowledged and is thus held until data words of a preceding bus transfer have been received and one FIFO entry has been removed. If the FIFO is empty, no valid bus transfer is executed and possibly incoming data words are not acknowledged.

b) Credit Counter

Each outgoing address of external bus transfers is acknowledged and added to a counter (credit counter). Incoming data words as a response to an external bus transfer are subtracted from the counter. If the counter reaches a defined maximum value, the external system can no longer accept any more addresses and the current outgoing address is not acknowledged and is thus held until data words of a preceding bus transfer have been received and the counter has been decremented. If the counter content is zero, no valid bus transfer is executed and incoming data words are not acknowledged.

To optimally support burst transfers, the method using a) (FIFO) is particularly preferred, and in particular FIFOs may be used like the FIFOs described below for handling burst accesses and the assignment of IOIDs to the read data.

The IO-FIFOs described here may be integrated into the interface modules. In particular, an IO-FIFO may also be used for embodiment variant a).

The optional possibility of providing protocol converters is discussed above. With regard to particularly advantageous possible embodiments of protocol converters, the following comments should be made:

A protocol converter is responsible for managing and controlling an external bus. The detailed structure and functioning of a protocol converter depend on the design of the external bus. For example, an AMBA bus requires a protocol converter different from a RAMBUS. Different protocol converters are connectable to the interface modules, and within one embodiment of a VPU, a plurality of, in particular, different protocol converters may be implemented.

In one preferred embodiment, the protocol converters are integrated into the IO-FIFOs of the present invention.

It is possible according to the present invention to provide burst bus access. Modern bus systems and SoC bus systems transmit large volumes of data via burst sequences. An address is first transmitted and data is then transmitted exclusively for a number of cycles (see AMBA Specification 2.0, ARM Limited).

For correctly executing burst accesses, several tasks are to be carried out:

1) Recognizing Burst Cycles

Linear bus accesses, which may be converted into bursts, must be recognized to trigger burst transfers on the external bus. For recognizing linear address sequences, a counter (TCOUNTER) may be used; it is first loaded with a first address of a first access and counts linearly up/down after each access. If the subsequent address corresponds to the counter content, there is a linear and burst-capable sequence.

2) Aborting at Boundaries

Some bus systems (e.g., AMBA) allow bursts (a) only up to a certain length and/or (b) only up to certain address limits (e.g., 1024 address blocks). For (a), a simple counter may be implemented according to the present invention, which counts from the first desired or necessary bus access the number of data transmissions and at a certain value which corresponds to the maximum length of the burst transfer, signals the boundary limits using a comparator, for example. For (b), the corresponding bit (e.g., the 10th bit for 1024 address limits) which represents the boundary limit may be compared between TCOUNTER and the current address (e.g., by an XOR function). If the bit in the TCOUNTER is not equal to the bit in the current address, there has been a transfer beyond a boundary limit which is signaled accordingly.

3) Defining the Length

If the external bus system does not require any information regarding the length of a burst cycle, it is possible and preferable according to the present invention to perform burst transfers of an indefinite length (cf. AMBA). If length information is expected and/or certain burst lengths are predetermined, the following procedure may be used according to the present invention. Data and addresses to be transmitted are written into a FIFO, preferably with the joint use of the IO-FIFO, and are known on the basis of the number of addresses in the (IO-)FIFO. For the addresses, an address FIFO is used, transmitting in master mode the addresses from the interface modules to the external bus and/or operating conversely in slave mode. Data is written into a data FIFO, which transmits data according to the transmission (read/write). In particular, a different FIFO may be used for write transfers and for read transfers. The bus transfers may then be subdivided into fixed burst lengths, so that they are known before the individual burst transfers and may be stated on initiation of the burst, burst transfers of the maximum burst length preferably being fowled first and if the number of remaining (IO-)FIFO entries is smaller than the current burst length, a next smaller burst length is used in each case. For example, ten (IO-)FIFO entries may be transmitted at a maximum burst length of 4 with 4, 4, 2 burst transfers.

4) Error Recovery

Many external bus systems (cf. AMBA) provide methods for error elimination in which failed bus transfers are repeated, for example. The information as to whether a bus transfer has failed is transmitted at the end of a bus transfer, more or less as an acknowledgment for the bus transfer. To repeat a bus transfer, it is now necessary for all the addresses to be available, and in the case of write access, the data to be written away must also be available. According to the present invention, the address FIFOs (preferably the address FIFOs of the IO-FIFOs) are modified so that the read pointer is stored before each burst transfer. Thus, a FIFO read pointer position memory means is provided, in particular an address FIFO read pointer position memory means. This may form an integral part of the address FIFO in which, for example, a flag is provided, indicating that information stored in the FIFO represents a read pointer position or it may be provided separately from the FIFO. As an alternative, a status indicating deletability could also be assigned to data stored in the FIFO, this status also being stored and reset to "deletable" if successful data transmission has been acknowledged. If an error has occurred, the read pointer is reset at the position stored previously and the burst transfer is repeated. If no error has occurred, the next burst transfer is executed and the read pointer is restored accordingly. To prevent the write pointer from arriving at a current burst transfer and thus overwriting values which might still be needed in a repeat of the burst transfer, the full status of the FIFOs is determined by comparing the stored read pointer with the write pointer.

IO-FIFOs and/or FIFOs for managing burst transfers may preferably be expanded to incoming read data using the function of address assignment, which is known from the interface modules. Incoming read data may also be assigned the IOID which is preferably stored in the FIFOs together with the addresses. Through the assignment of the IOID to incoming read data, the assignment of the read data to the corresponding interface modules is possible by switching the multiplexers according to the IOIDs, for example.

According to the present invention, it is possible to use certain bus systems and/or to design bus systems in different ways. This is described in further detail below. Depending on the design, different bus systems may be used between the individual units, in particular the interface modules, the IO-FIFOs, the protocol converters, and a different bus system may be implemented between each of two units. Different designs are implementable, the functions of a plurality of designs being combinable within one design. A few design options are described below.

The simplest possible design is a direct connection of two units.

In an expanded embodiment, multiplexers are provided between the units, which may have different designs. This example embodiment is preferred in particular when using a plurality of the particular units.

A multiplex function may be obtained using a configurable bus, which is configurable by a higher-level configuration unit (CT), specifically for a period of time for the connection of certain units.

In an example embodiment, the connections are defined by selectors which decode a portion of an address and/or an IOID, for example, by triggering the multiplexers for the interconnection of the units. In a particularly preferred embodiment, the selectors are designed in such a way that a plurality of units may select a different unit at the same time, each of the units being arbitrated for selection in chronological sequence. An example of a suitable bus system is described in, e.g., German Patent Application No. DE 199 26 538.0. Additional states may be used for arbitration. For example, data transfers between the interface modules and the IO-FIFOs may be optimized as follows:

In each case one block of a defined size of data to be transmitted is combined within the FIFO stages. As soon as a block is full/empty, a bus access is signaled to the arbiter for transmitting the data. Data is transmitted in a type of burst transfer, i.e., the entire data block is transmitted by the arbiter during a bus allocation phase. In other words, a bus allocation may take place in a manner determined by FIFO states of the connected FIFOs, data blocks being used for the determination of state within a FIFO. If a FIFO is full, it may arbitrate the bus for emptying; if a FIFO is empty, it may arbitrate the bus for filling. Additional states may be provided, e.g., in flush, which is used for emptying only partially full FIFOs and/or for filling only partially empty FIFOs. For example, flush may be used in a change of configuration (reconfiguration).

In a preferred embodiment, the bus systems are designed as pipelines in order to achieve high data transfer rates and clock rates by using suitable register stages and may also function as FIFOs themselves, for example.

In a preferred embodiment, the multiplexer stage may also be designed as a pipeline.

According to the present invention, it is possible to connect a plurality of modules to one IO and to provide communication among the modules. In this regard, the following should be pointed out:

configuration modules which include a certain function and are reusable and/or relocatable within the PA are described in, for example, German Patent Application Nos. DE 198 07 872.2, DE 199 26 538.0, and DE 100 28 397.7.

A plurality of these configuration modules may be configured simultaneously into the PA, dependently and/or independently of one another.

The configuration modules must be hardwired to a limited 10, which is typically provided in particular only at certain locations and is therefore not relocatable, in such a way that the configuration modules are able to use the IOs simultaneously and data is assigned to the correct modules. In addition, configuration modules that belong together (dependent) must be hardwired together in such a way that free relocation of the configuration modules is possible among one another in the PA.

Such a flexible design is in most cases not possible through the conventional networks (see, e.g., German Patent Nos. P 44 16 881.0, 02, 03, 08), because this network must usually be explicitly allocated and routed through a router.

German Patent Application No. DE 197 04 742.4 describes a method of constructing flexible data channels within a PAE matrix according to the algorithms to be executed so that a direct connection through and in accordance with a data transmission is created and subsequently dismantled again. Data to be transmitted may be precisely assigned to one source and/or one destination.

In addition and/or as an alternative to German Patent Application No. DE 197 04 742.4 and the procedures and configurations described therein, additional possibilities are now provided through the present invention, and methods (hereinafter referred to jointly as GlobalTrack) that permit flexible allocation and interconnection during run time may be used, e.g., serial buses, parallel buses and fiber optics, each with suitable protocols (e.g., Ethernet, Firewire, USB). Reference is made here explicitly to transmission by light using a light-conducting substrate, in particular with appropriate modulation for decoupling of the channels. Another particular feature of the present invention with respect to memory addressing, in particular paging and MMU options, is described below.

Data channels of one or multiple GlobalTracks may be connected via mediating nodes to an ordinary network, e.g., according to German Patent Nos. P 44 16 881.0, 02, 03, 08. Depending on the implementation, the mediating nodes may be configured differently in the PA, e.g., assigned to each PAE, to a group and/or hierarchy of PAEs, and/or to every $n^{th}$ PAE.

In a particularly preferred embodiment, all PAEs, interface modules, etc., have a dedicated connection to a GlobalTrack.

A configuration module is designed in such a way that it has access to one or a plurality of these mediating nodes.

A plurality of configuration modules among one another and/or configuration modules and IOs may now be connected via the GlobalTrack. With proper implementation (e.g., German Patent Application No. DE 197 04 742.4) a plurality of connections may now be established and used simultaneously. The connection between transmitters and receivers may be established in an addressed manner to permit individual data transfer. In other words, transmitters and receivers are identifiable via GlobalTrack. An unambiguous assignment of transmitted data is thus possible.

Using an expanded IO, which also transmits the transmitter address and receiver address—as is described in German Patent Application No. DE 101 10 530.4, for example—and the multiplexing methods described in German Patent Application No. DE 196 54 595.1, data for different modules may be transmitted via the IO and may also be assigned unambiguously.

In a preferred embodiment, data transfer is synchronized by handshake signals, for example. In addition, data transfer may also be pipelined, i.e., via a plurality of registers implemented in the GlobalTrack or assigned to it. In a very complex design for large-scale VPUs or for their interconnection, a GlobalTrack may be designed in a network topology using switches and routers; for example, Ethernet could be used.

It should be pointed out that different media may be used for GlobalTrack topologies, e.g., the method described in German Patent Application No. DE 197 04 742.4 for VPU-internal connections and Ethernet for connections among VPUs.

Memories (e.g., RAM-PAEs) may be equipped with an MMU-like paging method. For example, a large external memory could then be broken down into segments (pages), which in the case of data access within a segment would be loaded into one of the internal memories and, at a later point in time, after termination of data access, would be written back into the external memory.

In a preferred embodiment, addresses sent to a (internal) memory are broken down into an address area, which is within the internal memory (MEMADR) (e.g., the lower 10 bits in a 1,024-entry memory) and a page address (the bits above the lower 10). The size of a page is thus determined by MEMADR.

The page address is compared with a register (page register) assigned to the internal memory. The register stores the value of the page address last transferred from a higher-level external (main) memory into the internal memory.

If the page address matches the page register, free access to the internal memory may take place. If the address does not match (page fault), the current page content is written, preferably linearly, into the external (main) memory at the location indicated by the page register.

The memory area in the external (main) memory (page) which begins at the location of the current new page address is written into the internal memory.

In a particularly preferred embodiment, it is possible to specify by configuration whether or not, in the event of a page fault, the new page is to be transferred from the external (main) memory into the internal memory.

In a particularly preferred embodiment, it is possible to specify by configuration whether or not, in the event of a page fault, the old page is to be transferred from the internal memory into the external (main) memory.

The comparison of the page address with the page register preferably takes place within the particular memory. Data transfer control in the event of page faults may be configured accordingly by any PAEs and/or may take place via DMAs (e.g., in the interface modules or external DMAs). In a particularly preferred embodiment, the internal memories are designed as active memories having integrated data transfer control (see, e.g., German Patent Application No. DE 199 26 538.0).

In another possible embodiment, an internal memory may have a plurality (p) of pages, the size of a page then preferably being equal to the size of the memory divided by p. A translation table (translation look-aside buffer=TLB) which is preferably designed like a fully associative cache replaces the page register and translates page addresses to addresses in the internal memory; in other words, a virtual address may be translated into a physical address. If a page is not included in the translation table (TLB), a page fault occurs. If the translation table has no room for new additional pages, pages may be transferred from the internal memory into the external (main) memory and removed from the translation table so that free space is again available in the internal memory.

It should be pointed out explicitly that a detailed discussion is not necessary because a plurality of conventional MMU methods may be used and may be used with only minor and obvious modifications.

The possibility of providing a collector memory, as it is known, has been mentioned above. In this regard, the following details should also be mentioned.

A collector memory (collector) capable of storing larger volumes of data may be connected between the interface modules and IO-FIFOs.

The collector may be used for exchanging data between the interface modules, i.e., between memories assigned to the array (e.g., RAM-PAEs).

The collector may be used as a buffer between data within a reconfigurable module and external data.

A collector may function as a buffer for data between different reconfiguration steps; for example, it may store data of different configurations while different configurations are active and are being configured. At deactivation of configurations, the collector stores their data, and data of the newly configured and active configurations is transmitted to the PA, e.g., to memories assigned to the array (RAM-PAEs).

A plurality of interface modules may have access to the collector and may manage data in separate and/or jointly accessible memory areas.

In a preferred embodiment, the collector may have multiple terminals for interface modules, which may be accessed simultaneously (i.e., it is designed as a multi-port collector device).

The collector has one or more terminals to an external memory and/or external peripherals. These terminals may be connected to the IO-FIFOs in particular.

In an expanded embodiment, processors assigned to the VPU, such as DSPs, CPUs and microcontrollers, may access the collector. This is preferably accomplished via another multi-port interface.

In a preferred embodiment, an address translation table is assigned to the collector. Each interface may have its own address translation table or all the interfaces may share one address translation table. The address translation table may be managed by the PA and/or a CT and/or an external unit. The address translation table is used to assign collector memory areas to any addresses and it operates like an MMU system. If an address area (page) is not present within the collector (pagemiss), this address area may be loaded into the collector from an external memory. In addition, address areas (pages) may be written from the collector into the external memory.

For data transfer to or between the external memory, a DMA is preferably used. A memory area within the collector may be indicated to the DMA for reading or writing transmission; the corresponding addresses in the external memory may be indicated separately or preferably removed by the DMA from the address translation table.

A collector and its address generators (e.g., DMAs) may preferably operate according to or like MMU systems, which are conventional for processors according to the related art. Addresses may be translated by using translation tables (TLB) for access to the collector. According to the present invention, all MMU embodiments and methods described for internal memories may also be used on a collector. The operational specifics will not be discussed further here because they correspond to or closely resemble the related art.

In an expanded or preferred embodiment, a plurality of collectors may be implemented.

According to the present invention, it is possible to optimize access to memory. The following should be pointed out in this regard:

One basic property of the preferred reconfigurable VPU architecture PACT-XPP is the possibility of superimposing reconfiguration and data processing (see, e.g., German Patent No. P 44 16 881.0, and German Patent Application Nos. DE 196 51 075.9, DE 196 54 846.2, DE 196 54 593.5, DE 198 07 872.2, DE 199 26 538.0, DE 100 28 397.7, DE 102 06 857.7). In other words, for example:

a) the next configuration may already be preloaded during data processing; and/or
b) data processing in other already-configured elements may already begin while a number of configurable elements or certain configurations are not yet configured or are in the process of being configured; and/or
c) the configuration of various activities is superimposed or decoupled in such a way that they run with a mutual time offset at optimum performance (see 8.1 address generation).

Modern memory protocols (e.g., SDRAM, DDRAM, RAMBUS) usually have the following sequence or a sequence having a similar effect, but steps 2 and 3 may possibly also occur in the opposite order:
1. Initializing access with the address given;
2. A long latency;
3. Rapid transmission of data blocks, usually as a burst.

This property may be utilized in a performance-efficient manner in VPU technology. For example, it is possible to separate the steps of computation of the address(es), initialization of memory access, data transfer and data processing in the array (PA) in such a way that different (chronological) configurations occur, so that largely optimum superimposing of the memory cycles and data processing cycles may be achieved. Multiple steps may also be combined, depending on the application.

For example, the following method corresponds to this principle:

The application AP, which includes a plurality of configurations (ap=1, 2, . . . , z), is to be executed. Furthermore, additional applications/configurations which are combined under WA are to be executed on the VPU:
1. Read addresses are first computed (in an ap configuration of AP) and the data transfers and IO-FIFOs are initialized;
2. Data transmitted for AP and now present in IO-FIFOs is processed (in an (ap+1) configuration) and, if necessary, stored in FIFOs, buffers or intermediate memories, etc.;
2a. Computation of results may require a plurality of configuration cycles (n) at the end of which the results are stored in an IO-FIFO, and
3. The addresses of the results are computed and the data transfer is initialized; this may take place in parallel or later in the same configuration or in an (ap+n+2) configuration; at the same time or with a time offset, data is then written from the IO-FIFOs into the memories.

Between the steps, any configuration from WA may be executed, e.g., when a waiting time is necessary between steps, because data is not yet available.

Likewise, in parallel with the processing of AP, configurations from WA may be executed during the steps, e.g., if AP does not use the resources required for WA.

It will be self-evident to those skilled in the art that variously modified embodiments of this method are also possible.

In one possible embodiment, the processing method may take place as shown below (Z marks a configuration cycle, i.e., a unit of time):

| Z | Configuration AP | Other configurations (WA) Any other configurations and/or data processing, read/write processes using IO-FIFOs and/or RAM-PAEs in other resources or time-multiplexed resources via configuration cycles |
|---|---|---|
| 1 | Compute read addresses, initialize access | |
| 2 | Input of data | |
| 3 + k | Process data (if necessary in a plurality of (k) configuration cycles) | |
| 4 + k | Compute write addresses, initialize access | |
| 5 + k | Output of data | |

This sequence may be utilized efficiently by the data processing method described in, for example, German Patent Application No. DE 102 02 044.2 in particular.

The methods and devices described above are preferably operated using special compilers, which are expanded in particular in comparison with traditional compilers. The following should be pointed out in this regard:

For generating configurations, compilers that run on any computer system are used. Typical compilers include, for example, C-compilers and/or even NML compilers for VPU technology, for example. Particularly suitable compiler methods are described in German Patent Application Nos. DE 101 39 170.6, and DE 101 29 237.6, and European Patent No. EP 02 001 331.4, for example.

The compiler, at least partially, preferably takes into account the following particular factors: Separation of addressing into
1. external addressing, i.e., data transfers with external modules,
2. internal addressing, i.e., data transfers among PAEs, in particular between RAM-PAEs and ALU-PAEs,
3. in addition, time decoupling also deserves special attention.

Bus transfers are broken down into internal and external transfers.
bt1) External read accesses are separated and, in one possible embodiment, they are also translated into a separate configuration. Data is transmitted from an external memory to an internal memory.
bt2) Internal accesses are coupled to data processing, i.e., internal memories are read and/or written for data processing.
bt3) External write accesses are separated and, in one possible embodiment, they are also translated into a separate configuration. Data is transmitted from an internal memory into an external memory.

bt1, bt2, and bt3 may be translated into different configurations which may, if necessary, be executed at a different point in time.

This method will now be illustrated on the basis of the following example:
function example (a, b: integer)->x: integer
for i:=1 to 100
for j:=1 to 100
x[i]:=a[i]*b[j].
This function is transformed by the compiler into three parts, i.e., configurations (subconfig): example#dload: Loads data from externally (memories, peripherals, etc.) and writes it into internal memories. Internal memories are indicated by r# and the name of the original variable.
example#process: Corresponds to the actual data processing. This reads data out of internal operands and writes the results back into internal memories.
example#dstore: Writes the results from the internal memory into externally (memories, peripherals, etc.).
function example# (a, b: integer)->x: integer
subconfig example#dload
for i:=1 to 100
r#a[i]:=a[i]
for j:=1 to 100
r#b[j]:=b[j]
subconfig example#process
for i:=1 to 100
for j:=1 to 100
r#x[i]:=r#a[i]*r#b[j]
subconfig example#dstore
for i:=1 to 100
x[i]:=r#x[i].

An effect of the example method is that instead of i*j=100*100=10,000 external accesses, only i+j=100+100=200 external accesses are performed for reading the operands. These accesses are also completely linear, which greatly accelerates the transfer rate in modern bus systems (burst) and/or memories (SDRAM, DDRAM, RAMBUS, etc.).

Internal memory accesses take place in parallel, because different memories have been assigned to the operands.

For writing the results, i=100 external accesses are necessary and may again be performed linearly at maximum performance.

If the number of data transfers is not known in advance (e.g., WHILE loop) or is very large, a method may be used which reloads the operands as necessary through subprogram call instructions and/or writes the results externally. In a preferred embodiment, the states of the FIFOs may (also) be queried: "empty" if the FIFO is empty and "full" if the FIFO is full. The program flow responds according to the states. It should be pointed out that certain variables (e.g., ai, bi, xi) are defined globally. For performance optimization, a scheduler may execute the configurations example#dloada, example#dloadb before calling up example#process according to the methods already described, so that data is already preloaded. Likewise, example#dstore(n) may still be called up after termination of example#process in order to empty r#x.
subconfig example#dloada(n)
while !full(r#a) AND ai<=n
r#a[ai]:=a[ai]
ai++
subconfig example#dloadb(n)
while !full(r#b) AND bi<=n
r#b[bi]:=b[bi]
bi++
subconfig example#dstore (n)
while !empty(r#x) AND xi<=n
x[xi]:=r#x[xi]
xi++
subconfig example#process
for i:=1 to n
for j:=1 to m
if empty(r#a) then example#dloada(n)
if empty(r#b) then example#dloadb(m)
if full(r#x) then example#dstore(n)
r#x[i]:=r#a[i]+r#b[j]
bj:=1.

The subprogram call instructions and managing of the global variables are comparatively complex for reconfigurable architectures. Therefore, in a preferred embodiment, the following optimization may be performed; in this optimized method, all configurations are run largely independently and are terminated after being completely processed (terminate). Since data b[j] is required repeatedly, example#dloadb must accordingly be run through repeatedly. To do so, for example, two alternatives will be described:

Alternative 1: example#dloadb terminates after each run-through and is reconfigured for each new start by example#process.

Alternative 2: example#dloadb runs infinitely and is terminated by example#process.

While "idle," a configuration is inactive (waiting).
subconfig example#dloada(n)
for i:=1 to n
while full(r#a)
idle
r#a[i]:=a[i]
terminate
subconfig example#dloadb(n)
while 1//ALTERNATIVE 2
for i:=1 to n
while full(r#b)
idle
r#b[i]:=a[i]
terminate
subconfig example#dstore(n)
for i:=1 to n
while empty(r#b)
idle
x[i]:=r#x[i]
terminate
subconfig example#process
for i:=1 to n
for j:=1 to m
while empty(r#a) or empty(r#b) or full(r#x)
idle
r#x[i]:=r#a[i]*r#b[j]
config example#dloadb(n)//ALTERNATIVE 1
terminate example#dloadb(n)//ALTERNATIVE 2
terminate To avoid waiting cycles, configurations may also be terminated as soon as they are temporarily no longer able to continue fulfilling their function. The corresponding configuration is removed from the reconfigurable module but remains in the scheduler. Therefore, the "reenter" instruction is used for this below. The relevant variables are saved before termination and are restored when configuration is repeated:
subconfig example#dloada(n)
for ai:=1 to n
if full(r#a) reenter
r#a[ai]:=a[ai]
terminate
subconfig example#dloadb(n)
while 1//ALTERNATIVE 2
for bi:=1 to n
if full(r#b) reenter
r#b[bi]:=a[bi]
terminate
subconfig example#dstore(n)
for xi:=1 to n
if empty(r#b) reenter
x[xi]:=r#x[xi]
terminate
subconfig example#process

```
for i:=1 to n
for j:=1 to m
if empty(r#a) or empty(r#b) or full(r#x) reenter
r#x[i]:=r#a[i]*r#b[j]
config example#dloadb(n)//ALTERNATIVE 1
terminate example#dloadb(n)//ALTERNATIVE 2
terminate
```

With regard to the preceding discussion and to the following, the possibility of using a 'context switch' according to the present invention should also be pointed out. In this regard, the following should be noted:

Repeated start of configurations, e.g., "reenter," requires that local data (e.g., ai, bi, xi) be backed up and restored. Known related-art methods provide explicit interfaces to memories or to a CT to transmit data. All of these methods may be inconsistent and/or may require additional hardware.

The context switch according to the present invention is implemented in such a way that a first configuration is removed; data to be backed up remains in the corresponding memories (REGs) (memories, registers, counters, etc.).

A second configuration is loaded; this connects the REGs in a suitable manner and in a defined sequence to one or multiple global memory (memories).

The configuration may use address generators, for example, to access the global memory (memories).

The configuration may use address generators, for example, to access REGs designed as memories.

According to the configured connection between the REGs, the contents of the REGs are written into the global memory in a defined sequence, the particular addresses being predetermined by address generators. The address generator generates the addresses for the global memory (memories) in such a way that the memory areas (PUSHAREA) that have been written are unambiguously assigned to the first configuration removed.

In other words, different address areas are preferably provided for different configurations.

The configuration corresponds to a PUSH of ordinary processors.

Other configurations subsequently use the resources.

The first configuration is to be started again, but first a third configuration which connects the REGs of the first configuration in a defined sequence is started.

The configuration may use address generators, for example, to access the global memory or memories. The configuration may use address generators, for example, to access REGs designed as memories.

An address generator generates addresses, so that correct access to the PUSHAREA assigned to the first configuration takes place. The generated addresses and the configured sequence of the REGs are such that data of the REGs is written from the memories into the REGs in the original order. The configuration corresponds to a POP of ordinary processors.

The first configuration is restarted.

In summary, a context switch is implemented in such a way that data to be backed up is exchanged with a global memory by loading particular configurations which operate like processor architectures known from PUSH/POP.

There is also the possibility of providing a special task switch and multiconfiguration handling.

In a preferred mode of operation, different data blocks of different configurations may be partitioned. These partitions may be accessed in a time-optimized manner by preloading a portion of the operands of a subsequent configuration P from external (main) memories and/or other (peripheral) data streams into the internal memories, e.g., during execution of a configuration Q, and during the execution of P, the results of Q as a portion of the total result from the internal memories are written into external (main) memories and/or other (peripheral) data streams.

The functioning here differs considerably from that described in, for example, U.S. Pat. No. 6,341,318. A data stream or data block is preferably decoupled by a FIFO structure (e.g., IO-FIFO). Different data streams or data blocks of different configurations in particular are preferably decoupled by different memories and/or FIFO areas and/or assignment marks in the FIFOs.

The optional MMU methods described above may be used for decoupling and buffering external data. In one type of application, a large external data block may be broken down into a plurality of segments, each may be processed within a VPU.

In an additional preferred mode of operation, different data blocks of different configurations may be broken down into partitions according to the method described above, these partitions now being defined as pages for an MMU. In this way, time-optimized access is possible by preloading the operands of a subsequent configuration P as a page from external (main) memories and/or other (peripheral) data streams into the internal memories, e.g., during execution of a configuration Q in the PA, and during the execution of P, the results of Q as a page from the internal memories are written into external (main) memories and/or other (peripheral) data streams.

For the methods described above, preferably internal memories capable of managing a plurality of partitions and/or pages are used.

These methods may be used for RAM-PAEs and/or collector memories.

Memories having a plurality of bus interfaces (multi-port) are preferably used to permit simultaneous access of MMUs and/or the PA and/or additional address generators/data transfer devices.

In one embodiment, identifiers are also transmitted in the data transfers, permitting an assignment of data to a resource and/or an application. For example, the method described in German Patent Application No. DE 101 10 530.4 may be used. Different identifiers may also be used simultaneously.

In a particularly preferred embodiment, an application identifier (APID) is also transmitted in each data transfer along with the addresses and/or data. An application includes a plurality of configurations. On the basis of the APID, the transmitted data is assigned to an application and/or to the memories or other resources (e.g., PAEs, buses, etc.) intended for an application. To this end, the APIDs may be used in different ways.

Interface modules, for example, may be selected by APIDs accordingly.

Memories, for example, may be selected by APIDs accordingly.

PAEs, for example, may be selected by APIDs accordingly.

For example, memory segments in internal memories (e.g., RAM-PAEs, collector(s)) may be assigned by APIDs. To do so, the APIDs, like an address part, may be entered into a TLB assigned to an internal memory so that a certain memory area (page) is assigned and selected as a function of an APID.

This method yields the possibility of efficiently managing and accessing data of different applications within a VPU.

There is the option of explicitly deleting data of certain APIDs (APID-DEL) and/or writing into external (main) memories and/or other (peripheral) data streams (APID-FLUSH). This may take place whenever an application is terminated. APID-DEL and/or APID-FLUSH may be triggered by a configuration and/or by a higher-level loading unit (CT) and/or externally.

The following processing example is presented to illustrate the method.

An application Q (e.g., APID=Q) may include a configuration for reading operands (e.g., ConfigID=j), a configuration for processing operands (e.g., ConfigID=w), and a configuration for writing results (e.g., ConfigID=s).

Configuration j is executed first to read the operands chronologically optimally decoupled. Configurations of other applications may be executed simultaneously. The operands are written from external (main) memories and/or (peripheral) data streams into certain internal memories and/or memory areas according to the APID identifier.

Configuration w is executed to process the stored operands. To do so, the corresponding operands in the internal memories and/or memory areas are accessed by citation of APIDs. Results are written into internal memories and/or memory areas accordingly by citation of APIDs. Configurations of other applications may be executed simultaneously. In conclusion, configuration s writes the stored results from the internal memories and/or memory areas into external (main) memories and/or other (peripheral) data streams. Configurations of other applications may be executed simultaneously.

To this extent, the basic sequence of the method corresponds to that described above for optimization of memory access.

If data for a certain APID is not present in the memories or if there is no longer any free memory space for this data, a page fault may be triggered for transmission of the data.

While a module was initially assumed in which a field of reconfigurable elements is provided having little additional wiring, such as memories, FIFOs, and the like, it is also possible to use the ideas according to the present invention for systems known as "systems on a chip" (SoC). For SoCs the terms "internal" and "external" are not completely applicable in the traditional terminology, e.g., when a VPU is linked to other modules (e.g., peripherals, other processors, and in particular memories) on a single chip. The following definition of terms may then apply; this should not be interpreted as restricting the scope of the invention but instead is given only as an example of how the ideas of the present invention may be applied with no problem to constructs which traditionally use a different terminology:

internal: within a VPU architecture and/or areas belonging to the VPU architecture and IP, external: outside of a VPU architecture, i.e., all other modules, e.g., peripherals, other processors, and in particular memories on a SoC and/or outside the chip in which the VPU architecture is located.

A preferred embodiment will now be described.

In a particularly preferred embodiment, data processing PAEs are located and connected locally in the PA (e.g., ALUs, logic, etc.). RAM-PAEs may be incorporated locally into the PA, but in a particularly preferred embodiment they are remote from the PA or are placed at its edges (see, e.g., German Patent Application No. DE 100 50 442.6). This takes place so as not to interfere with the homogeneity of the PA in the case of large RAM-PAE memories, where the space required is much greater than with ALU-PAEs and because of a gate/transistor layout (e.g., GDS2) of memory cells, which usually varies greatly. If the RAM-PAEs have dedicated connections to an external bus system (e.g., global bus), they are preferably located at the edges of a PA for reasons of layout, floor plan, and manufacturing.

The configurable bus system of the PA is typically used for the physical connection.

In an expanded embodiment, PAEs and interface modules, as well as additional configurable modules, if necessary, have a dedicated connection to a dedicated global bus, e.g., a GlobalTrack.

Interface modules and in particular protocol converters are preferably remote from the PA and are placed outside of its configuration. This takes place so as not to interfere with the homogeneity of the PA and because of a gate/transistor layout (e.g., GDS2) of the interface modules/protocol converters, which usually varies greatly. In addition, the connections to external units are preferably placed at the edges of a PA for reasons of layout, floor plan, and manufacturing. The interface modules are preferably connected to the PA by the configurable bus system of the PA, the interface modules being connected to its outer edges. The bus system allows data exchange to take place configurably between interface modules and any PAEs within the PA. In other words, within one or different configurations, some interface modules may be connected to RAM-PAEs, for example, while other interface modules may be connected to ALU-PAEs, for example.

The IO-FIFOs are preferably integrated into the protocol converter. To permit a greater flexibility in the assignment of the internal data streams to the external data streams, the interface modules and protocol converters are designed separately and are connected via a configurable bus system.

The present invention is explained in greater detail below only as an example and in a nonrestrictive manner with reference to the drawings.

FIG. 1 shows a particularly preferred design of a reconfigurable processor which includes a core (array PA) (0103) including, for example, a configuration of ALU-PAEs (0101) (for performing computations) and RAM-PAEs (0102) (for saving data) and thus corresponds to the basic principle described in, for example, German Patent Application No. DE 196 54 846.2. The RAM-PAEs are preferably not integrated locally into the core, but instead are remote from the ALU-PAEs at the edges of or outside the core. This takes place so as not to interfere with the homogeneity of the PA in the case of large RAM-PAE memories where the space requirement is far greater than that of ALU-PAEs and because of a gate/transistor layout (e.g., GDS2) of memory cells which usually varies greatly. If the RAM-PAEs have dedicated connections to an external bus system (e.g., dedicated global bus; GlobalTrack; etc.), then they are preferably placed at the edges of a PA for reasons of layout, floor plan, and manufacturing.

The individual units are interlinked via bus systems (0104). Interface modules (interface modules and protocol converters, if necessary) (0105) are located at the edges of the core and are connected to external buses (IO), as similarly described in German Patent Application No. DE 196 54 595.1. The interface modules may have different designs, depending on the implementation, and may fulfill one or more of the following functions, for example:

1. Combining and synchronizing a plurality of bus systems to synchronize addresses and data for example,
2. Address generators and/or DMAs,
3. FIFO stages for decoupling data and/or addresses,
4. Interface controllers (e.g., for AMBA bus, RAMBUS, RapidIO, USB, DDRRAM, etc.).

FIG. 2 shows a different embodiment of the architecture according to the present invention, depicting a configuration 0201 of ALU-PAEs (PA) linked to a plurality of RAM-PAEs (0202). External buses (IOs) (0204) are connected via FIFOs (0203).

FIG. 2A shows a direct FIFO to PA coupling.

FIG. 2B shows the IO (0204) connected to 0201 via the RAM-PAEs (0202). The connection occurs typically via the configurable bus system 0104 or a dedicated bus system.

Multiplexers/demultiplexers (0205) switch a plurality of buses (0104) to the IOs (0204). The multiplexers are triggered by a configuration logic and/or address selector logic and/or an arbiter (0206). The multiplexers may also be triggered through the PA.

FIG. 2C corresponds to FIG. 2B, but FIFOs (0203) have been connected upstream from the IOs.

The diagrams in FIG. 3 correspond to those in FIG. 2, which is why the same reference numbers are used. FIG. 3 illustrates the preferred data processing method in a VPU. FIG. 3A: data passes through the IO (0204) into an input FIFO (0303 corresponding to 0203) and is loaded from this into the PA (0201) and/or beforehand into memory 0202.

FIGS. 3B-E show the data execution in which data is transmitted between the memories. During this period of time, the FIFOs may still transmit input data (0301) and/or output data (0302).

In FIG. 3F, data is loaded from the PA and/or from the memories into the output FIFO (0304).

It should be pointed out again that input of data from the input FIFO into the RAM-PAEs or 0201 and writing of data from 0201 or the RAM-PAEs may take place simultaneously.

It should likewise be pointed out that the input/output FIFOs are able to receive and/or send external data continuously during steps a-f.

Figure 4:
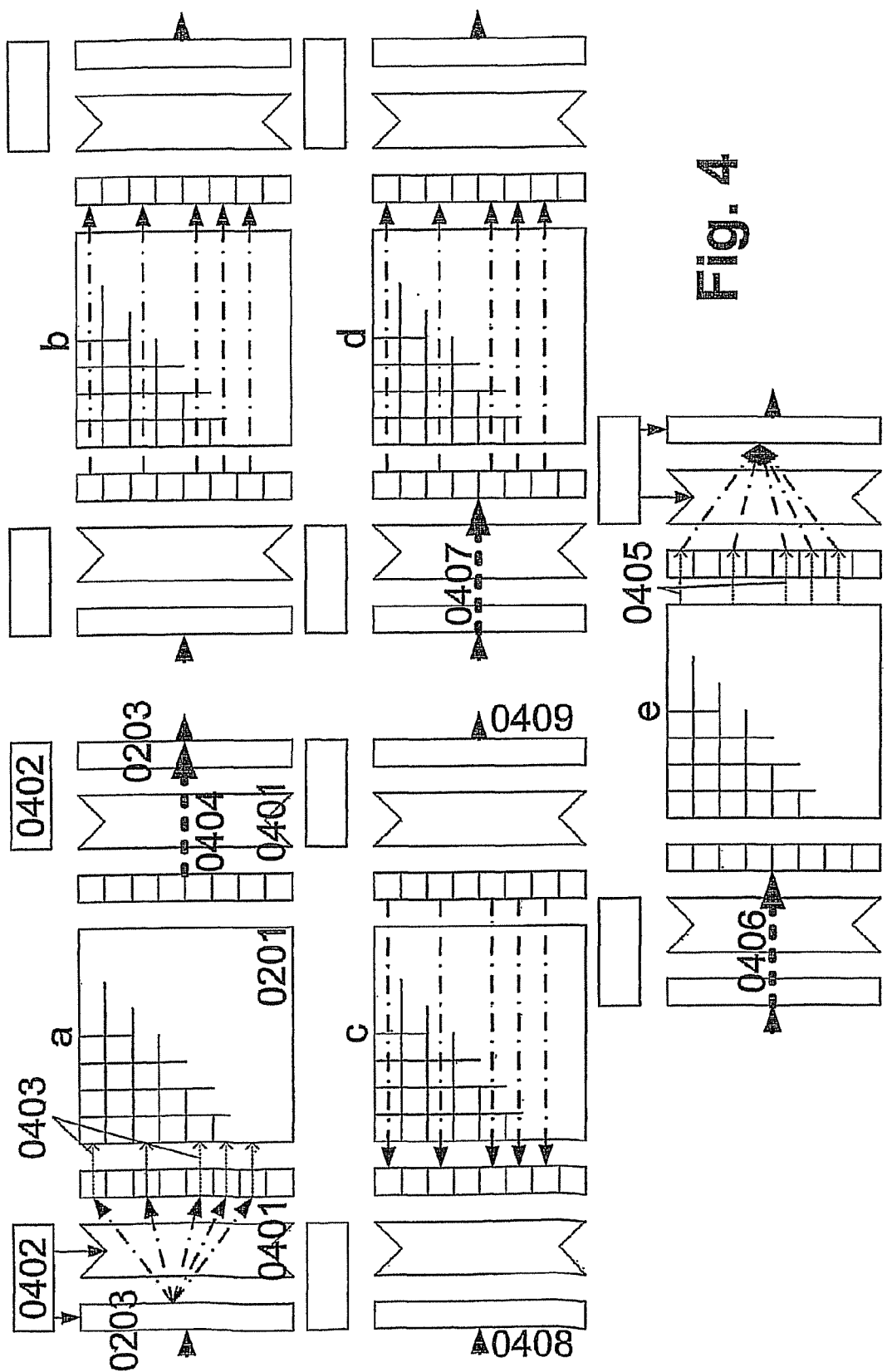
FIGS. 4A-4E show another example data processing method in a VPU.

FIG. 4 shows the same method in a slightly modified version in which multiplexers/demultiplexers (0401) are connected between the FIFOs and 0201 for simple data distribution. The multiplexers are triggered by a configuration logic and/or address selector logic and/or an arbiter (0402).

Multiple configurations take place for data processing (a-e).

The data may be read into memories and/or directly (0403) into the PA from the FIFOs (input FIFOs). During the input operation, data may be written from the PA and/or memories into FIFOs (output FIFOs) (0404). For data output, data may be written from the memories and/or directly (0405) from the PA into the FIFOs. Meanwhile, new data may be written from the input FIFOs into memories and/or the PA (0406).

New data (0407) may already be entered during a last configuration, for example.

During the entire processing, data may be transmitted from externally into the input FIFOs (0408) and/or from the output FIFOs to externally (0409).

Figure 5:
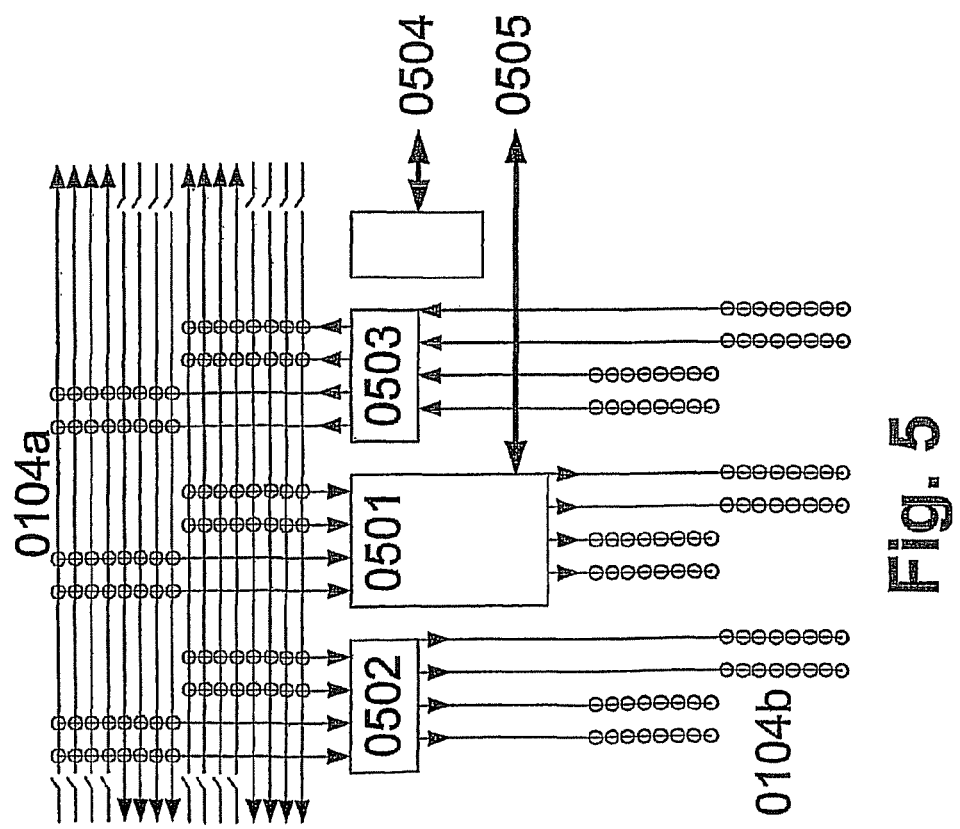
FIG. 5 shows an example embodiment of a PAE.

FIG. 5 shows a possible embodiment of a PAE. A first bus system (0104 a) is connected to a data processing unit (0501), the results of which are transmitted to a second bus system (0104 b). The vertical data transfer is carried over two register/multiplexer stages (FREG 0502, BREG 0503), each with a different transfer direction. Preferably simple ALUs, e.g., for addition, subtraction, and multiplex operations, may be integrated into the FREG/BREG. The unit is configured in its function and interconnection by a configuration unit (CT) via an additional interface (0504). In a preferred embodiment, there is the possibility of setting constants in registers and/or memories for data processing. In another embodiment, a configuration unit (CT) may read out data from the working registers and/or memories.

In an expanded embodiment, a PAE may additionally have a connection to a dedicated global bus (0505) (e.g., a Global-Track) and may thus communicate directly with a global, and if necessary also an external memory and/or peripheral unit, for example. In addition, a global bus may be designed so that different PAEs may communicate directly with one another via this bus, and in a preferred embodiment they may also communicate with modules for an external connection (e.g., interface modules). A bus system such as that described in German Patent Application No. DE 197 04 742.4, for example, may be used for such purposes.

The data processing unit (0501) may be designed for ALU-PAEs as an arithmetic logic unit (ALU), for example. Different ALU-PAEs may use different ALUs and bus connection systems. One ALU may have more than two bus connections to 0104 a and/or 0104 b, for example.

The data processing unit (0501) may be designed as a memory for RAM-PAEs, for example. Different RAM-PAEs may use different memories and bus connection systems. For example, a memory may have a plurality, in particular, more than two bus connections to 0104 a and/or 0104 b to allow access of a plurality of senders/receivers to one memory, for example. Accesses may preferably also take place simultaneously (multi-port).

The function of the memory includes, for example, the following functions or combinations thereof: random access, FIFO, stack, cache, page memory with MMU method.

In addition, in a preferred embodiment, the memory may be preloaded with data from the CT (e.g., constants, lookup tables, etc.). Likewise, in an expanded embodiment, the CT may read back data from the memory via 0504 (e.g., for debugging or for changing tasks).

In another embodiment, the RAM-PAE may have a dedicated connection (0505) to a global bus. The global bus connects a plurality of PAEs among one another and in a preferred embodiment also to modules for an external connection (e.g., interface modules). The system described in German Patent Application No. DE 197 04 742.4 may be used for such a bus system.

RAM-PAEs may be wired together in such a way that an n-fold larger memory is created from a plurality (n) of RAM-PAEs.

Figure 6:
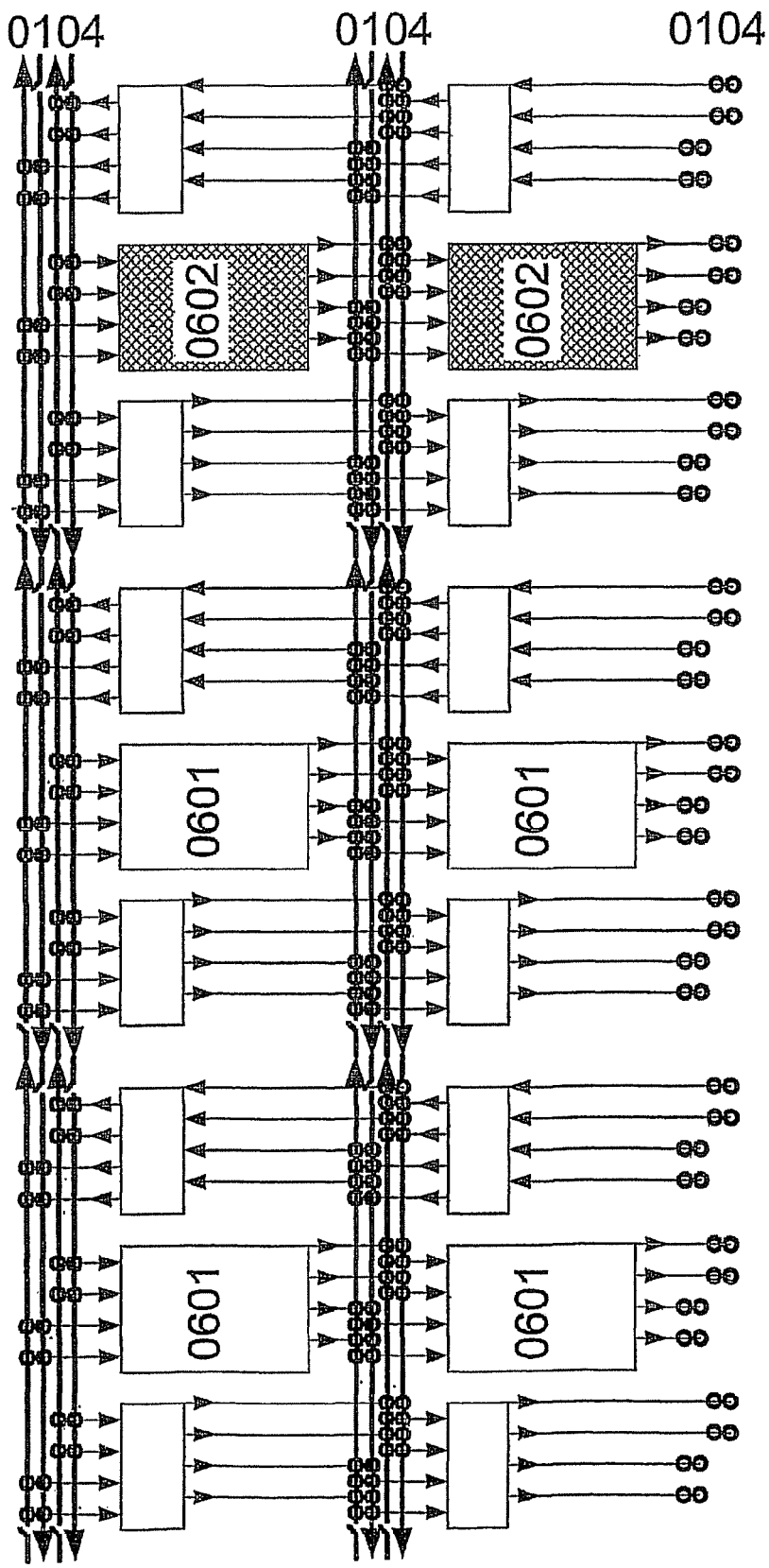
FIG. 6 shows an example of a wiring connection of ALU-PAEs and RAM-PAEs via a bus system.

FIG. 6 shows an example of a wiring connection of ALU-PAEs (0601) and RAM-PAEs (0602) via a bus system 0104. FIG. 1 shows a preferred example of a wiring connection for a reconfigurable processor.

FIG. 7 shows a simple embodiment variant of an IO circuit corresponding to 0105. Addresses (ADR) and data (DTA) are transmitted together with synchronization lines (RDY/ACK) between the internal bus systems (0104) and an external bus system (0703). The external bus system leads to IO-FIFOs and/or protocol converters, for example.

Figure 7B:
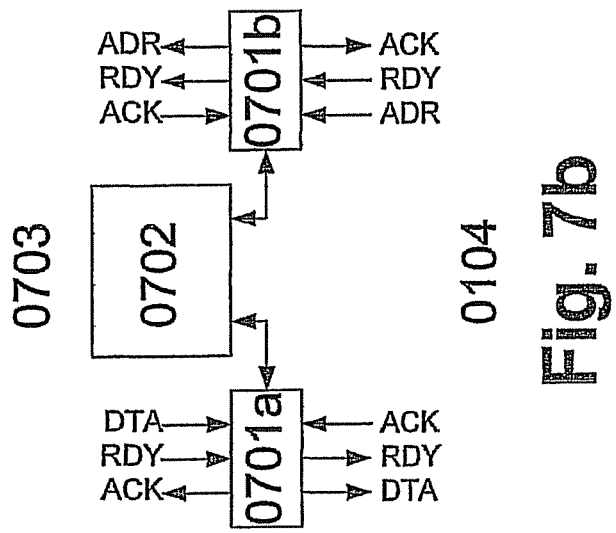
FIG. 7B shows a circuit for reading data.
Figure 7A:
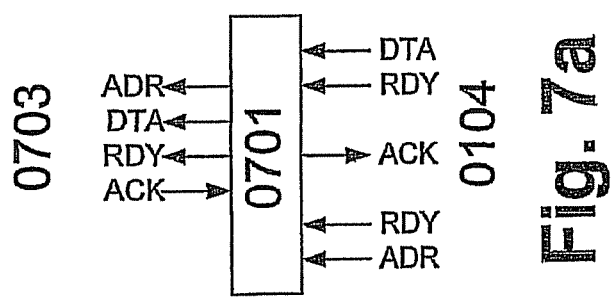
FIG. 7A shows a circuit for writing data.

FIG. 7A shows a circuit for writing data. The addresses and data arriving from 0104 are linked together (0701). A FIFO stage for decoupling may be provided between 0104 and 0703 in the interface circuit (0701).

FIG. 7B shows a circuit for reading data, in which an acknowledgment circuit (0702, e.g., FIFO, counter) is provided for coordinating the outgoing addresses with the incoming data. In 0701 a and/or in 0701 b, a FIFO stage for decoupling may be provided between 0104 and 0703. If a FIFO stage is provided in 0701 b, it may also be used for acknowledgment circuit 0702.

Figure 8:
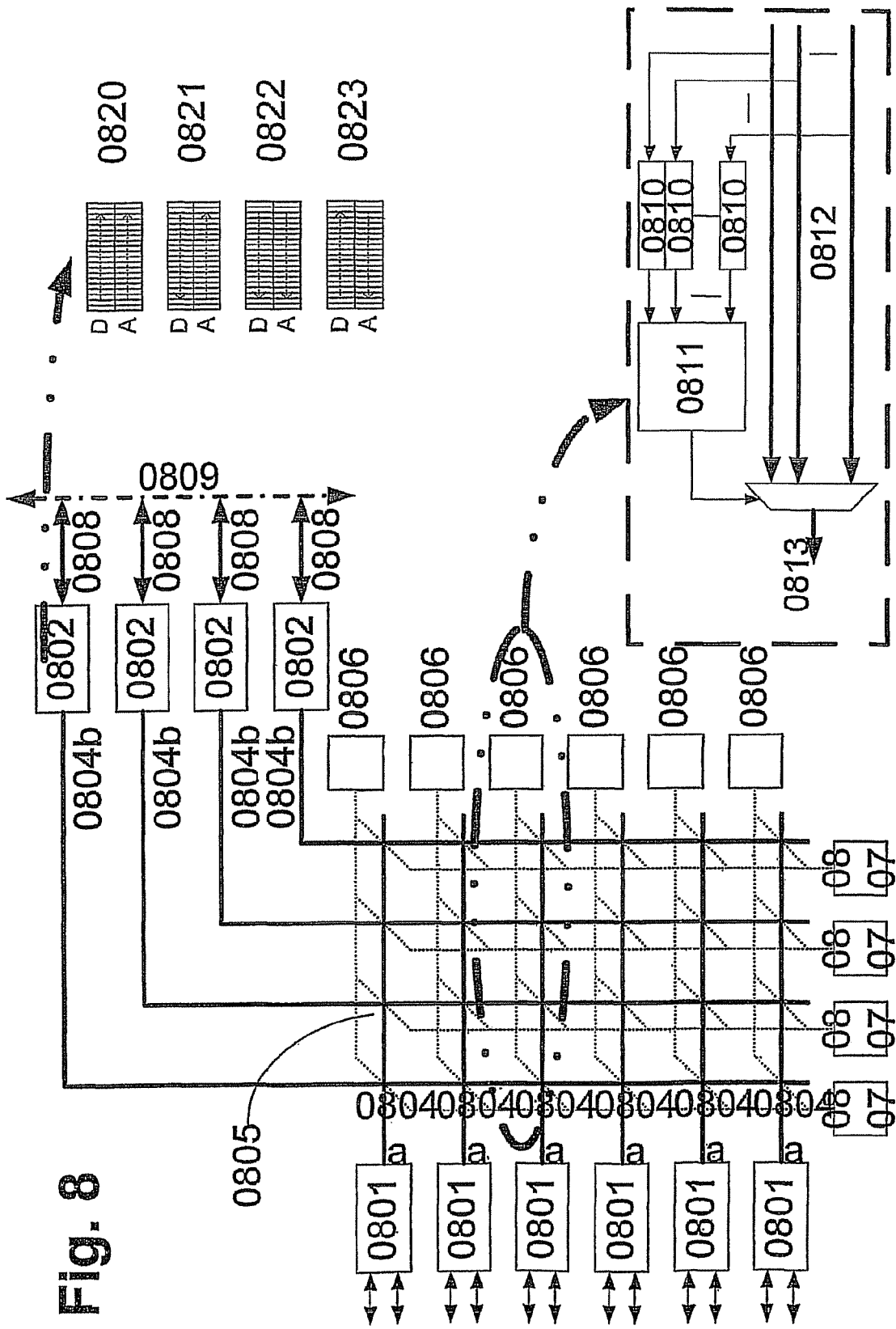
FIG. 8 shows an example connection between interface modules and/or PAEs to numerous and/or other data streams.

FIG. 8 shows a possible connection structure between interface modules and/or PAEs having a dedicated global bus (0801) and protocol converters (0802) to external (main) memories and/or other (peripheral) data streams. Interface modules are connected (0803) to a PA, preferably via their network according to 0104.

A bus system (0804 a, 0804 b) is provided between interface modules and/or PAEs having a dedicated global bus (0801) and protocol converters (0802). In a preferred embodiment, 0804 is able to transmit pipelined data over a plurality of register stages. 0804 *a* and 0804 *b* are interconnected via switches (e.g., 0805) which are designed as transmission gates and/or tristate buffers and/or multiplexers, for example. The multiplexers are triggered by rows and columns. Triggering units (0806) control the data transfer of the interface modules and/or PAEs having a dedicated global bus (0801) to the protocol converters (0802), i.e., in the transfer direction 0804 *a* to 0804 *b*. Triggering units (0807) control the data transfer of the protocol converters (0802) to the interface modules and/or the PAEs having a dedicated global bus (0801), i.e., in the transfer direction 0804 *b* to 0804 *a*. The triggering units (0806) each decode address areas for selection of the protocol converters (0802); the triggering units (0807) each decode IOIDs for selection of the interface modules and/or PAEs having a dedicated global bus (0801).

Triggering units may operate according to different types of triggering, e.g., fixed connection without decoding; decoding of addresses and/or IOIDs; decoding of addresses and/or IOIDs and arbitration. One or multiple data words/address words may be transmitted per arbitration. Arbitration may be performed according to different rules. The interface modules may preferably have a small FIFO for addresses and/or data in the output direction and/or input direction. A particular arbitration rule preferably arbitrates an interface module having a FULL FIFO or an EMPTY FIFO or a FIFO to be emptied (FLUSH), for example.

Triggering units may be designed as described in German Patent Application No. DE 199 26 538.0 (FIG. 32), for example. These triggering units may be used for 0807 or 0806. When used as 0806, 0812 corresponds to 0804 *a*, and 0813 corresponds to 0804 *b*. When used as 0807, 0812 corresponds to 0804 *b*, and 0813 corresponds to 0804 *a*. Decoders (0810) decode the addresses/IOIDs of the incoming buses (0812) and trigger an arbiter (0811), which in turn switches the incoming buses to an output bus (0813) via a multiplexer.

The protocol converters are coupled to external bus systems (0808), a plurality of protocol converters optionally being connected to the same bus system (0809), so that they are able to utilize the same external resources.

The IO-FIFOs are preferably integrated into the protocol converters, a FIFO (BURST-FIFO) for controlling burst transfers for the external buses (0808) being connected downstream from them if necessary. In a preferred embodiment, an additional FIFO stage (SYNC-FIFO) for synchronizing the outgoing addresses with the incoming data is connected downstream from the FIFOs.

Various programmable/configurable FIFO structures are depicted in 0820-0823, where A indicates the direction of travel of an address FIFO, D indicates the direction of travel of a data FIFO. The direction of data transmission of the FIFOs depends on the direction of data transmission and the mode of operation. If a VPU is operating as a bus master, then data and addresses are transmitted from internally to the external bus in the event of a write access (0820), and in the event of a read access (0821) addresses are transmitted from internally to externally and data from externally to internally.

If a VPU is operating as a bus slave, then data and addresses are transmitted from the external bus to internally in the event of a write access (0822) and in the event of a read access (0823) addresses are transmitted from externally to internally and data is transmitted from internally to externally.

In all data transfers, addresses and/or data and/or IOIDs and/or APIDs may be assigned and also stored in the FIFO stages.

In a particularly preferred embodiment, the transfer rate (operating frequency) of the bus systems 0104, 0804, and 0808/0809 may each be different due to the decoupling of the data transfers by the particular FIFO stages. In particular the external bus systems (0808/0809) may operate at a higher transfer rate, for example, than the internal bus systems (0104) and/or (0804).

Figure 9:
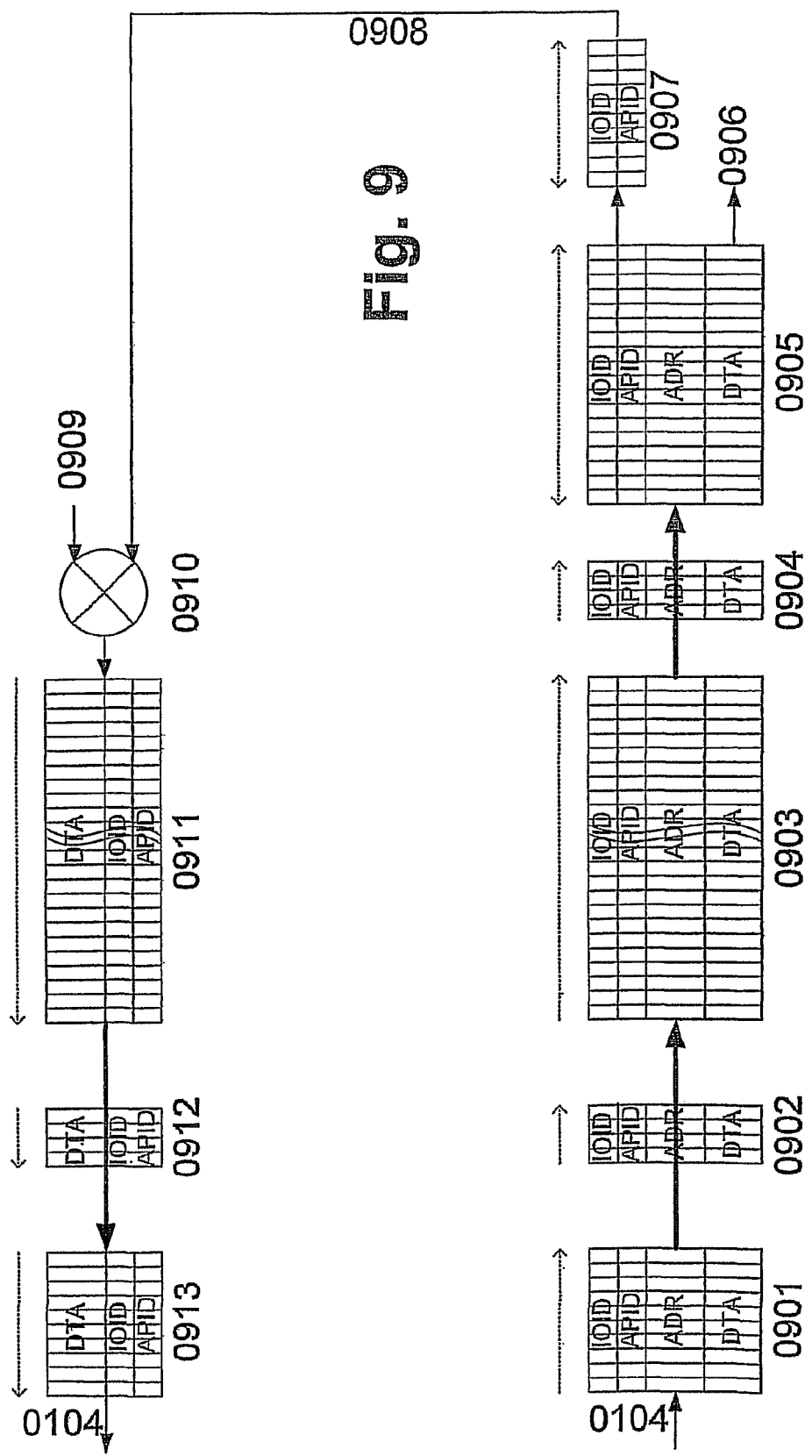
FIG. 9 shows an example sequence of a data read transfer via the circuit of FIG. 8.

FIG. 9 shows a possible sequence of a data read transfer via the circuit according to FIG. 8.

Addresses (preferably identifiers, e.g., with IOIDs and/or APIDs) are transmitted via internal bus system 0104 to interface modules and/or PAEs having a dedicated global bus, which preferably have an internal FIFO (0901). The addresses are transmitted to an IO-FIFO (0903) via a bus system (e.g., 0804) which preferably operates as a pipeline (0902). The addresses are transmitted to a BURST-FIFO (0905) via another bus (0904) which may be designed as a pipeline but which is preferably short and local. The BURST-FIFO ensures correct handling of burst transfers via the external bus system, e.g., for controlling burst addresses and burst sequences and repeating burst cycles when errors occur. IOIDs and/or APIDs of addresses (0906) which are transmitted via the external bus system may be transmitted together with the addresses and/or stored in an additional SYNC-FIFO (0907). The SYNC-FIFO compensates for the latency between the outgoing address (0906) and the incoming data (0909). Incoming data may be assigned IOIDs and/or APIDs (0908) of the addresses referencing them via the SYNC-FIFO (0910). Data (and preferably IOIDs and/or APIDs) is buffered in an IO-FIFO (0911) and is subsequently transmitted via a bus system (e.g., 0804), which preferably functions as a pipeline (0912), to an interface module and/or PAE having a dedicated global bus (0913), preferably including an internal FIFO. Data is transmitted from here to the internal bus system (0104).

Instead of to the IO-FIFO (0911), incoming data may optionally be directed first to a second BURST-FIFO (not shown), which behaves like BURST-FIFO 0905 if burst-error recovery is also necessary in read accesses. Data is subsequently relayed to 0911.

Figure 10:
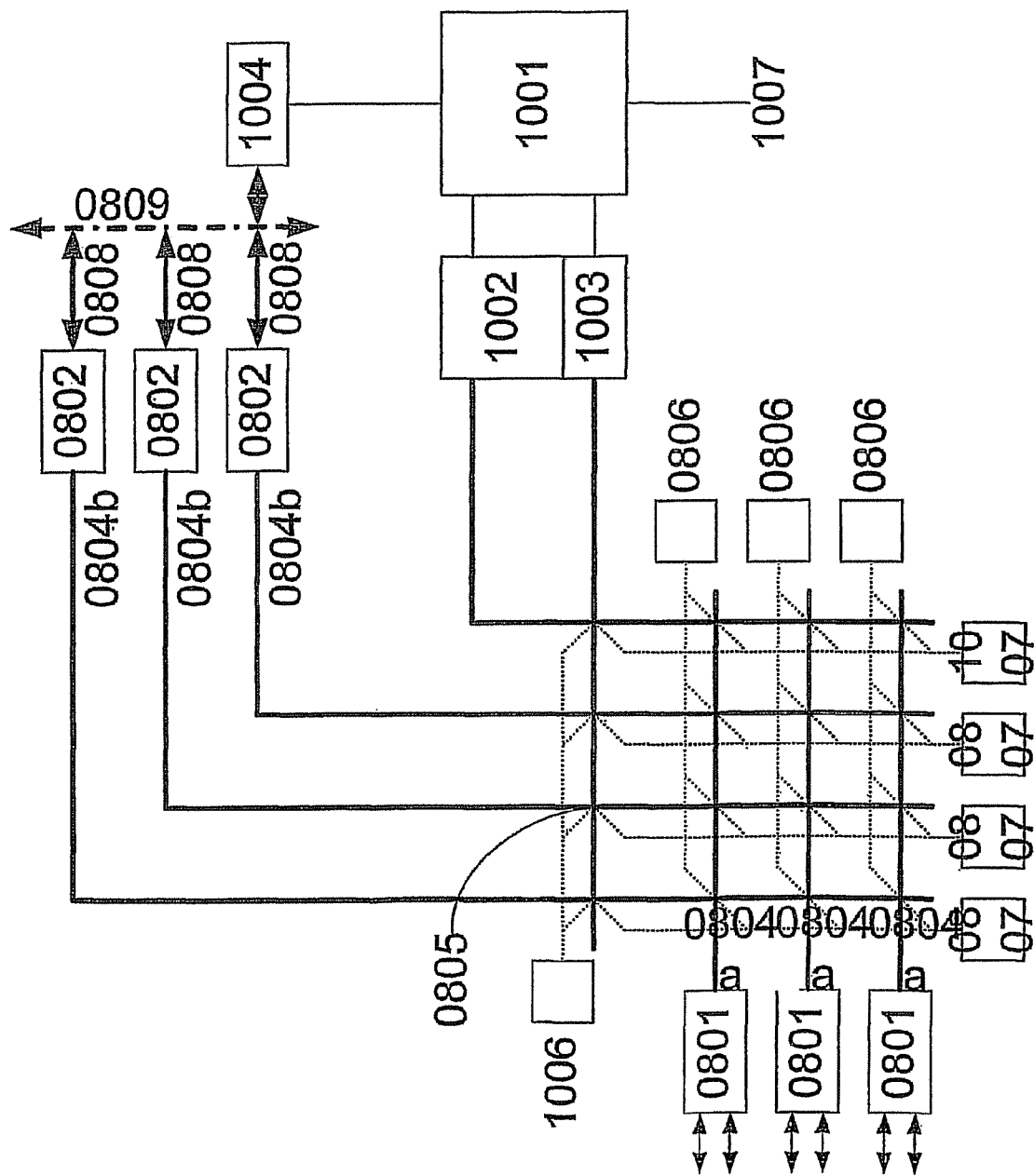
FIG. 10 shows example shows example interface module connections with data input and output via a collector, according to an example embodiment of the present invention.

FIG. 10 corresponds in principle to FIG. 8, which is why the same reference numbers have been used. In this embodiment, which is given as an example, fewer interface modules and/or PAEs having a dedicated global bus (0801) and fewer protocol converters (0802) to external (main) memories and/or other (peripheral) data streams are shown. In addition, a collector (1001) is shown which is connected to bus systems 0804 in such a way that data is written from the interface modules and protocol converters into the collector and/or is read out from the collector. The collector is switched to bus systems 0804 *a* via triggering unit 1007 which corresponds to 0807, and the collector is switched to bus systems 0804 *b* via triggering unit 1006, which corresponds to 0806.

Multiple collectors may be implemented for which multiple triggering units 1006 and 1007 are used.

A collector may be segmented into multiple memory areas. Each memory area may operate independently in different memory modes, e.g., as random access memory, FIFO, cache, MMU page, etc.

A translation table (TLB) (1002) may be assigned to a collector to permit an MMU-type mode of operation. Page management may function, e.g., on the basis of segment addresses and/or other identifiers, e.g., APIDs and/or IOIDs.

A DMA or multiple DMAs are preferably assigned to a collector to perform data transfers with external (main) memories and/or other (peripheral) data streams, in particular to automatically permit the MMU function of page management (loading, writing). DMAs may also access the TLB for address translation between external (main) memories and/or other (peripheral) data streams and collector. In one possible mode of operation, DMAs may receive address specifications from the array (PA), e.g., via 0804.

DMAs may be triggered by one or more of the following units: an MMU assigned to the collector, e.g., in the case of page faults; the array (PA); an external bus (e.g., 0809); an external processor; a higher-level loading unit (CT).

Collectors may have access to a dedicated bus interface (1004), preferably DMA-controlled and preferably master/slave capable, including a protocol converter, corresponding to or similar to protocol converters 0802 having access to external (main) memories and/or other (peripheral) data streams.

An external processor may have direct access to collectors (1007).

Figure 11:
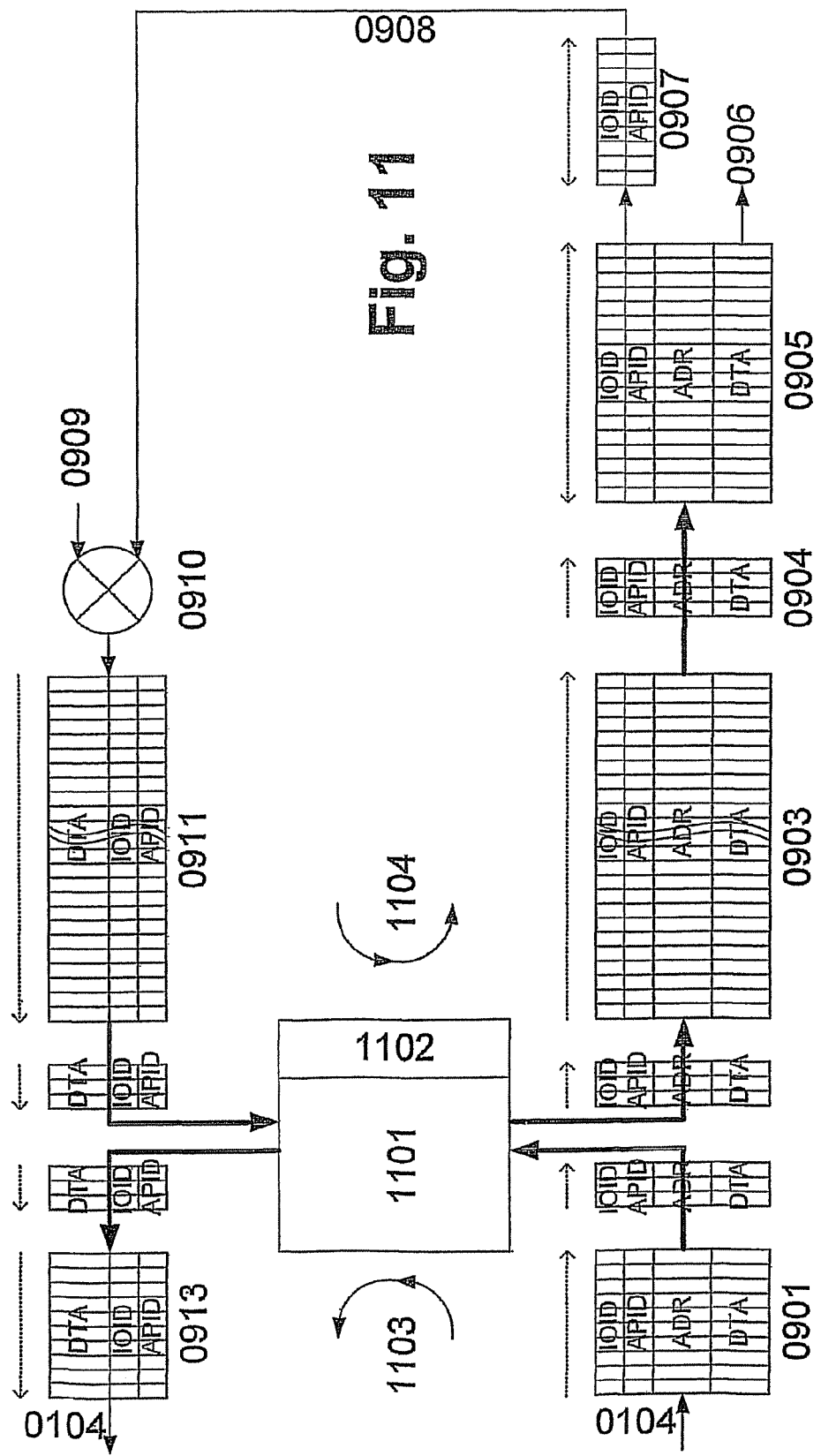
FIG. 11 shows an example sequence of data transfer with a data collector.

FIG. 11 corresponds in principle to FIG. 9, which is why the same reference numbers have been used. A collector (1101) including assigned transfer control (e.g., DMA preferably with TLB) (1102) is integrated into the data stream. The array (PA) now transmits data preferably using the collector (1103), which preferably exchanges data with external (main) memories and/or other (peripheral) data streams (1104), largely automatically and controlled via 1102. The collector preferably functions in a segmented MMU-type mode of operation, where different address areas and/or identifiers such as APIDs and/or IOIDs are assigned to different pages. Preferably 1102 may be controlled by page faults.

Figure 12:
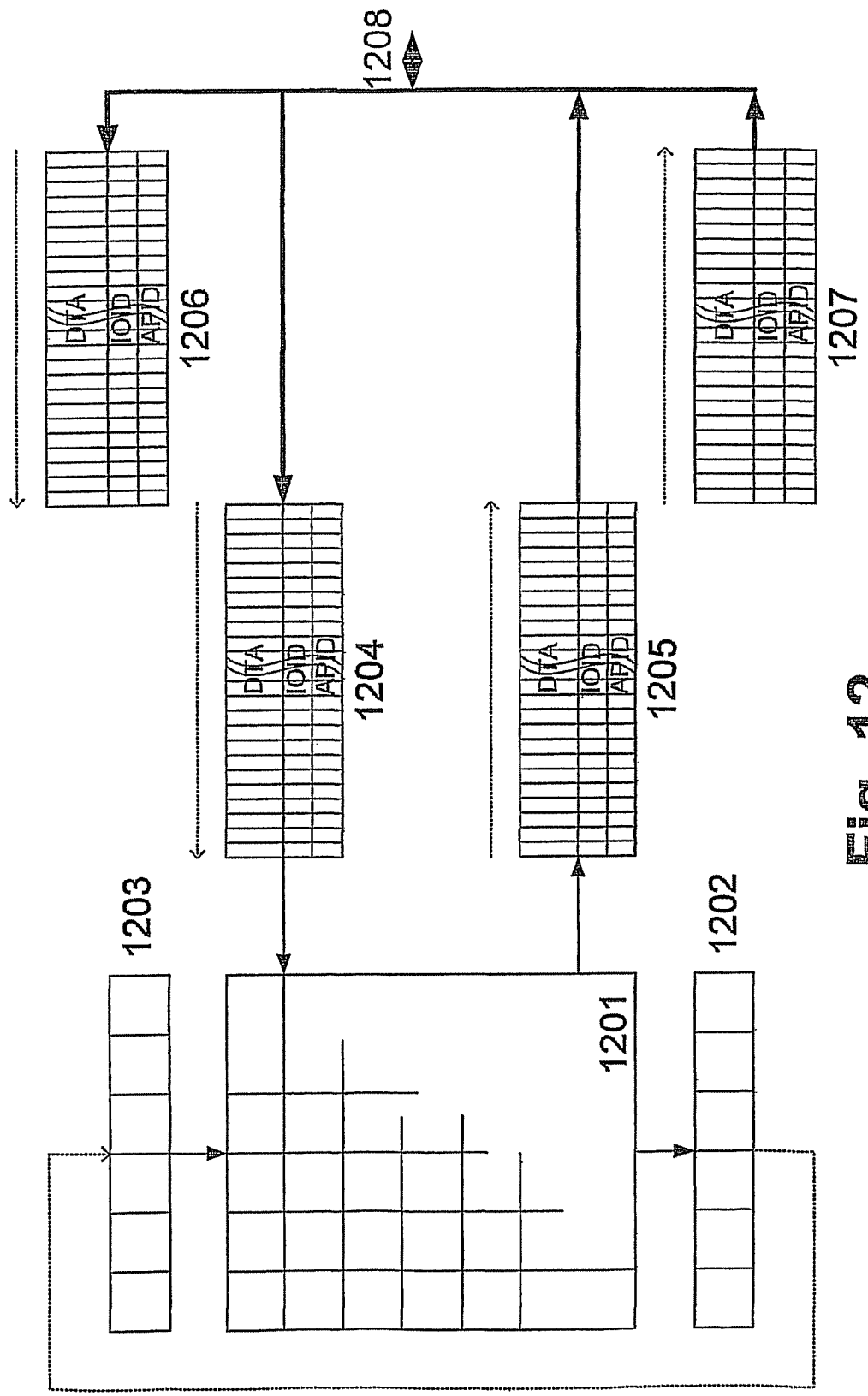
FIG. 12 shows a flow of data transfers for different applications, according to an example embodiment of the present invention.

FIG. 12 shows a flow chart of data transfers for different applications. An array (PA) processes data according to the method described in German Patent Application No. DE 196 54 846.2 by storing operands and results in memories 1202 and 1203. In addition, a data input channel (1204) and a data output channel (1205) are assigned to the PA, through which the operands and/or results are loaded and/or stored. The channels may lead to external (main) memories and/or other (peripheral) data streams (1208). The channels may include internal FIFO stages and/or PAE-RAMs/PAE-RAM pages and/or collectors/collector pages. The addresses (CURR-ADR) may be computed currently by a configuration running in 1201 and/or may be computed in advance and/or computed by DMA operations of a (1003). In particular, an address computation within 1201 (CURR-ADR) may be sent to a collector or its DMA to address and control the data transfers of the collector. The data input channel may be preloaded by a configuration previously executed on 1201.

The channels preferably function in a FIFO-like mode of operation to perform data transfers with 1208.

In the example depicted here, a channel (1207), which has been filled by a previous configuration or application, is still being written to 1208 during data processing within 1201 described here. This channel may also include internal FIFO stages and/or PAE-RAMs/PAE-RAM pages and/or collectors/collector pages. The addresses may be computed currently by a configuration (OADR-CONF) running in parallel in 1201 and/or computed in advance and/or computed by DMA operations of a (1003). In particular, an address computation within 1201 (OADR-CONF) may be sent to a collector or its DMA to address and control the data transfers of the collector.

In addition, data for a subsequent configuration or application is simultaneously loaded into another channel (1206). This channel too may include internal FIFO stages and/or PAE-RAMs/PAE-RAM pages and/or collectors/collector pages. The addresses may be computed currently by a configuration (IADR-CONF) running in parallel in 1201 and/or computed in advance and/or computed by DMA operations of a (1003). In particular, an address computation within 1201 (IADR-CONF) may be sent to a collector or its DMA to address and control the data transfers of the collector. Individual entries into the particular channels may have different identifiers, e.g., IOIDs and/or APIDs, enabling them to be assigned to a certain resource and/or memory location.

Figure 13A:
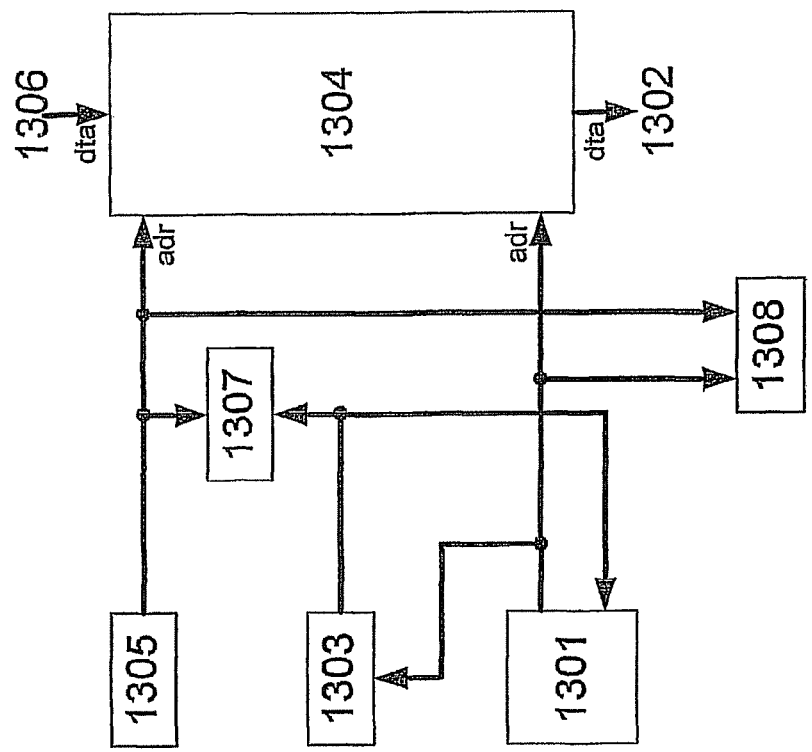
FIG. 13A shows a BURST-FIFO according to an example embodiment of the present invention.

FIG. 13A shows a preferred implementation of a BURST-FIFO.

The function of an output FIFO which transmits its values to a burst-capable bus (BBUS) is to be described first. A first pointer (1301) points to the data entry within a memory (1304) currently to be output to the BBUS. With each data word output (1302), 1301 is moved by one position. The value of pointer 1301 prior to the start of the current burst transfer has been stored in a register (1303). If an error occurs during the burst transfer, 1301 is reloaded with the original value from 1303 and the burst transfer is restarted.

A second pointer (1305) points to the current data input position in the memory (1304) for data to be input (1306). To prevent overwriting of any data still needed in the event of an error, pointer 1305 is compared (1307) with register 1303 to indicate that the BURST-FIFO is full. The empty state of the BURST-FIFO may be ascertained by comparison (1308) of the output pointer (1301) with the input pointer (1305).

If the BURST-FIFO operates for input data from a burst transfer, the functions change as follows:

1301 becomes the input pointer for data 1306. If faulty data has been transmitted during the burst transfer, the position prior to the burst transfer is stored in 1303. If an error occurs during the burst transfer, 1301 is reloaded with the original value from 1303 and the burst transfer is restarted.

The pointer points to the readout position of the BURST-FIFO for reading out the data (1302). To prevent premature readout of data of a burst transfer that has not been concluded correctly, 1305 is compared with the position stored in 1303 (1307) to indicate an empty BURST-FIFO. A full BURST-FIFO is recognized by comparison (1308) of input pointer 1301 with the output pointer (1305).

Figure 13B:
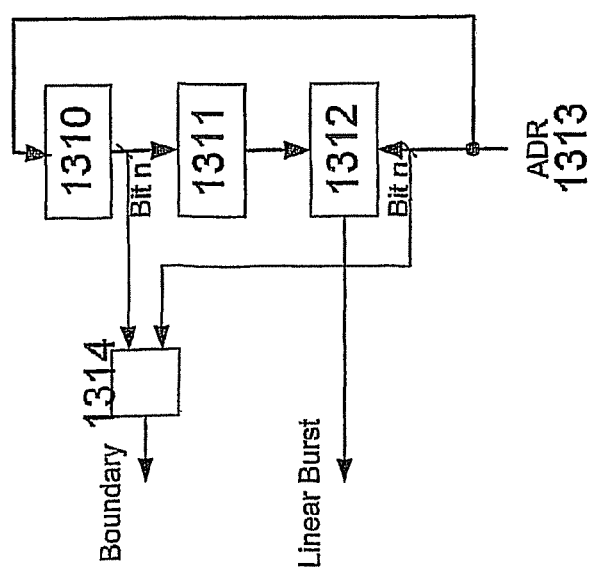
FIG. 13B shows a burst circuit according to an example embodiment of the present invention.

FIG. 13B shows one possible implementation of a burst circuit which recognizes possible burst transfers and tests boundary limits. The implementation has been kept simple and recognizes only linear address sequences. Data transfers are basically started as burst transfers. The burst transfer is aborted at the first nonlinear address. Burst transfers of a certain length (e.g., 4) may also be detected and initialized by expanding a look-ahead logic, which checks multiple addresses in advance.

The address value (1313) of a first access is stored in a register (1310). The address value of a subsequent data transfer is compared (1312) with the address value (1311) of 1310, which has been incremented by the address difference between the first data transfer and the second data transfer of the burst transfer (typically one word wide). If the two values are the same, then the difference between the first address and the second address corresponds to the address difference of the burst transfer between two burst addresses. Thus, this is a correct burst. If the values are not the same, the burst transfer must be aborted.

The last address (1313) checked (the second address in the writing) is stored in 1310 and then compared with the next address (1313) accordingly.

To ascertain whether the burst limits (boundaries) have been maintained, the address bit(s) at which the boundary of the current address value (1313) is located is (are) compared with the address bits of the preceding address value (1310) (e.g., XOR 1314). If the address bits are not the same, the boundary has been exceeded and the control of the burst must respond accordingly (e.g., termination of the burst transfer and restart).

FIG. 14 shows as an example various methods of connecting memories, in particular PAE-RAMs, to form a larger cohesive memory block.

FIGS. 14A-14D use the same reference numbers whenever possible.

Write data (1401) is preferably sent to the memories via pipeline stages (1402). Read data (1403) is preferably removed from the memories also via pipeline stages (1404). Pipeline stage 1404 includes a multiplexer, which forwards the particular active data path. The active data path may be recognized, for example, by a RDY handshake applied.

A unit (RangeCheck, 1405) for monitoring the addresses (1406) for correct values within the address space may optionally be provided.

Figures 14A, 14B:
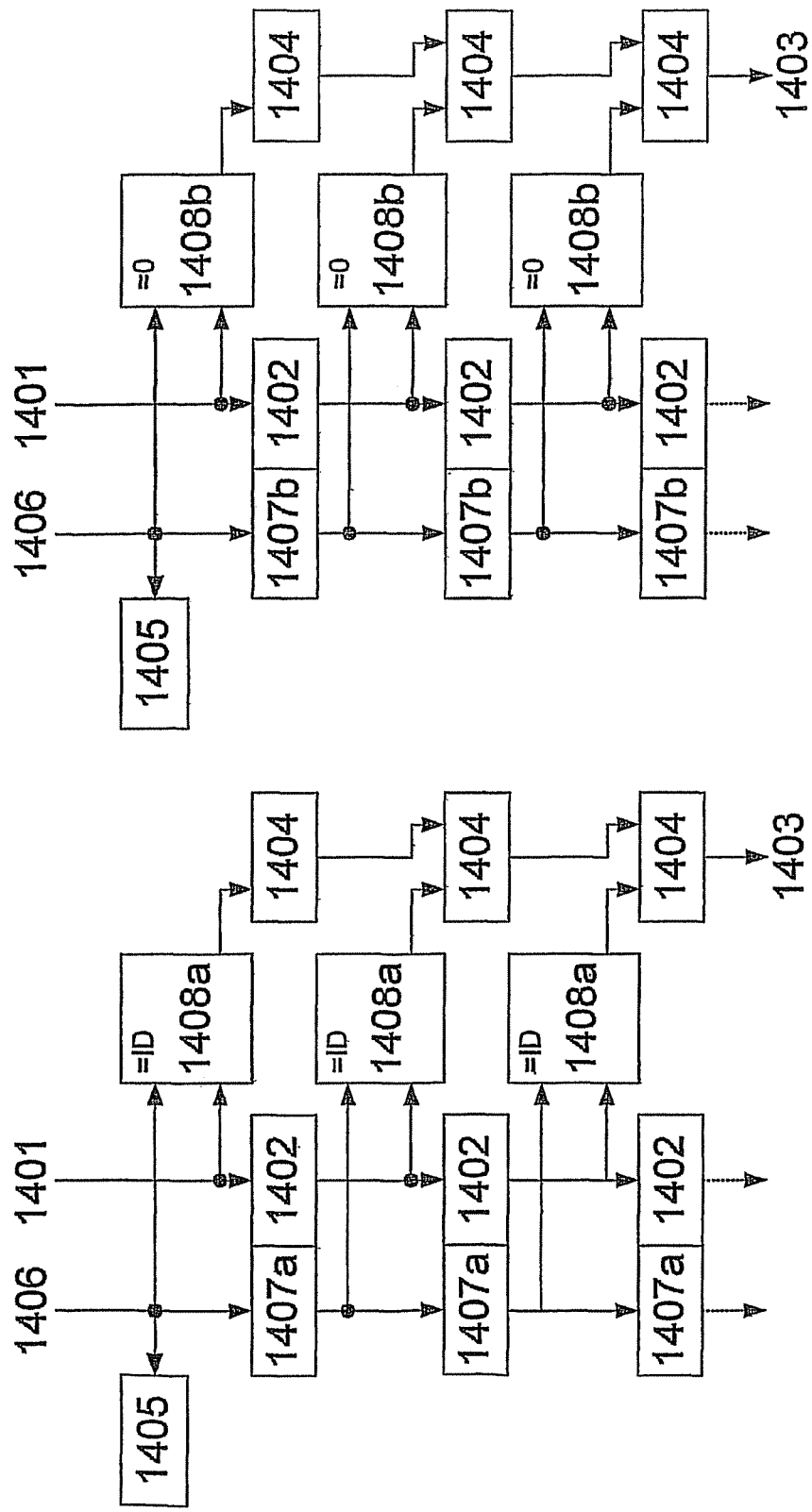
FIGS. 14A-14D show memory connections according to example embodiments of the present invention.

In FIG. 14A, the addresses are sent to the memories (1408 *a*) via pipeline stages (1407 *a*). The memories compare the higher-value address part with a fixedly predetermined or configurable (e.g., by a higher-level configuration unit CT) reference address, which is unique for each memory. If they are identical, that memory is selected. The lower-value address part is used for selection of the memory location in the memory.

In FIG. 14B, the addresses are sent to the memories (1408 *b*) via pipeline stages having an integrated decrementer (subtraction by 1) (1407 *b*). The memories compare the higher-value address part with the value zero. If they are identical, that memory is selected. The lower-value address part is used for selection of the memory location in the memory.

Figure 14D:
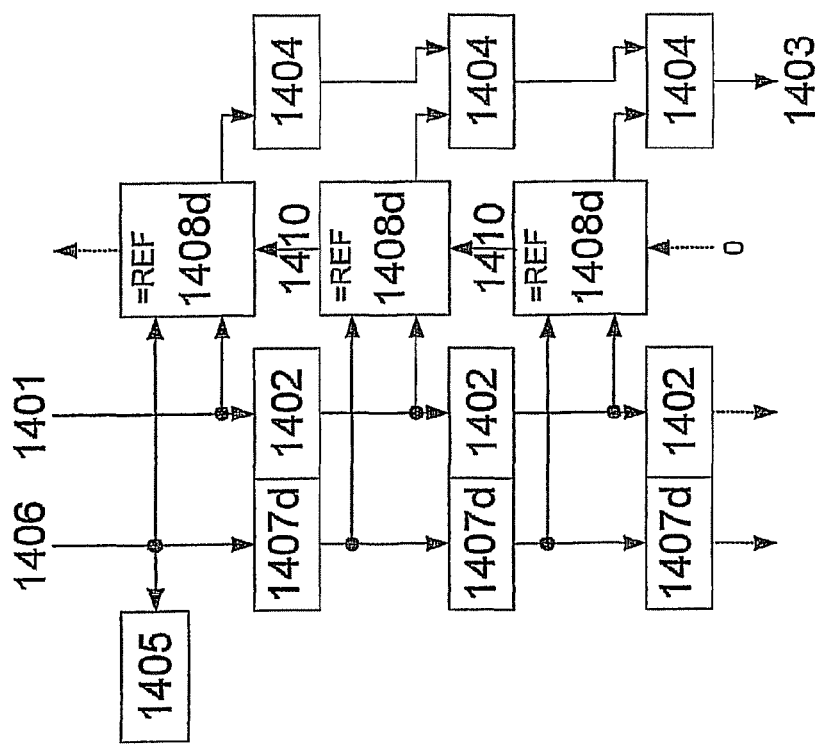
Figure 14C:
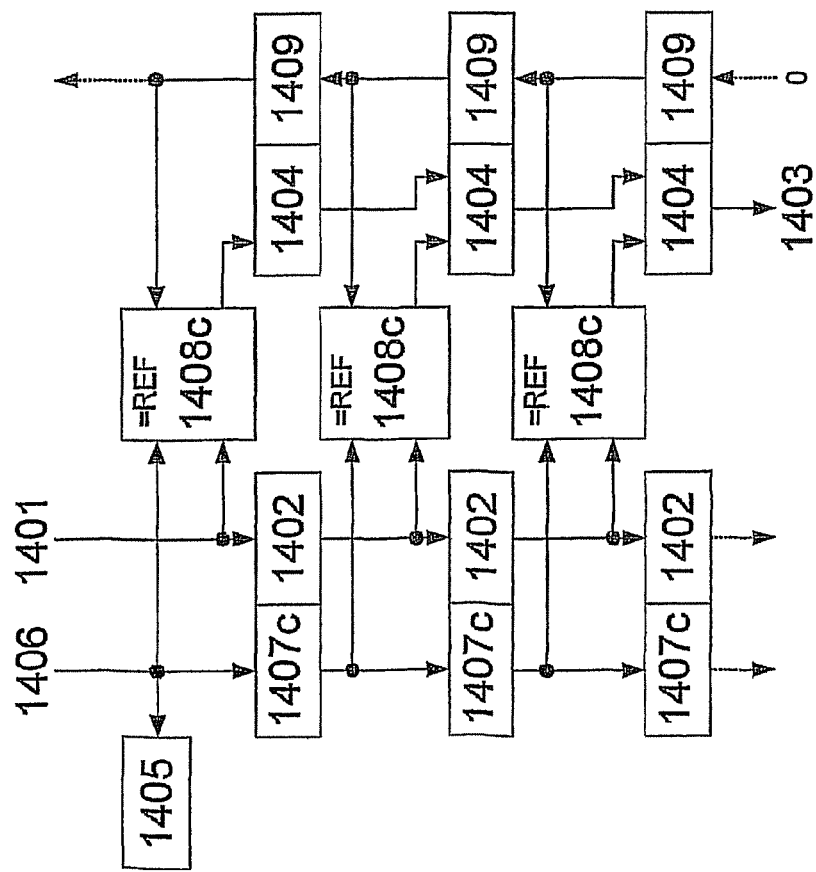

In FIG. 14C, the addresses are sent to the memories (1408 *c*) via pipeline stages (1407 *c*). The memories compare the higher-level address part with a reference address, which is unique for each memory. The reference address is generated by an adding or subtracting chain (1409), which preselects another unique reference address for each memory on the basis of a starting value (typically 0). If they are identical, that memory is selected. The lower-value address part is used for selection of the memory location in the memory.

In FIG. 14D, the addresses are sent to the memories (1408 *d*) via pipeline stages (1407 *d*). The memories compare the higher-value address part with a reference address which is unique for each memory. The reference address is generated by an addressing or subtracting chain (1410), which is integrated into the memories and preselects another unique reference address for each memory on the basis of a starting value (typically 0). If they are identical, that memory is selected. The lower-value address part is used for selection of the memory location in the memory.

For example, FREGs of the PAEs according to FIG. 5 may be used for 1402, 1404, and 1407. Depending on the direction of travel of the reference address, FREG or BREG may be used for 1409. The design shown here as an example has the advantage in particular that all the read/write accesses have the same latency because the addresses and data are sent to the BREG/FREG via register stages.

FIG. 15 shows the use of GlobalTrack bus systems (1501, 1502, 1503, 1504) for coupling configurations which were configured in any way as configuration macros (1506, 1507) within a system of PAEs (1505) (see also DE 198 07 872.2, DE 199 26 538.0, DE 100 28 397.7). The configuration macros have (1508) their own internal bus connections, e.g., via internal buses (0104). The configuration macros are interconnected via 1503 for data exchange. 1506 is connected to interface modules and/or local memories (RAM-PAEs) (1509, 1510) via 1501, 1502, 1507 is connected to interface modules and/or local memories (RAM-PAEs) (1511) via 1504.

Any other embodiments and combinations of the present inventions described here are possible and are self-evident in view of the foregoing, to those skilled in the art.

The invention claimed is:

1. A multi-processor system on a chip, comprising:
a plurality of data processing elements that each includes at least one arithmetic-logic unit (ALU) and a plurality of registers adapted for storing data;
a plurality of memory elements that each independently operates as a cache for caching data; and
at least one interface element for providing a connection to a common higher level memory;
wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element;
wherein the bus system is adapted for dynamically establishing and releasing transmission channels between a sending one of the elements and a receiving one of the elements; and
wherein the bus system is adapted for forming at least one ring via interconnection elements that include pipeline-registers.

2. The multi-processor system according to claim 1, wherein the ring is adapted for transmitting data in two directions using separate respective interconnection elements for each direction.

3. A multi-processor system on a chip, comprising:
a plurality of data processing elements that each includes at least one arithmetic-logic unit (ALU) and a plurality of registers adapted for storing data;
a plurality of memory elements that each independently operates as a cache for caching data; and
at least one interface element for providing a connection to a common higher level memory;
wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element;
wherein the bus system is adapted for dynamically establishing and releasing transmission channels between a sending one of the elements and a receiving one of the elements; and
wherein an identification token is assigned to transmitted data for indicating an affiliation of the transmitted data to a process.

4. A multi-processor system on a chip, comprising:
a plurality of data processing elements that each includes at least one arithmetic-logic unit (ALU) and a plurality of registers adapted for storing data;
a plurality of memory elements that each independently operates as a cache for caching data; and
at least one interface element for providing a connection to a common higher level memory;
wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element;

wherein the bus system is adapted for dynamically establishing and releasing transmission channels between a sending one of the elements and a receiving one of the elements; and wherein an identification token is assigned to data transferred via the interface element for indicating an affiliation of the transferred data to a process.

5. A multi-processor system on a chip, comprising:
a plurality of data processing elements that each includes at least one arithmetic-logic unit (ALU) and a plurality of registers adapted for storing data;
a plurality of memory elements that each independently operates as a cache for caching data; and
at least one interface element for providing a connection to a common higher level memory;
wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element, and
wherein the bus system is adapted for forming at least one ring via interconnection elements that include pipeline registers.

6. The multi-processor system according to claim 5, wherein the ring is adapted for transmitting data in two directions using separate respective interconnection elements for each direction.

7. A multi-processor system on a chip, comprising:
a plurality of data processing elements that each includes at least one arithmetic-logic unit (ALU) and a plurality of registers adapted for storing data;
a plurality of memory elements that each independently operates as a cache for caching data; and
at least one interface element for providing a connection to a common higher level memory;
wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element; and
wherein an identification token is assigned to transmitted data for indicating an affiliation of the transmitted data to a process.

8. A multi-processor system on a chip, comprising:
a plurality of data processing elements that each includes at least one arithmetic-logic unit (ALU) and a plurality of registers adapted for storing data;
a plurality of memory elements that each independently operates as a cache for caching data; and
at least one interface element for providing a connection to a common higher level memory;
wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element; and wherein an identification token is assigned to data transferred via the interface element for indicating an affiliation of the transferred data to a process.

9. A multi-processor system on a chip, comprising:
a plurality of data processing elements that each includes at least one arithmetic-logic unit (ALU) and a plurality of registers adapted for storing data;
a plurality of memory elements, that each independently operates as cache for caching data;
at least one interface element for providing a connection to a common higher level memory; and
at least one global interconnection system adapted for interconnecting the plurality of data processing elements, the plurality of memory elements, and the at least one interface element; wherein:
the at least one global interconnection system is accessible by each of the data processing elements and memory elements via a respective dedicated bus interface node, and permits flexible allocation and interconnection during run time;
transmitters and receivers of the data processing, memory and interface elements are adapted for being connected via the global interconnection system in an addressed manner to permit individual data transfer; and
each of the data processing elements, memory elements, and at least one interface element are separately connected to the global interconnection system for transferring data between (i) at least one of the data processing elements and at least one of the memory elements, and (ii) at least one of the memory elements and the at least one interface element; and
further wherein at least one interface element is adapted to connect to an external peripheral and the global interconnect system is adapted to transfer data to and from said external peripheral.

10. The multi-processor system according to claim 9, wherein data transfer on the global interconnection system is pipelined using registers implemented in, or assigned to, the global interconnection system.

11. The multi-processor system according to claim 9, wherein the global interconnection system programmably establishes a communication channel between a sender and a receiver.

12. The multi-processor system according to claim 9, wherein the global interconnection system programmably establishes a communication channel between (i) at least one of the data processing and memory elements and (ii) at least one of the at least one interface unit.

13. The multi-processor system according to claim 9, wherein the global interconnection system is adapted for being dynamically allocated and interconnected during operation.

14. The multi-processor system according to claim 10, wherein the chip is attached to a light transmitting substrate.

15. The multi-processor system according to claim 14, wherein data is transmitted by light via the light transmitting substrate.

16. The multi-processor system according to claim 14, wherein data is transmitted between two or more of any of the data processing and memory elements by light via the light transmitting substrate.

17. The multi-processor system according to claim 14, wherein data is transmitted between (i) at least one of the data processing and memory elements and (ii) the at least one interface by light via the light transmitting substrate.

18. The multi-processor system according to claim 10, wherein the chip comprises a light transmitting substrate.

19. The multi-processor system according to claim 18, wherein at least some of the data of the global interconnection is transferred by light via the light transmitting substrate.

20. The multi-processor system according to claim 10, wherein the data processing elements are separate from the memory elements, each being adapted for being separately addressed on the global interconnection system.

21. The multi-processor system according to claim 9, wherein the data transfer is via the global interconnection system and managed by control signals transmitted via the global interconnection system.

22. The multi-processor system according to claim 9, wherein:
an address is transferred from one of the plurality of data processing elements to the plurality of memory elements; and
the transferred address corresponds to a memory location of one of the plurality of memory elements which transfers data based on the correspondence to the transferred address.

23. The multi-processor system according to claim 9, wherein an address is transferred via the global interconnection system and from one of the plurality of data processing elements to one of the plurality of memory elements, which responsively transfers data conditional upon its inclusion of a memory location that corresponds to the transferred address.

24. The multi-processor system according to claim 9, wherein:
an address is transferred from one of the plurality of data processing elements to a first one of the plurality of memory elements, the address not corresponding to a memory location included in the first memory element;
the first memory element forwards the address to a second one of the plurality of memory elements based on the lack of correspondence of its included memory locations to the address; and
responsive to receipt of the address, the second memory element transfers data conditional upon its inclusion of a memory location that corresponds to the address.

25. The multi-processor system according to claim 9, wherein the multi-processor system supports preloading of data into the memory elements prior to processing of the data.

26. A multi-processor system on a chip, comprising:
a plurality of data processing elements that each includes at least one arithmetic-logic unit (ALU) and a plurality of registers adapted for storing data;
a plurality of memory elements, that each independently operates as cache for caching data;
at least one interface element for providing a connection to a common higher level memory; and
at least one global interconnection system adapted for interconnecting the plurality of data processing elements, the plurality of memory elements, and the at least one interface element; wherein:
the at least one global interconnection system is accessible by each of the data processing elements and memory elements via a respective dedicated bus interface node, and permits
flexible allocation and interconnection during run time;
transmitters and receivers of the elements are adapted for being connected via the global interconnection in an addressed manner to permit individual data transfer; and
each of the data processing elements, memory elements, and at least one interface element are connected to the global interconnection system for transferring data between (i) at least one of the data processing elements and at least one of the memory elements, and (ii) at least one of the memory elements and the at least one interface element; and
wherein an identification token is assigned to transmitted data for indicating its affiliation of the transmitted data to a process.

27. A multi-processor system on a chip, comprising:
a plurality of data processing elements that each includes at least one arithmetic-logic unit (ALU) and a plurality of registers adapted for storing data;
a plurality of memory elements, that each independently operates as cache for caching data;
at least one interface element for providing a connection to a common higher level memory; and
at least one global interconnection system adapted for interconnecting the plurality of data processing elements, the plurality of memory elements, and the at least one interface element; wherein:
the at least one global interconnection system is accessible by each of the data processing elements and memory elements via a respective dedicated bus interface node, and permits
flexible allocation and interconnection during run time;
transmitters and receivers of the elements are adapted for being connected via the global interconnection in an addressed manner to permit individual data transfer; and
each of the data processing elements, memory elements, and at least one interface element are connected to the global interconnection system for transferring data between (i) at least one of the data processing elements and at least one of the memory elements, and (ii) at least one of the memory elements and the at least one interface element; and
wherein an identification token is assigned to data transferred via the interface element for indicating an affiliation of the transferred data to a process.

28. A multi-processor system on a chip, comprising:
a plurality of data processing elements that each includes at least one arithmetic-logic unit (ALU) and a plurality of registers adapted for storing data;
a plurality of memory elements that each independently operates as a cache for caching data; and
at least one interface element for providing a connection to a common higher level memory;
wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element;
wherein the bus system is adapted for dynamically establishing and releasing transmission channels between a sending one of the elements and a receiving one of the elements;
wherein the data transmission is via the bus system and managed by control signals transmitted via the bus;
wherein the bus system is adapted for transmitting data in at least two directions and comprises separate and independent structures for each of the data transmission directions; and
wherein the bus system is adapted for forming at least one ring via interconnection elements that include pipeline-registers.

29. A multi-processor system on a chip, comprising:
- a plurality of data processing elements that each includes at least one arithmetic-logic unit (ALU) and a plurality of registers adapted for storing data;
- a plurality of memory elements that each independently operates as a cache for caching data; and
- at least one interface element for providing a connection to a common higher level memory;
- wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element;
- wherein the bus system is adapted for transmitting data in at least two directions and comprises separate and independent structures for each of the data transmission directions; and
- wherein the bus system is adapted for forming at least one ring via interconnection elements that include pipeline-registers.

30. A multi-processor system on a chip, comprising:
- a plurality of data processing elements that each includes at least one arithmetic-logic unit (ALU) and a plurality of registers adapted for storing data;
- a plurality of memory elements that each independently operates as a cache for caching data; and
- at least one interface element for providing a connection to a common higher level memory;
- wherein each of the data processing elements, each of the memory elements, and each of the at least one interface element are interconnected via a bus system for transferring data at least between (i) at least one of the data processing elements and at least one of the memory elements and (ii) at least one of the memory elements and the at least one interface element; and
- wherein each of the data processing elements and each of the memory elements are separately connected to the bus system; and
- further wherein at least one interface element is adapted to connect to an external peripheral and the bus system is adapted to transfer data to and from said external peripheral.

31. The multi-processor system according to claim 30, wherein the bus system is pipelined.

32. The multi-processor system according to claim 30, wherein the bus system is adapted for simultaneously transferring data by a plurality of connects.

33. The multi-processor system according to claim 30, wherein the bus system programmably establishes a communication channel between a sender and a receiver.

34. The multi-processor system according to claim 30, wherein the bus system programmably establishes a communication channel between (i) at least one of the data processing and memory elements and (ii) at least one of the at least one interface unit.

35. The multi-processor system according to claim 30, wherein the bus system is adapted for being dynamically allocated and interconnected during operation.

36. The multi-processor system according to claim 30, wherein the chip is attached to a light transmitting substrate.

37. The multi-processor system according to claim 36, wherein data is transmitted by light via the light transmitting substrate.

38. The multi-processor system according to claim 37, wherein data is transmitted between two or more of any of the data processing and memory elements by light via the light transmitting substrate.

39. The multi-processor system according to claim 37, wherein data is transmitted between
(i) at least one of the data processing and memory elements and
(ii) the at least one interface by light via the light transmitting substrate.

40. The multi-processor system according to claim 30, wherein the chip comprises a light transmitting substrate.

41. The multi-processor system according to claim 40, wherein at least some of the data of the bus is transferred by light via the light transmitting substrate.

42. The multi-processor system according to claim 30, wherein the bus system is adapted for dynamically establishing and releasing transmission channels between a sending one of the elements and a receiving one of the elements.

43. The multi-processor system according to claim 42, wherein the bus system is pipelined.

44. The multi-processor system according to claim 42, wherein the bus system is adapted for simultaneously transferring data by a plurality of connects.

45. The multi-processor system according to claim 42, wherein the bus system programmably establishes a communication channel between a sender and a receiver.

46. The multi-processor system according to claim 42, wherein the bus system programmably establishes a communication channel between (i) at least one of the data processing and memory elements and (ii) at least one of the at least one interface unit.

47. The multi-processor system according to claim 42, wherein the bus system is adapted for being dynamically allocated and interconnected during operation.

48. The multi-processor system according to claim 42, wherein the chip is attached to a light transmitting substrate.

49. The multi-processor system according to claim 48, wherein data is transmitted by light via the light transmitting substrate.

50. The multi-processor system according to claim 49, wherein data is transmitted between two or more of any of the data processing and memory elements by light via the light transmitting substrate.

51. The multi-processor system according to claim 49, wherein data is transmitted between
(i) the data processing and memory elements and
(ii) the at least one interface by light via the light transmitting substrate.

52. The multi-processor system according to claim 42, wherein the chip comprises a light transmitting substrate.

53. The multi-processor system according to claim 52 wherein at least some of the data of the bus is transferred by light via the light transmitting substrate.

54. The multi-processor system according to claim 42, wherein the data processing elements are separate from the memory elements, each being adapted for being separately addressed on the bus system.

55. The multi-processor system according to claim 42, wherein the data transmission is via the bus system and managed by control signals transmitted via the bus.

56. The multi-processor system according to claim 55, wherein the bus system is adapted for transmitting data in at least two directions and comprises separate and independent structures for each of the data transmission directions.

57. The multi-processor system according to claim 42, wherein:
- an address is transferred from one of the plurality of data processing elements to the plurality of memory elements; and
- the transferred address corresponds to a memory location of one of the plurality of memory elements which transfers data based on the correspondence to the transferred address.

58. The multi-processor system according to claim 42, wherein an address is transferred via the bus system and from one of the plurality of data processing elements to one of the plurality of memory elements, which responsively transfers data conditional upon its inclusion of a memory location that corresponds to the transferred address.

59. The multi-processor system according to claim 42, wherein:
- an address is transferred from one of the data processing elements to a first one of the plurality of memory elements, there being a lack of correspondence of the address to each of a plurality of memory locations included in the first memory element;
- the first memory element forwards the address to a second one of the plurality of memory elements based on the lack of correspondence of its included memory locations to the address; and
- responsive to receipt of the address, the second memory element transfers data conditional upon its inclusion of a memory location that corresponds to the address.

60. The multi-processor system according to claim 34, wherein pipeline stages are located between the memory elements.

61. The multi-processor system according to claim 34, wherein separated bus systems are used for transmitting addresses and write data and for returning read data.

62. The multi-processor system according to claim 30, wherein the multiprocessor system is adapted for an address to be sent from one of the plurality of data processing elements and to be received by more than one of the plurality of memory elements, and for selection of one of the more than one of the plurality of memory elements for data transmission based on a match of an address that includes data within an address range of the one of the more than one of the plurality of memory elements.

63. The multi-processor system according to claim 30, wherein the multiprocessor system is adapted for an address to be sent from one of the plurality of data processing elements and to be received by more than one of the plurality of memory elements, and for selection of one of the more than one of the plurality of memory elements for data transmission based on a match of an address within an address range of the one of the more than one of the plurality of memory elements.

64. The multi-processor system according to claim 30, wherein the interconnection via the bus system for the transferring of data between the data processing elements and the memory elements is defined by a transmitted address.

65. The multi-processor system according to claim 9 or 30, wherein the memory elements are connected to the data processing elements via switches.

66. The multi-processor system according to claim 9 or 30, wherein the memory elements are connected to the data processing elements via multiplexors.

67. The multi-processor system according to claim 9 or 30, wherein the memory elements are connected to the data processing elements via routers.

68. The multi-processor system according to claim 30, wherein the bus system runs a multi-layered protocol.

69. The multi-processor system according to claim 30, wherein the data processing elements are separate from the memory elements, each being adapted for being separately addressed on the bus system.

70. The multi-processor system according to claim 30, wherein the data transmission is via the bus system and managed by control signals transmitted via the bus.

71. The multi-processor system according to any one of claims 30 and 70, wherein the bus system is adapted for transmitting data in at least two directions and comprises separate and independent structures for each of the data transmission directions.

72. The multi-processor system according to claim 30, wherein:
- an address is transferred from one of the plurality of data processing elements to the plurality of memory elements; and
- the transferred address corresponds to a memory location of one of the plurality of memory elements which transfers data based on the correspondence to the transferred address.

73. The multi-processor system according to claim 30, wherein an address is transferred via the bus system and from one of the plurality of data processing elements to one of the plurality of memory elements, which responsively transfers data conditional upon its inclusion of a memory location that corresponds to the transferred address.

74. The multi-processor system according to claim 30, wherein:
- an address is transferred from one of the data processing elements to a first one of the plurality of memory elements, the address not corresponding to a memory location included in the first memory element;
- the first memory element forwards the address to a second one of the plurality of memory elements based on the lack of correspondence of its included memory locations to the address; and
- responsive to receipt of the address, the second memory element transfers data conditional upon its inclusion of a memory location that corresponds to the address.

75. The multi-processor system according to claim 30, wherein the processor arrangement supports preloading of data into the memory elements prior to processing of the data.

* * * * *